United States Patent
Liao et al.

(10) Patent No.: US 11,757,042 B2
(45) Date of Patent: Sep. 12, 2023

(54) SEMICONDUCTOR DEVICE AND METHOD

(71) Applicant: Taiwan Semiconductor Manufacturing Co., Ltd., Hsinchu (TW)

(72) Inventors: Yi-Bo Liao, Hsinchu (TW); Yu-Xuan Huang, Hsinchu (TW); Pei-Yu Wang, Hsinchu (TW); Cheng-Ting Chung, Hsinchu (TW); Ching-Wei Tsai, Hsinchu (TW); Hou-Yu Chen, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/671,156

(22) Filed: Feb. 14, 2022

(65) Prior Publication Data

US 2022/0165885 A1    May 26, 2022

Related U.S. Application Data

(63) Continuation of application No. 16/998,576, filed on Aug. 20, 2020, now Pat. No. 11,251,308.

(Continued)

(51) Int. Cl.
*H01L 29/786* (2006.01)
*H01L 21/02* (2006.01)
(Continued)

(52) U.S. Cl.
CPC .. *H01L 29/78618* (2013.01); *H01L 21/02603* (2013.01); *H01L 21/28518* (2013.01);
(Continued)

(58) Field of Classification Search
CPC ......... H01L 29/78618; H01L 21/02603; H01L 21/28518; H01L 21/31116; H01L 23/5286;
(Continued)

(56) References Cited

U.S. PATENT DOCUMENTS 8,203,175 B2    6/2012   Kuroda
9,209,247 B2   12/2015   Colinge et al.
(Continued)

FOREIGN PATENT DOCUMENTS

JP    2010171166 A    8/2010
KR   20190024569 A    3/2019
(Continued)

OTHER PUBLICATIONS

Gibb, K. "A tech walkthrough of metal gate I/O transistors," EE Times-Asia, https://archive.eetasia.com/www.eetasia.com/ART_8800718966_499495_TA_f447d4ec.HTM, Jan. 19, 2016, 3 pages.

*Primary Examiner* — Tong-Ho Kim
(74) *Attorney, Agent, or Firm* — Slater Matsil, LLP

(57) ABSTRACT

In an embodiment, a device includes: a first interconnect structure including metallization patterns; a second interconnect structure including a power rail; a device layer between the first interconnect structure and the second interconnect structure, the device layer including a first transistor, the first transistor including an epitaxial source/drain region; and a conductive via extending through the device layer, the conductive via connecting the power rail to the metallization patterns, the conductive via contacting the epitaxial source/drain region.

20 Claims, 68 Drawing Sheets

Related U.S. Application Data

(60) Provisional application No. 63/016,520, filed on Apr. 28, 2020.

(51) Int. Cl.
| | |
|---|---|
| *H01L 21/285* | (2006.01) |
| *H01L 21/311* | (2006.01) |
| *H01L 23/528* | (2006.01) |
| *H01L 29/06* | (2006.01) |
| *H01L 29/417* | (2006.01) |
| *H01L 29/423* | (2006.01) |
| *H01L 29/45* | (2006.01) |
| *H01L 29/66* | (2006.01) |
| *H01L 29/78* | (2006.01) |

(52) U.S. Cl.
CPC .... *H01L 21/31116* (2013.01); *H01L 23/5286* (2013.01); *H01L 29/0673* (2013.01); *H01L 29/41733* (2013.01); *H01L 29/42392* (2013.01); *H01L 29/45* (2013.01); *H01L 29/66545* (2013.01); *H01L 29/66636* (2013.01); *H01L 29/66742* (2013.01); *H01L 29/7848* (2013.01); *H01L 29/78696* (2013.01)

(58) Field of Classification Search
CPC .......... H01L 29/0673; H01L 29/41733; H01L 29/42392; H01L 29/45; H01L 29/66545; H01L 29/66636; H01L 29/66742; H01L 29/7848; H01L 29/78696; H01L 21/76895; H01L 21/76897; H01L 21/76898; H01L 23/481; H01L 29/167; H01L 21/76805; H01L 29/4175; H01L 29/456; H01L 29/0847; H01L 29/41766; H01L 29/66439; H01L 29/775; H01L 27/0924; H01L 21/823821; H01L 21/823871; H01L 23/528; H01L 23/5283; H01L 29/0665; H01L 21/823814; B82Y 10/00; B82Y 40/00
USPC ........................................................ 257/347
See application file for complete search history.

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,647,098 B2 | 5/2017 | Obradovic et al. |
| 10,014,390 B1 | 7/2018 | Bouche et al. |
| 10,629,679 B2 | 4/2020 | Yang et al. |
| 10,770,358 B2 | 9/2020 | Van Dal et al. |
| 11,031,395 B2 | 6/2021 | Ohtou et al. |
| 11,251,308 B2 * | 2/2022 | Liao ................. H01L 29/66439 |
| 2019/0164882 A1 | 5/2019 | Chen et al. |
| 2019/0221649 A1 | 7/2019 | Glass et al. |
| 2019/0288004 A1 | 9/2019 | Smith et al. |
| 2021/0134721 A1 | 5/2021 | Chiang et al. |
| 2021/0202385 A1 | 7/2021 | Huang et al. |

FOREIGN PATENT DOCUMENTS

| | | |
|---|---|---|
| KR | 20190049338 A | 5/2019 |
| TW | 202006953 A | 2/2020 |
| WO | 2018048529 A1 | 3/2018 |

* cited by examiner

SEMICONDUCTOR DEVICE AND METHOD

PRIORITY CLAIM AND CROSS-REFERENCE

This application is a continuation of U.S. patent application Ser. No. 16/998,576, filed on Aug. 20, 2020, entitled "Semiconductor Device and Method," which application claims the benefit of U.S. Provisional Application No. 63/016,520 filed on Apr. 28, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
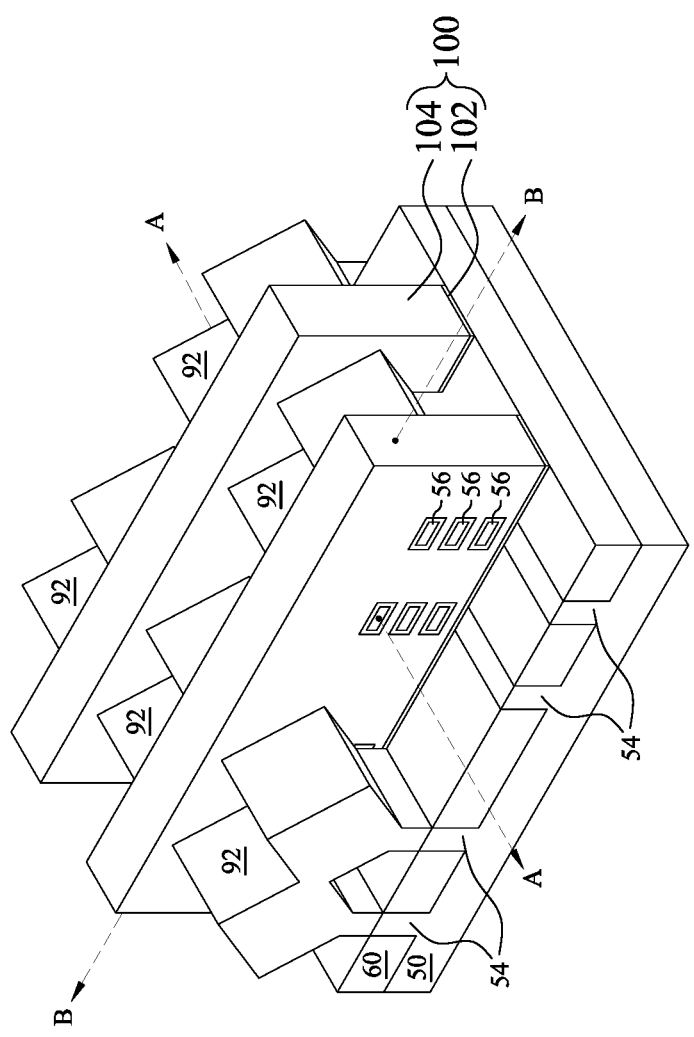
FIG. 1 illustrates an example of simplified nanostructure field effect transistors (nano-FETs), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, a semiconductor device is formed having a device layer disposed between two interconnect structures. The device layer includes transistors, e.g., nanostructure field effect transistors (nano-FETs). One of the interconnect structures is at the front-side of the device layer, and includes conductive features that interconnect the transistors of the device layer to form functional circuits. The other of the interconnect structures is at the back-side of the device layer, and includes conductive features that are used to provide power circuits for the device layer. Specifically, the back-side interconnect structure includes dedicated power rails for providing a reference voltage, supply voltage, or the like to the functional circuits. Conductive vias are formed through the device layer, connecting the conductive features of the back-side interconnect structure to the conductive features of the front-side interconnect structure. Forming such conductive vias allows the interconnect structures to be connected by conductive features rather than by semiconductive features, which can improve the performance of the resulting semiconductor devices.

FIG. 1 illustrates an example of simplified nano-FETs, in accordance with some embodiments. FIG. 1 is a cutaway three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 56 over a substrate 50, such as over fins 54 extending from the substrate 50. The nanostructures 56 are semiconductor layer that act as channel regions for the nano-FETs. Isolation regions 60, such as shallow trench isolation (STI) regions, are disposed over the substrate 50 and between adjacent ones of the fins 54, which may protrude above and from between neighboring isolation regions 60. Although the isolation regions 60 are described/illustrated as being separate from the substrate 50, as used herein, the term "substrate" may refer to the substrate 50 alone or a combination of the substrate 50 and the isolation regions 60. Additionally, although the fins 54 are illustrated as single, continuous materials with the substrate 50, the fins 54 and/or the substrate 50 may include a single material or a plurality of materials. In this context, the fins 54 refer to the portion extending above and from between the neighboring isolation regions 60.

Gate structures 100 are wrapped around the nanostructures 56. The gate structures 100 include gate dielectrics 102 and gate electrodes 104. The gate dielectrics 102 are along top surfaces, sidewalls, and bottom surfaces of the nanostructures 56 and may extend along sidewalls and/or over top surfaces of the fins 54. The gate electrodes 104 are over the gate dielectrics 102. Epitaxial source/drain regions 92 are disposed on opposite sides of the gate structures 100. In embodiments where multiple transistors are formed, the epitaxial source/drain regions 92 may be shared between various transistors. For example, neighboring epitaxial source/drain regions 92 may be electrically coupled, such as through coalescing the epitaxial source/drain regions 92 by epitaxial growth, or through coupling the epitaxial source/drain regions 92 with a same source/drain contact. One or more interlayer dielectric (ILD) layer(s) (discussed in greater detail below) are over the epitaxial source/drain regions 92 and/or the gate structures 100, through which contacts (discussed in greater detail below) to the epitaxial source/drain regions 92 and the gate electrodes 104 are formed.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs).

FIG. 1 further illustrates reference a cross-section that is used in later figures. Cross-section A-A is along a longitudinal axis of a nanostructure 56 and in a direction, for example, of current flow between the epitaxial source/drain regions 92 of a nano-FET. Subsequent figures refer to this reference cross-section for clarity.

FIGS. 2 through 14B are various views of intermediate stages in the manufacturing of nano-FETs, in accordance with some embodiments. FIGS. 2, 3, 4, 5A, 6A, 7A, 8A, 9A, 10A, 11A, 12A, 13A, and 14A are three-dimensional views showing a similar three-dimensional view as FIG. 1, except one gate structure and two fins are shown. FIGS. 5B, 6B, 7B, 8B, 9B, 10B, 11B, 12B, 13B, and 14B are cross-sectional views illustrated along reference cross-section A-A in FIG. 1. FIGS. 5A, 6A, 7A, 8A, 9A, 10A, 11A, 12A, 13A, and 14A are simplified three-dimensional views, and do not show all of the features of corresponding FIGS. 5B, 6B, 7B, 8B, 9B, 10B, 11B, 12B, 13B, and 14B.

Figure 2:
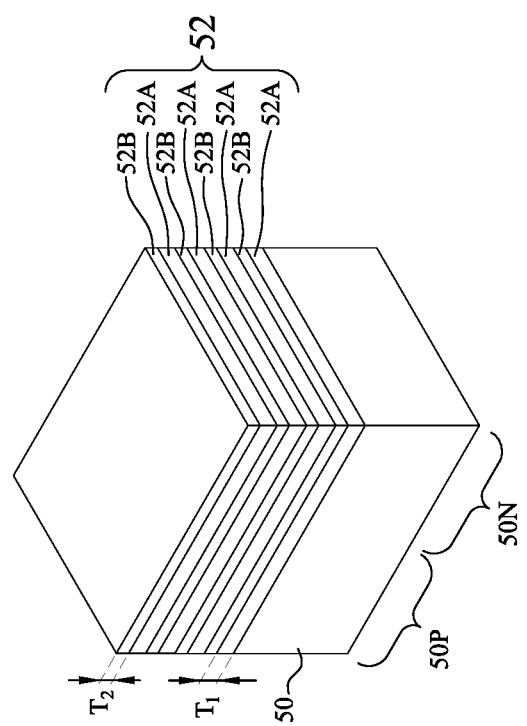
FIGS. 2 through 14B are various views of intermediate stages in the manufacturing of nano-FETs, in accordance with some embodiments.

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P.

The substrate 50 may be lightly doped with a p-type or an n-type impurity. An anti-punch-through (APT) implantation may be performed on an upper portion of the substrate 50 to form an APT region. During the APT implantation, dopants may be implanted in the n-type region 50N and the p-type region 50P. The dopants may have a conductivity type opposite from a conductivity type of source/drain regions that will be subsequently formed in each of the n-type region 50N and the p-type region 50P. The APT region may extend under subsequently formed source/drain regions in the nano-FETs, which will be formed in subsequent processes. The APT region may be used to reduce the leakage from the source/drain regions to the substrate 50. In some embodiments, the doping concentration in the APT region may be in the range of about $10^{18}$ cm$^{-3}$ to about $10^{19}$ cm$^{-3}$.

A multi-layer stack 52 is formed over the substrate 50. The multi-layer stack 52 includes alternating first semiconductor layers 52A and second semiconductor layers 52B. The first semiconductor layers 52A are formed of a first semiconductor material, and the second semiconductor layers 52B are formed of a second semiconductor material. The semiconductor materials may each be selected from the candidate semiconductor materials of the substrate 50. In the illustrated embodiment, the multi-layer stack 52 includes four layers of each of the first semiconductor layers 52A and the second semiconductor layers 52B. It should be appreciated that the multi-layer stack 52 may include any number of the first semiconductor layers 52A and the second semiconductor layers 52B.

In the illustrated embodiment, the second semiconductor layers 52B will be used to form channel regions for the nano-FETs in both the n-type region 50N and the p-type region 50P. The first semiconductor layers 52A are sacrificial layers (or dummy layers), which will be removed in subsequent processing to expose the top surfaces and the bottom surfaces of the second semiconductor layers 52B in both regions. The second semiconductor material of the second semiconductor layers 52B is a material suitable for both n-type and p-type nano-FETs, such as silicon, and the first semiconductor material of the first semiconductor layers 52A is a material that has a high etching selectivity from the etching of the second semiconductor material, such as silicon germanium.

In another embodiment, the first semiconductor layers 52A will be used to form channel regions for the nano-FETs in one region (e.g., the p-type region 50P), and the second semiconductor layers 52B will be used to form channel regions for the nano-FETs in another region (e.g., the n-type region 50N). The first semiconductor material of the first semiconductor layers 52A may be suitable for p-type nano-FETs, such as silicon germanium (e.g., $Si_xGe_{1-x}$, where x can be in the range of 0 to 1), pure or substantially pure germanium, a III-V compound semiconductor, a II-VI compound semiconductor, or the like, and the second semiconductor material of the second semiconductor layers 52B may be suitable for n-type nano-FETs, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 52A may be removed without removing the second semiconductor layers 52B in the n-type region 50N, and the second semiconductor layers 52B may be removed without removing the first semiconductor layers 52A in the p-type region 50P.

Each of the layers of the multi-layer stack 52 may be formed using a process such as vapor phase epitaxy (VPE), molecular beam epitaxy (MBE), chemical vapor deposition (CVD), atomic layer deposition (ALD), or the like. Each of the layers may be formed to a small thickness, such as a thickness in a range of about 5 nm to about 30 nm. In some embodiments, one group of layers (e.g., the second semiconductor layers 52B) is formed to be thinner than the other group of layers (e.g., the first semiconductor layers 52A). For example, in embodiments where the second semiconductor layers 52B are used to form channel regions and the first semiconductor layers 52A are sacrificial layers (or dummy layers), the first semiconductor layers 52A can be formed to a first thickness $T_1$ and the second semiconductor layers 52B can be formed to a second thickness $T_2$, with the second thickness $T_2$ being from about 30% to about 60% less than the first thickness $T_1$. Forming the second semiconductor layers 52B to a smaller thickness allows the channel regions to be formed at a greater density.

Figure 3:
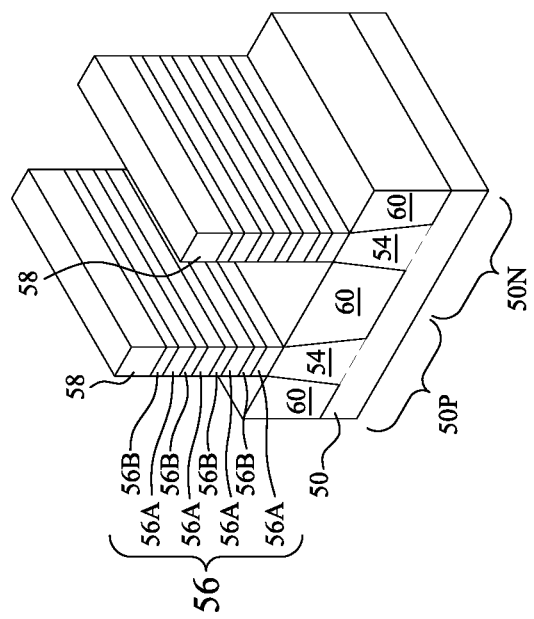

In FIG. 3, trenches are etched in the substrate 50 and the multi-layer stack 52 to form fins 54 and nanostructures 56. The fins 54 are semiconductor strips patterned in the substrate 50. The nanostructures 56 include the remaining portions of the multi-layer stack 52 on the fins 54. Specifically, the nanostructures 56 include alternating first nanostructures 56A and second nanostructures 56B. The first nanostructures 56A and the second nanostructures 56B are formed of remaining portions of the first semiconductor layers 52A and the second semiconductor layers 52B, respectively. After formation, the second nanostructures 56B in the intermediate levels of the structure are each disposed between two of the first nanostructures 56A. The etching may be any acceptable etch process, such as a reactive ion etch (RIE), neutral beam etch (NBE), the like, or a combination thereof, and may be performed with masks 58 having a pattern of the fins 54 and the nanostructures 56. The etching may be anisotropic.

The fins 54 and the nanostructures 56 may be patterned by any suitable method. For example, the fins 54 and the nanostructures 56 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks 58 to pattern the fins 54 and the nanostructures 56. In some embodiments, the masks 58 (or other layer) may remain on the nanostructures 56.

The fins 54 and the nanostructures 56 may have widths in a range of about 8 nm to about 40 nm. The fins 54 and the nanostructures 56 in the n-type region 50N and the p-type region 50P are illustrated as having substantially equal widths for illustrative purposes. In some embodiments, the fins 54 and the nanostructures 56 in one region (e.g., the n-type region 50N) may be wider or narrower than the fins 54 and the nanostructures 56 in the other region (e.g., the p-type region 50P).

STI regions 60 are then formed adjacent the fins 54. The STI regions 60 may be formed by depositing an insulation material over the substrate 50 and the nanostructures 56, and between adjacent ones of the fins 54. The insulation material may be an oxide such as silicon oxide, a nitride such as silicon nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the masks 58 (if present) or the nanostructures 56. Although the insulation material is illustrated as a single embodiments a liner may first be formed along surfaces of the substrate 50, the fins 54, and the nanostructures 56. Thereafter, a fill material, such as those discussed above may be formed over the liner.

A removal process is then applied to the insulation material to remove excess insulation material over the masks 58 (if present) or the nanostructures 56. In some embodiments, a planarization process such as a chemical mechanical polish (CMP), an etch-back process, combinations thereof, or the like may be utilized. The planarization process exposes the masks 58 (if present) or the nanostructures 56 such that top surfaces of, respectively, the masks 58 (if present) or the nanostructures 56 and the insulation material are coplanar (within process variations) after the planarization process is complete.

The insulation material is then recessed to form the STI regions 60. The insulation material is recessed such that at least a portion of the nanostructures 56 protrude from between neighboring STI regions 60. In the illustrated embodiment, the top surfaces of the STI regions 60 are coplanar (within process variations) with the top surfaces of the fins 54. In some embodiments, the top surfaces of the STI regions 60 are above or below the top surfaces of the fins 54. Further, the top surfaces of the STI regions 60 may have a flat surface as illustrated, a convex surface, a concave surface (such as dishing), or a combination thereof. The top surfaces of the STI regions 60 may be formed flat, convex, and/or concave by an appropriate etch. The STI regions 60 may be recessed using an acceptable etching process, such as one that is selective to the material of the insulation material (e.g., selectively etches the insulation material of the STI regions 60 at a faster rate than the materials of the fins 54 and the nanostructures 56). For example, an oxide removal using, for example, dilute hydrofluoric (dHF) acid may be used.

The masks 58 (or other layer) may be removed before, during, or after the formation of the STI regions 60. For example, the masks 58 may be removed by the etching processes used to pattern the fins 54 and the nanostructures 56 or by the etching processes used to recess the STI regions 60. In another embodiment, the masks 58 are removed by another etching process after the recessing of the STI regions 60.

The process described above is just one example of how the fins 54 and the nanostructures 56 may be formed. In some embodiments, the fins 54 and the nanostructures 56 may be formed by an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 54 and the nanostructures 56. The epitaxial structures may include the alternating semiconductor materials discussed above, such as the first semiconductor material and the second semiconductor material. In embodiments where epitaxial structures are epitaxially grown, the epitaxially grown materials may be in situ doped during growth, which may obviate prior and/or subsequent implantations, although in situ and implantation doping may be used together.

Further, appropriate wells may be formed in the substrate 50, the fins 54, and/or the nanostructures 56. In some embodiments, a p-type well may be formed in the n-type region 50N, and a n-type well may be formed in the p-type region 50P. In another embodiment, p-type wells or n-type wells may be formed in both the n-type region 50N and the p-type region 50P.

In embodiments with different well types, different implant steps for the n-type region 50N and the p-type region 50P may be achieved using a photoresist or other masks. For example, a photoresist may be formed over the fins 54, the nanostructures 56, and the STI regions 60 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ cm$^{-3}$ to about $10^{14}$ cm$^{-3}$. After the implant, the photoresist is removed, such as by an acceptable ashing process.

Following the implanting of the p-type region 50P, a photoresist is formed over the fins 54, the nanostructures 56, and the STI regions 60 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 4:
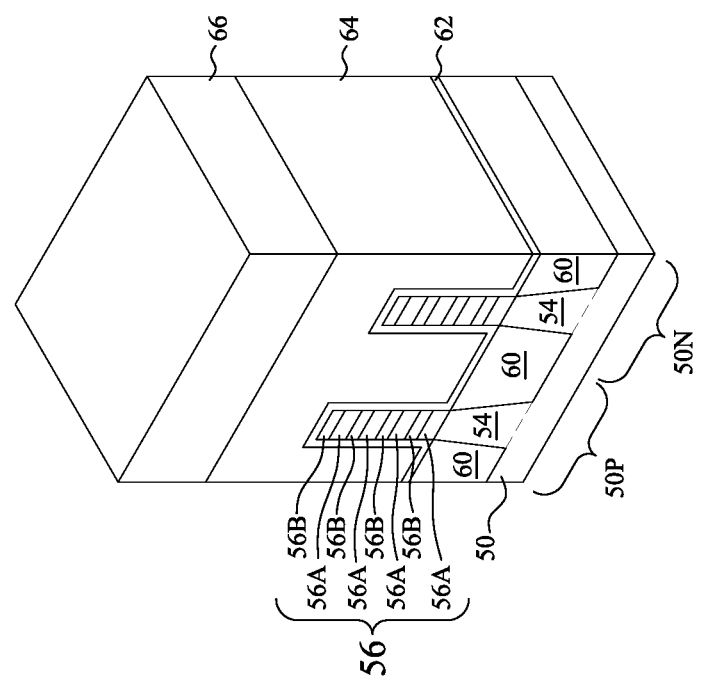

In FIG. 4, a dummy dielectric layer 62 is formed on the fins 54 and the nanostructures 56. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of material(s) that have a high etching selectivity from the etching of insulation materials, e.g., the material(s) of the STI regions 60 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. Although the dummy dielectric layer 62 is shown covering the STI regions 60, it should be appreciate that the dummy dielectric layer 62 can be formed in other manners. In some embodiments, such as when the dummy dielectric layer 62 is thermally grown, the dummy dielectric layer 62 is formed to only cover the fins 54 and the nanostructures 56.

FIGS. 5A through 14B illustrate further intermediate stages in the manufacturing of nano-FETs. FIGS. 5B, 6B, 7B, 8B, 9B, 10B, 11B, 12B, 13B, and 14B may be applicable to both the n-type region 50N and the p-type region 50P. Differences (if any) in the structures of the n-type region 50N and the p-type region 50P are described in the text accompanying each figure.

Figure 5A:
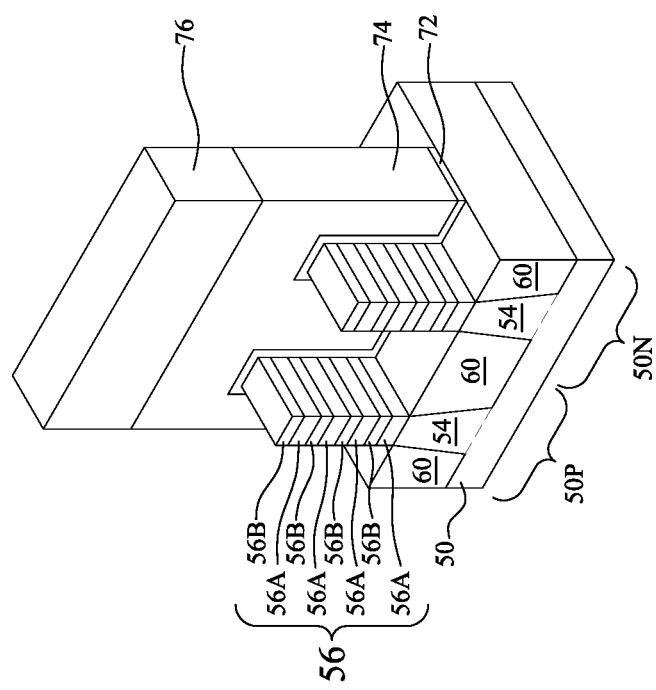
Figure 5B:
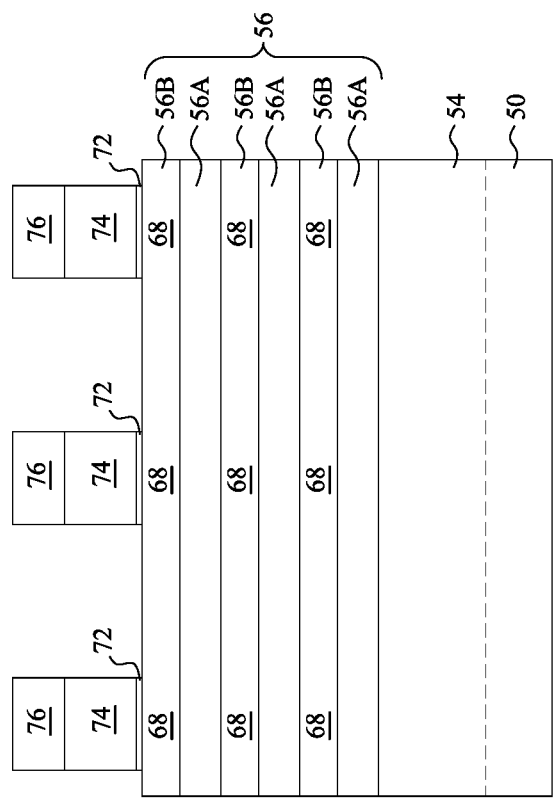

In FIGS. 5A and 5B, the mask layer 66 is patterned using acceptable photolithography and etching techniques to form masks 76. The pattern of the masks 76 is then transferred to the dummy gate layer 64 by an acceptable etching technique to form dummy gates 74. The pattern of the masks 76 may optionally be further transferred to the dummy dielectric layer 62 by an acceptable etching technique to form dummy dielectrics 72. The dummy gates 74 cover portions of the nanostructures 56 that will be exposed in subsequent processing to form channel regions. Specifically, the dummy gates 74 extend along the portions of the nanostructures 56 that will be used to form channel regions 68. The pattern of the masks 76 may be used to physically separate adjacent dummy gates 74. The dummy gates 74 may also have lengthwise directions substantially perpendicular (within process variations) to the lengthwise directions of the fins 54. The masks 76 can optionally be removed after patterning, such as by an acceptable etching technique.

Figure 6A:
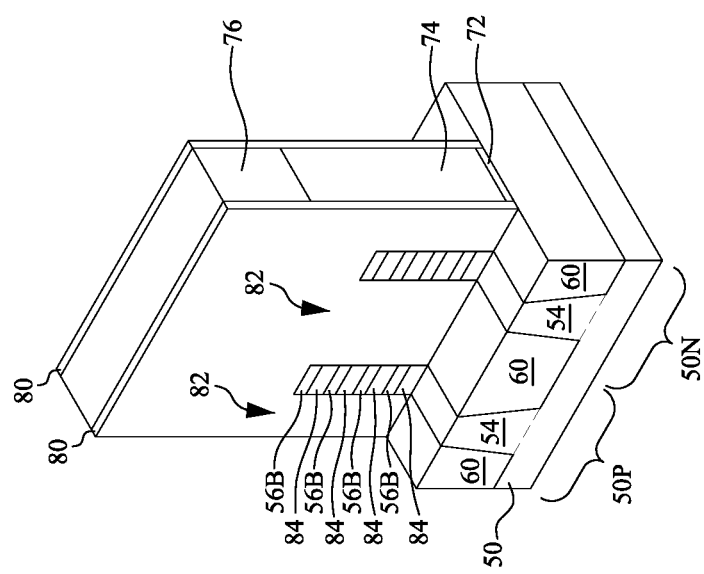
Figure 6B:
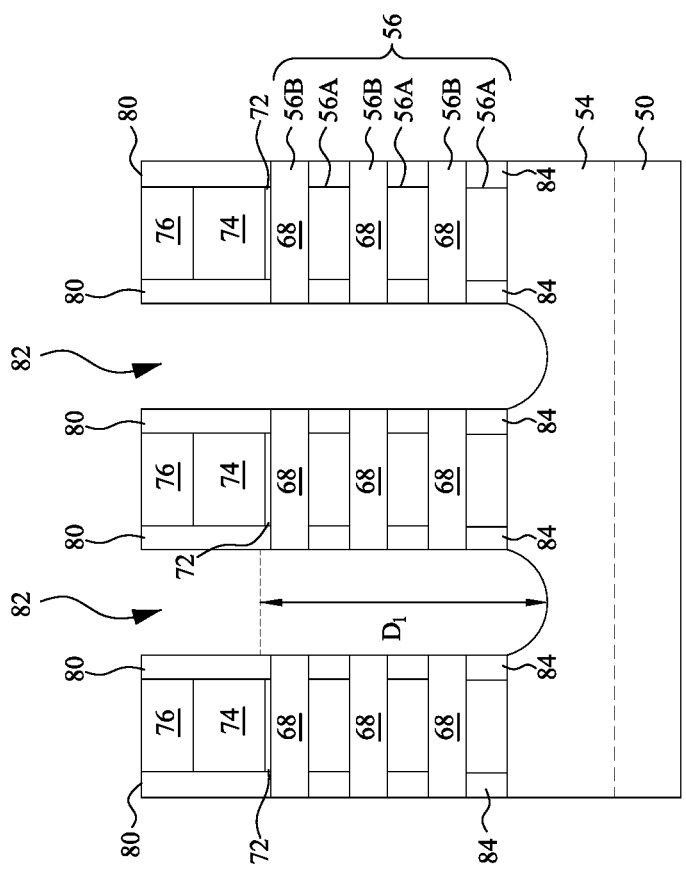

In FIGS. 6A and 6B, gate spacers 80 are formed over the nanostructures 56 and the fins 54, on exposed sidewalls of the masks 76, the dummy gates 74, and the dummy dielectrics 72. The gate spacers 80 may be formed by conformally forming an insulating material and subsequently etching the insulating material. The insulating material of the gate spacers 80 may be silicon nitride, silicon carbonitride, silicon oxycarbonitride, combinations thereof, or the like, and may be formed by thermal oxidation, deposition, a combination thereof, or the like. The gate spacers 80 can be formed from a singled-layered insulating material or multiple layers of insulating materials. In some embodiments, the gate spacers 80 each include multiple layers of silicon oxycarbonitride, where each layer may have a different composition of silicon oxycarbonitride. In some embodiments, the gate spacers 80 each include a layer of silicon oxide disposed between two layers of silicon nitride. Other spacer structures may be formed. The etching of the insulating material may be anisotropic. For example, the etching process may be a dry etch such as RIE, NBE, or the like. After etching, the gate spacers 80 can have straight sidewalls or curved sidewalls.

Before the formation of the gate spacers 80, implants for lightly doped source/drain (LDD) regions may be performed. In the embodiments with different device types, similar to the implants discussed above, a mask, such as a photoresist, may be formed over the n-type region 50N, while exposing the p-type region 50P, and appropriate type (e.g., p-type) impurities may be implanted into the nanostructures 56 and the fins 54 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the nanostructures 56 and the fins 54 exposed in the n-type region 50N. The mask may then be removed. The n-type impurities may be any of the n-type impurities previously discussed, and the p-type impurities may be any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities. During the implanting, the channel regions 68 remain covered by the dummy gates 74, so that the channel regions 68 remain substantially free from the impurity implanted in the LDD regions.

It is noted that the above disclosure generally describes a process of forming spacers and LDD regions. Other processes and sequences may be used. For example, fewer or additional spacers may be utilized, different sequence of steps may be utilized (e.g., additional spacers may be formed and removed, etc.), and/or the like. Furthermore, the n-type and p-type devices may be formed using a different structures and steps.

After the gate spacers 80 are formed, source/drain recesses 82 are then formed in the nanostructures 56. In the illustrated embodiment, the source/drain recesses 82 extend through the nanostructures 56 to expose the fins 54. The source/drain recesses 82 may also extend into the substrate 50 and/or the fins 54. In other words, the source/drain recesses 82 can be formed only in the nanostructures 56, as shown by FIG. 6A, or can also be formed to extend into the fins 54, as shown by FIG. 6B. In various embodiments, the source/drain recesses 82 may extend to a top surface of the substrate 50 without etching the substrate 50; the substrate 50 may be etched such that bottom surfaces of the source/drain recesses 82 are disposed below the top surfaces of the STI regions 60; or the like. The source/drain recesses 82 may be formed by etching the nanostructures 56 using an anisotropic etching processes, such as a RIE, a NBE, or the like. The gate spacers 80 and the masks 76 collectively mask portions of the nanostructures 56, the fins 54, and the substrate 50 during the etching processes used to form the source/drain recesses 82. A single etch process may be used to etch each of the nanostructures 56. In other embodiments, multiple etch processes may be used to etch the nanostructures 56. Timed etch processes may be used to stop the etching of the source/drain recesses 82 after the source/drain recesses 82 reach a desired depth $D_1$. The depth $D_1$ can be in the range of about 40 nm to about 140 nm.

Inner spacers 84 are optionally formed on the sidewalls of the remaining portions of the first nanostructures 56A, e.g., those sidewalls expose by the source/drain recesses 82. As will be discussed in greater detail below, source/drain regions will be subsequently formed in the source/drain recesses 82, and the first nanostructures 56A will be subsequently replaced with corresponding gate structures. The inner spacers 84 act as isolation features between the subsequently formed source/drain regions and the subsequently formed gate structures. Further, the inner spacers 84 may be used to prevent damage to the subsequently formed source/drain regions by subsequent etching processes, such as etching processes used to subsequently form the gate structures.

As an example to form the inner spacers 84, the source/drain recesses 82 can be expanded. Specifically, portions of the sidewalls of the first nanostructures 56A exposed by the source/drain recesses 82 may be recessed. Although sidewalls of the first nanostructures 56A are illustrated as being straight, the sidewalls may be concave or convex. The sidewalls may be recessed by an acceptable etching process, such as one that is selective to the material of the first nanostructures 56A (e.g., selectively etches the material of the first nanostructures 56A at a faster rate than the material(s) of the second nanostructures 56B and the fins 54). The etching may be isotropic. For example, when the fins 54 and the second nanostructures 56B are formed of silicon and the first nanostructures 56A are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 82 and recess the sidewalls of the first nanostructures 56A. The inner spacers 84 can then be formed by conformally forming an insulating material and subsequently etching the insulating material. The insulating material may be a material such as silicon nitride or silicon oxynitride, although any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as RIE, NBE, or the like. Although outer sidewalls of the inner spacers 84 are illustrated as being flush with respect to the sidewalls of the gate spacers 80, the outer sidewalls of the inner spacers 84 may extend beyond or be recessed from the sidewalls of the gate spacers 80. In other words, the inner spacers 84 may partially fill, completely fill, or overfill the sidewall recesses. Moreover, although the sidewalls of the inner spacers 84 are illustrated as being straight, the sidewalls of the inner spacers 84 may be concave or convex.

Figure 7A:
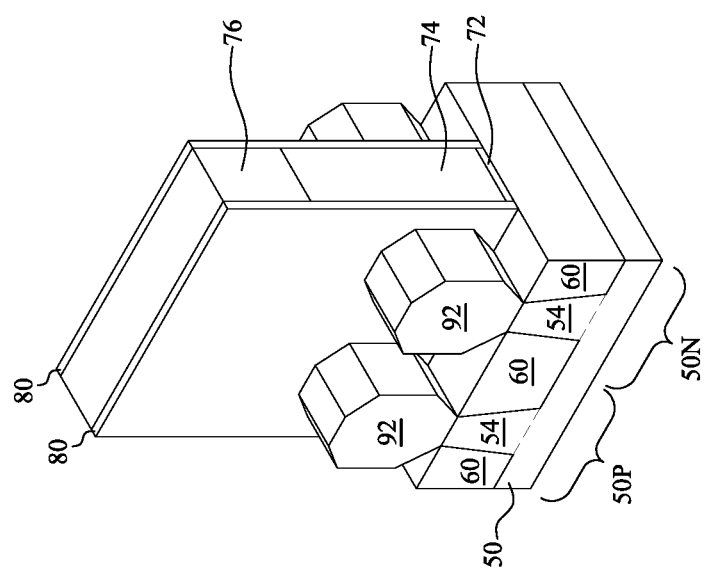
Figure 7B:
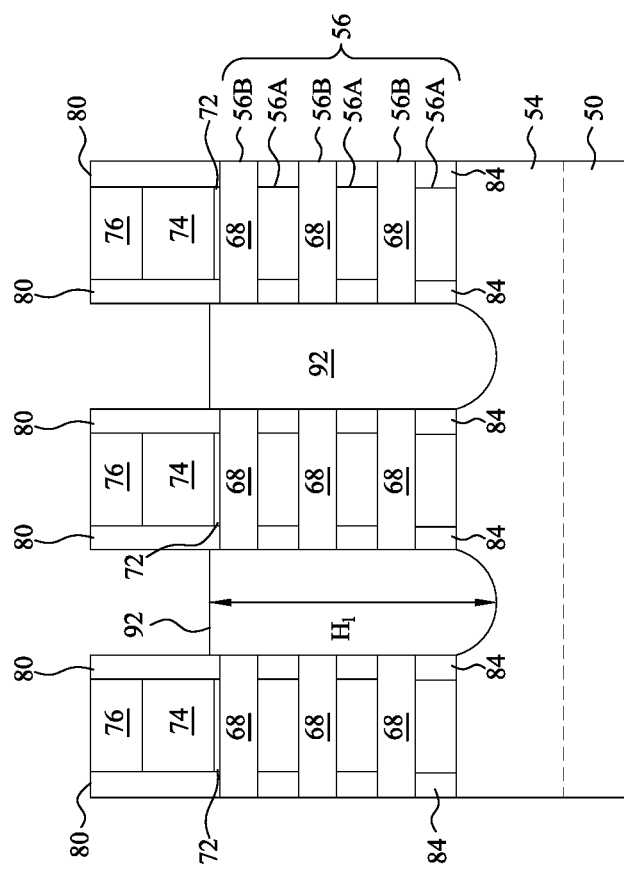

In FIGS. 7A and 7B, epitaxial source/drain regions 92 are formed in the source/drain recesses 82. The epitaxial source/drain regions 92 are formed in the source/drain recesses 82 such that each of the dummy gates 74 are disposed between respective neighboring pairs of the epitaxial source/drain regions 92. In some embodiments, the gate spacers 80 are used to separate the epitaxial source/drain regions 92 from the dummy gates 74 and the first nanostructures 56A by an appropriate lateral distance so that the epitaxial source/drain regions 92 do not short out subsequently formed gates of the nano-FETs. The epitaxial source/drain regions 92 may be formed in contact with the inner spacers 84 (if present), and may extend past sidewalls of the second nanostructures 56B. The epitaxial source/drain regions 92 can exert stress on the second nanostructures 56B, thereby improving performance.

The epitaxial source/drain regions 92 in the n-type region 50N may be formed by masking the p-type region 50P. Then, the epitaxial source/drain regions 92 are epitaxially grown in the source/drain recesses 82 in the n-type region 50N. The epitaxial source/drain regions 92 may include any acceptable material appropriate for n-type nano-FETs. For example, the epitaxial source/drain regions 92 in the n-type region 50N may include materials exerting a tensile strain on the channel regions 68, such as silicon, silicon carbide, phosphorous doped silicon carbide, silicon phosphide, or the like. The epitaxial source/drain regions 92 in the n-type region 50N may have surfaces raised from respective surfaces of the second nanostructures 56B and the fins 54, and may have facets.

The epitaxial source/drain regions 92 in the p-type region 50P may be formed by masking the n-type region 50N. Then, the epitaxial source/drain regions 92 are epitaxially grown in the source/drain recesses 82 in the p-type region 50P. The epitaxial source/drain regions 92 may include any acceptable material appropriate for p-type nano-FETs. For example, the epitaxial source/drain regions 92 in the p-type region 50P may include materials exerting a compressive strain on the channel regions 68, such as silicon germanium, boron doped silicon germanium, germanium, germanium tin, or the like. The epitaxial source/drain regions 92 in the p-type region 50P may have surfaces raised from respective surfaces of the second nanostructures 56B and the fins 54, and may have facets.

The epitaxial source/drain regions 92, the second nanostructures 56B, and/or the fins 54 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92, upper surfaces of the epitaxial source/drain regions 92 have facets which expand laterally outward beyond surfaces of the second nanostructures 56B and the fins 54. Thus, the epitaxial source/drain regions 92 have a height $H_1$, which is greater than the depth $D_1$ of the source/drain recesses 82. For example, the height $H_1$ can be in the range of about 30 nm to about 120 nm. In some embodiments, adjacent epitaxial source/drain regions 92 remain separated after the epitaxy process is completed as illustrated by FIG. 7A. In other embodiments, these facets cause adjacent epitaxial source/drain regions 92 of a same nano-FET to merge. In the embodiments illustrated in FIGS. 7A and 7B, the spacer etch used to form the gate spacers 80 is adjusted to remove the spacer material to allow the epitaxial source/drain regions 92 to extend to the top surfaces of the STI regions 60. In another embodiment, the gate spacers 80 are formed covering portions of the sidewalls of the nanostructures 56 that extend above the STI regions 60, thereby blocking epitaxial growth on the top surfaces of the STI regions 60.

The epitaxial source/drain regions 92 may include one or more semiconductor material layers. For example, the epitaxial source/drain regions 92 may include first semiconductor material layers, second semiconductor material layers, and third semiconductor material layers. Any number of semiconductor material layers may be used for the epitaxial source/drain regions 92. Each of the first semiconductor material layers, the second semiconductor material layers, and the third semiconductor material layers may be formed of different semiconductor materials and/or may be doped to different dopant concentrations. In some embodiments, the first semiconductor material layers may have a dopant concentration less than the second semiconductor material layers and greater than the third semiconductor material layers. In embodiments in which the epitaxial source/drain regions 92 include three semiconductor material layers, the first semiconductor material layers may be grown from the fins 54, the second semiconductor material layers may be grown from the first semiconductor material layers, and third semiconductor material layers may be grown from the second semiconductor material layers.

Figure 8A:
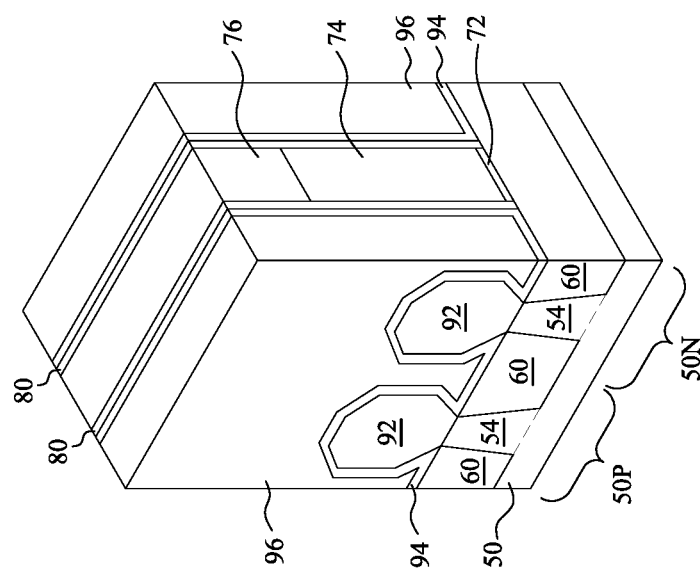
Figure 8B:
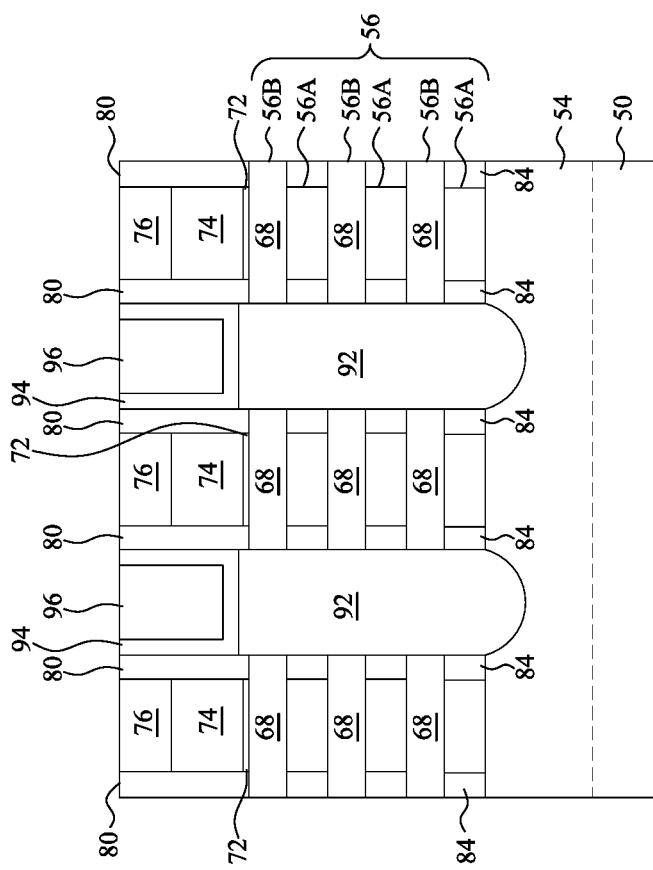

In FIGS. 8A and 8B, a first ILD 96 is formed over the epitaxial source/drain regions 92 and the STI regions 60. The first ILD 96 may be formed of a dielectric material. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials may be used.

The first ILD 96 may be formed by depositing a dielectric material over the epitaxial source/drain regions 92, the gate spacers 80, the masks 76 (if present) or the dummy gates 74, and the STI regions 60, and subsequently planarizing the dielectric material. The deposition may be by any suitable method, such as CVD, plasma-enhanced CVD (PECVD), or FCVD. Other acceptable processes may be used to form the dielectric material. The planarization may be by any suitable method, such as a CMP, an etch-back process, combinations thereof, or the like. The planarization process levels the top surface of the first ILD 96 with the top surfaces of the masks 76 or the dummy gates 74. The planarization process may also remove the masks 76 on the dummy gates 74, and portions of the gate spacers 80 along sidewalls of the masks 76. After the planarization process, the top surfaces of the first ILD 96, the gate spacers 80, and the masks 76 (if present) or the dummy gates 74 are coplanar (within process variations). Accordingly, the top surfaces of the masks 76 (if present) or the dummy gates 74 are exposed through the first ILD 96. In the illustrated embodiment, the masks 76 remain, and the planarization process levels the top surface of the first ILD 96 with the top surfaces of the masks 76.

In some embodiments, a contact etch stop layer (CESL) 94 is disposed between the first ILD 96 and the epitaxial source/drain regions 92, the gate spacers 80, and the STI regions 60. The CESL 94 may include a dielectric material, such as, silicon nitride, silicon oxide, silicon oxynitride, or the like, having a high etching selectivity from the etching of the first ILD 96.

Figure 9A:
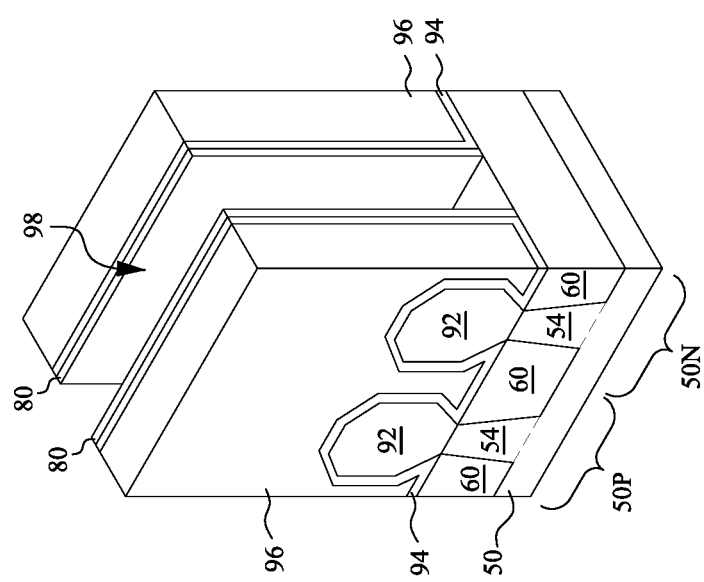
Figure 9B:
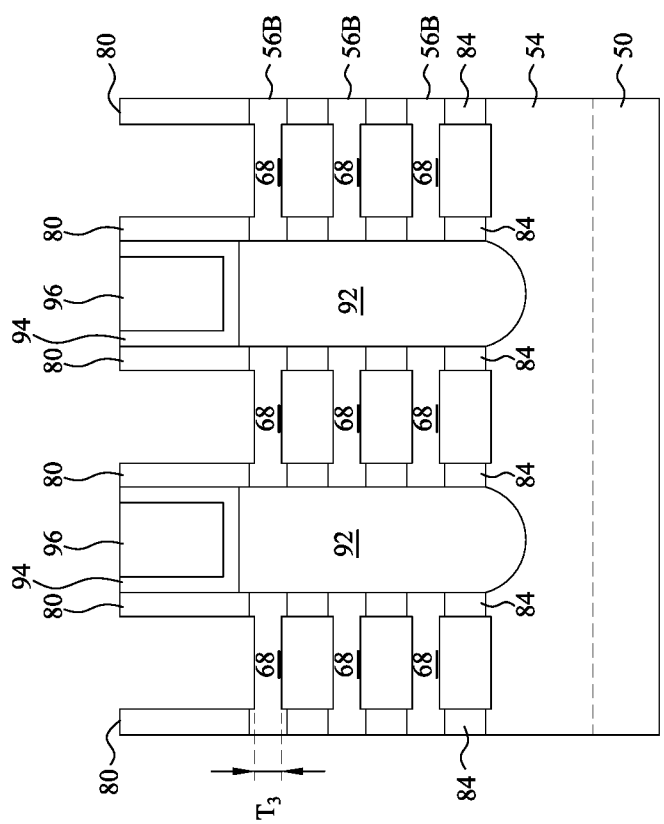

In FIGS. 9A and 9B, the masks 76 (if present) and the dummy gates 74 are removed in an etching process, so that recesses 98 are formed. Portions of the dummy dielectrics 72 in the recesses 98 may also be removed. In some embodiments, the dummy gates 74 are removed by an anisotropic dry etch process. For example, the etching process may include a dry etch process using reaction gas(es) that selectively etch the dummy gates 74 at a faster rate than the first ILD 96 or the gate spacers 80. During the removal, the dummy dielectrics 72 may be used as etch stop layers when the dummy gates 74 are etched. The dummy dielectrics 72 may then be removed after the removal of the dummy gates 74. Each recess 98 exposes and/or overlies portions of the channel regions 68 in the second nanostructures 56B. Portions of the second nanostructures 56B which act as the channel regions 68 are disposed between neighboring pairs of the epitaxial source/drain regions 92.

The remaining portions of the first nanostructures 56A are then removed to expand the recesses 98. The remaining portions of the first nanostructures 56A can be removed by an acceptable etching process that selectively etches the material of the first nanostructures 56A at a faster rate than the materials of the second nanostructures 56B, the fins 54, and the STI regions 60. The etching may be isotropic. For example, when the fins 54 and the second nanostructures 56B are formed of silicon and the first nanostructures 56A are formed of silicon germanium, the etching process may be a wet etch using tetramethylammonium hydroxide (TMAH), ammonium hydroxide ($NH_4OH$), or the like.

The exposed portions of the second nanostructures 56B and the fins 54 are optionally trimmed. The trimming reduces the thicknesses of the exposed portions of the second nanostructures 56B from the second thickness $T_2$ (discussed above with respect to FIG. 2) to a third thickness $T_3$, with the third thickness $T_3$ being in a range of about 3 nm to about 8 nm, and the third thickness $T_3$ being from about 40% to about 70% less than the second thickness $T_2$. The trimming may be performed concurrently with the formation of the recesses 98, or may be performed after the recesses 98 are formed. For example, the exposed portions of the second nanostructures 56B and the fins 54 may be trimmed by an acceptable etching process that selectively etches the material(s) of the second nanostructures 56B and the fins 54 at a faster rate than the materials of the first nanostructures 56A, the inner spacers 84, and the gate spacers 80. The etching may be isotropic. For example, when the fins 54 and the second nanostructures 56B are formed of silicon and the first nanostructures 56A are formed of silicon germanium, the etching process may be a wet etch using a diluted ammonium hydroxide-hydrogen peroxide mixture (APM), a sulfuric acid-hydrogen peroxide mixture (SPM), or the like.

Figure 10A:
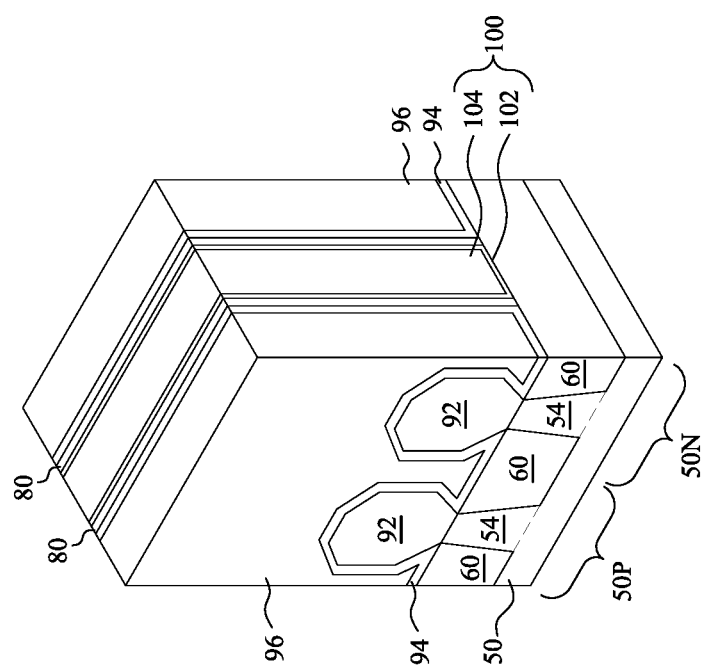
Figure 10B:
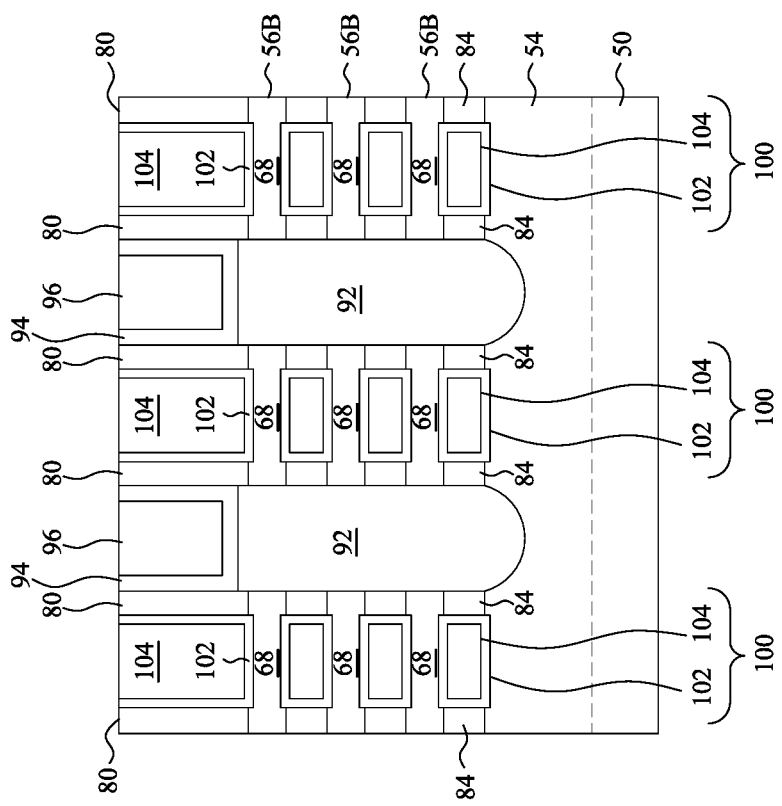

In FIGS. 10A and 10B, gate dielectrics 102 and gate electrodes 104 are formed for replacement gates. The gate dielectrics 102 are deposited conformally in the recesses 98, such as on top surfaces and sidewalls of the fins 54 and on top surfaces, sidewalls, and bottom surfaces of the second nanostructures 56B. The gate dielectrics 102 may also be deposited on top surfaces of the first ILD 96, the gate spacers 80, and the STI regions 60. The gate dielectrics 102 include one or more dielectric layers, such as an oxide, a metal oxide, a metal silicate, the like, or combinations thereof. In some embodiments, the gate dielectrics 102 include silicon oxide, silicon nitride, or multilayers thereof. In some embodiments, the gate dielectrics 102 include a high-k dielectric material, and in these embodiments, the gate dielectrics 102 may have a k value greater than about 7.0, and may include a metal oxide or a silicate of hafnium, aluminum, zirconium, lanthanum, manganese, barium, titanium, lead, and combinations thereof. The gate dielectrics 102 can be multilayered. For example, in some embodiments, the gate dielectrics 102 may each include an interfacial layer of silicon oxide formed by thermal or chemical oxidation and a metal oxide layer over the interfacial layer. The formation methods of the gate dielectrics 102 may include molecular-beam deposition (MBD), ALD, PECVD, and the like.

The gate electrodes 104 are deposited over the gate dielectrics 102, respectively, and fill the remaining portions of the recesses 98. The gate electrodes 104 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 104 are illustrated, the gate electrodes 104 may comprise any number of liner layers, any number of work function tuning layers, and a fill material. Any combination of the layers which make up the gate electrodes 104 may be deposited in the areas between each of the second nanostructures 56B and between the fins 54 and the second nanostructures 56B. The formation methods of the gate electrodes 104 may include ALD, PECVD, and the like. After the filling of the recesses 98, a planarization process, such as a CMP, may be performed to remove the excess portions of the materials of the gate dielectrics 102 and the gate electrodes 104, which excess portions are over the top surfaces of the first ILD 96 and the gate spacers 80. The remaining portions of the materials of the gate dielectrics 102 and the gate electrodes 104 thus form replacement gates of the resulting nano-FETs. The gate dielectrics 102 and the gate electrodes 104 may be collectively referred to as gate structures 100 or "gate stacks."

The formation of the gate dielectrics 102 in the region 50N and the region 50P may occur simultaneously such that the gate dielectrics 102 in each region are formed from the same materials, and the formation of the gate electrodes 104 may occur simultaneously such that the gate electrodes 104 in each region are formed from the same materials. In some embodiments, the gate dielectrics 102 in each region may be formed by distinct processes, such that the gate dielectrics 102 may be different materials, and/or the gate electrodes 104 in each region may be formed by distinct processes, such that the gate electrodes 104 may be different materials. Various masking steps may be used to mask and expose appropriate regions when using distinct processes.

Figure 11A:
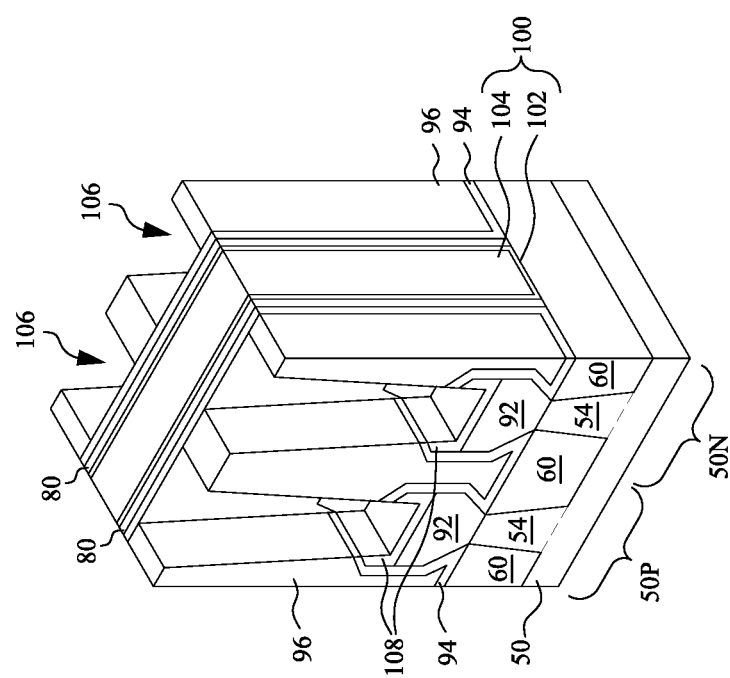
Figure 11B:
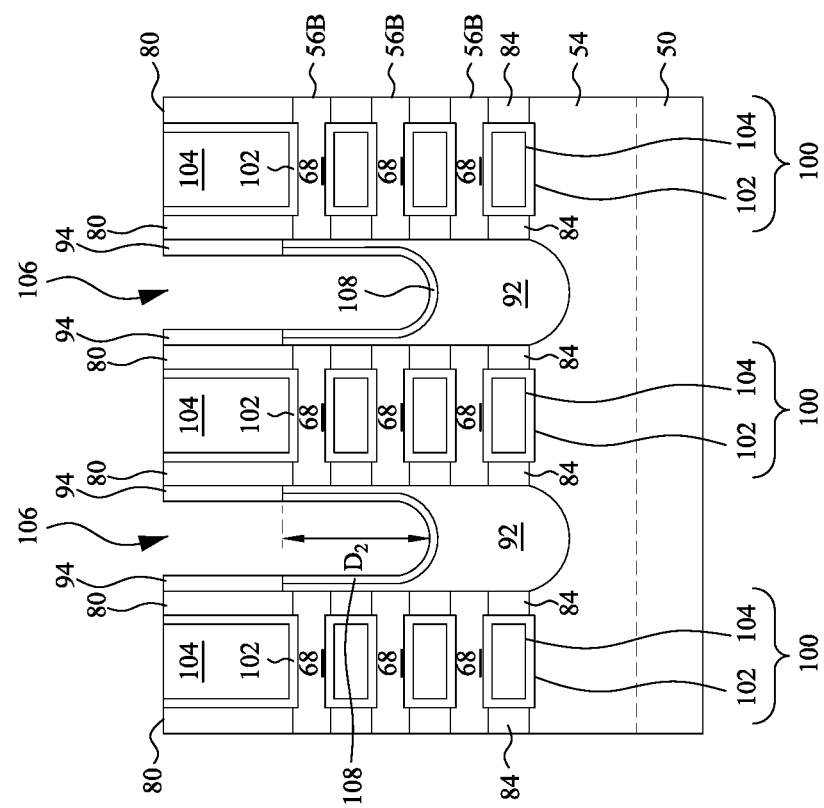

In FIGS. 11A and 11B, source/drain contact openings 106 are formed through the first ILD 96 and the CESL 94. The source/drain contact openings 106 may be initially formed in the first ILD 96 using acceptable photolithography and etching techniques, such as with an etching process that is selective to the first ILD 96 (e.g., etches the material of the first ILD 96 at a faster rate than the material of the CESL 94). For example, the source/drain contact openings 106 may be initially formed through the first ILD 96 by a dry etch using ammonia ($NH_3$) and hydrogen fluoride (HF) gas. The source/drain contact openings 106 are then extended through the CESL 94 using acceptable photolithography and etching techniques, such as with an etching process that is selective to the CESL 94 (e.g., etches the material of the CESL 94 at a faster rate than the material of the epitaxial source/drain regions 92). For example, the source/drain contact openings 106 may be extended through the CESL 94 by a dry etch using a fluorine-based gas (e.g., $C_4F_6$) and hydrogen ($H_2$) or oxygen ($O_2$) gas. The source/drain contact openings 106 are then extended partially into the epitaxial source/drain regions 92, such as into the upper portions of the epitaxial source/drain regions 92. For example, the source/drain contact openings 106 may be extended into the upper portions of the epitaxial source/drain regions 92 by a dry etch using chlorine ($Cl_2$) gas, hydrogen bromide (HBr) gas, and oxygen ($O_2$) gas.

After formation, the source/drain contact openings 106 extend into the upper portions of the epitaxial source/drain regions 92 by a distance $D_2$. In some embodiments, the distance $D_2$ is about half of the height $H_1$ of the epitaxial source/drain regions 92. Timed etch processes may be used to stop the etching of the source/drain contact openings 106 after the source/drain contact openings 106 extend into the upper portions of the epitaxial source/drain regions 92 by a desired distance $D_2$. For example, when the etchants described above are used to etch the epitaxial source/drain regions 92, the etching may be performed for a duration in the range of about 50 seconds to about 200 seconds, which can cause the source/drain contact openings 136 to extend into the upper portions of the epitaxial source/drain regions 92 by a distance $D_2$ in the range of about 15 nm to about 60 nm.

Metal-semiconductor alloy regions 108 are formed in the source/drain contact openings 106, such as on portions of the epitaxial source/drain regions 92 exposed by the source/drain contact openings 106. The metal-semiconductor alloy regions 108 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 108 can be formed by depositing a metal in the source/drain contact openings 106 and then performing a thermal anneal process. The metal can be any metal capable of reacting with the semiconductor materials (e.g., silicon, silicon germanium, germanium, etc.) of the epitaxial source/drain regions 92 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. In an embodiment, the metal-semiconductor alloy regions 108 are silicide regions formed of titanium-silicon. After the thermal anneal process, a cleaning process, such as a wet clean, may be performed to remove any residual metal from the source/drain contact openings 106, such as from the top surfaces of the first ILD 96.

In the illustrated embodiment, the source/drain contact openings 106 are formed in a self-aligned patterning method so that all of the first ILD 96 is removed in the cross-section of FIG. 11B. In another embodiment, other patterning methods may be used so that some of the first ILD 96 remains in the cross-section of FIG. 11B.

Figure 12A:
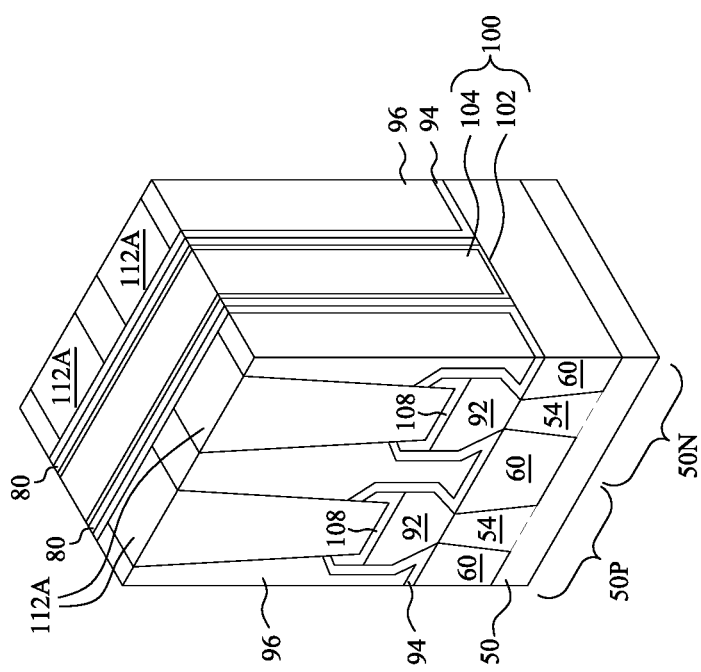
Figure 12B:
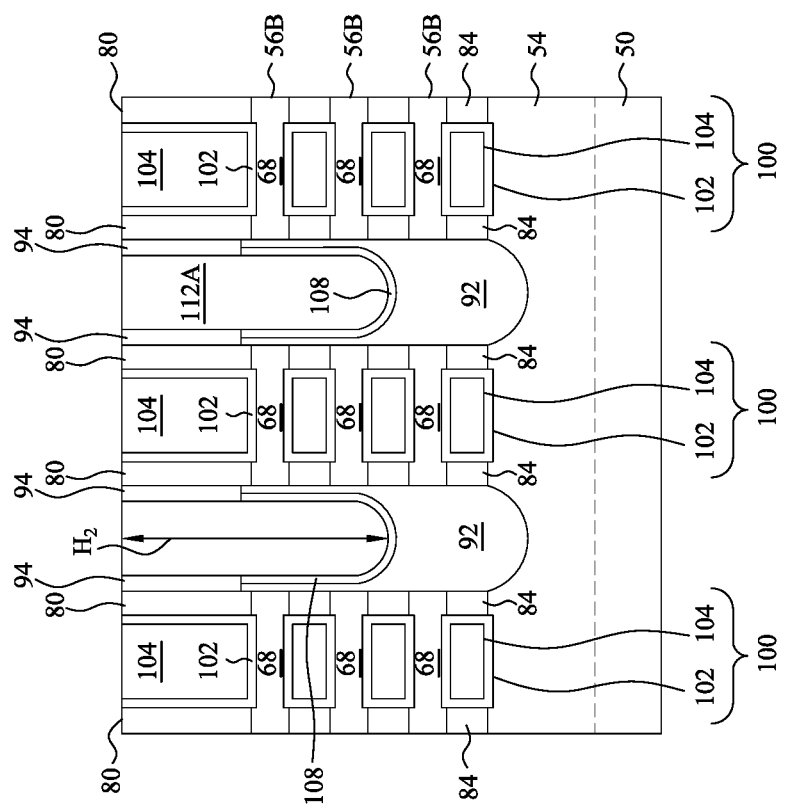

In FIGS. 12A and 12B, first source/drain contacts 112A are formed in the source/drain contact openings 106. A liner, such as a diffusion barrier layer, an adhesion layer, or the like, and a conductive material are formed in the source/drain contact openings 106. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from the top surfaces of the first ILD 96. The remaining liner and conductive material in the source/drain contact openings 106 forms the first source/drain contacts 112A. The first source/drain contacts 112A are physically and electrically coupled to the metal-semiconductor alloy regions 108. The top surfaces of the first source/drain contacts 112A, the gate electrodes 104, and the gate spacers 80 are coplanar (within process variations).

After formation, the first source/drain contacts 112A have similar dimensions as the source/drain contact openings 106. The first source/drain contacts 112A extend into the upper portions of the epitaxial source/drain regions 92 by the distance $D_2$ (see FIG. 11B), and have a height $H_2$. The height $H_2$ can be in the range of about 30 nm to about 90 nm. In embodiments where the distance $D_2$ is about half of the height $H_1$ (see FIG. 7B), the height $H_2$ is greater than about half of the height $H_1$.

Figure 13A:
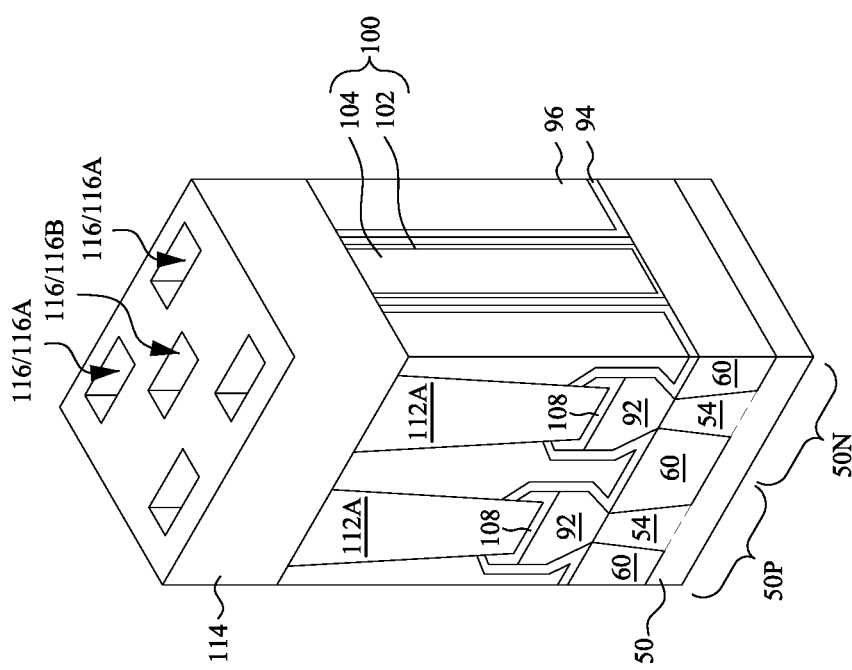
Figure 13B:
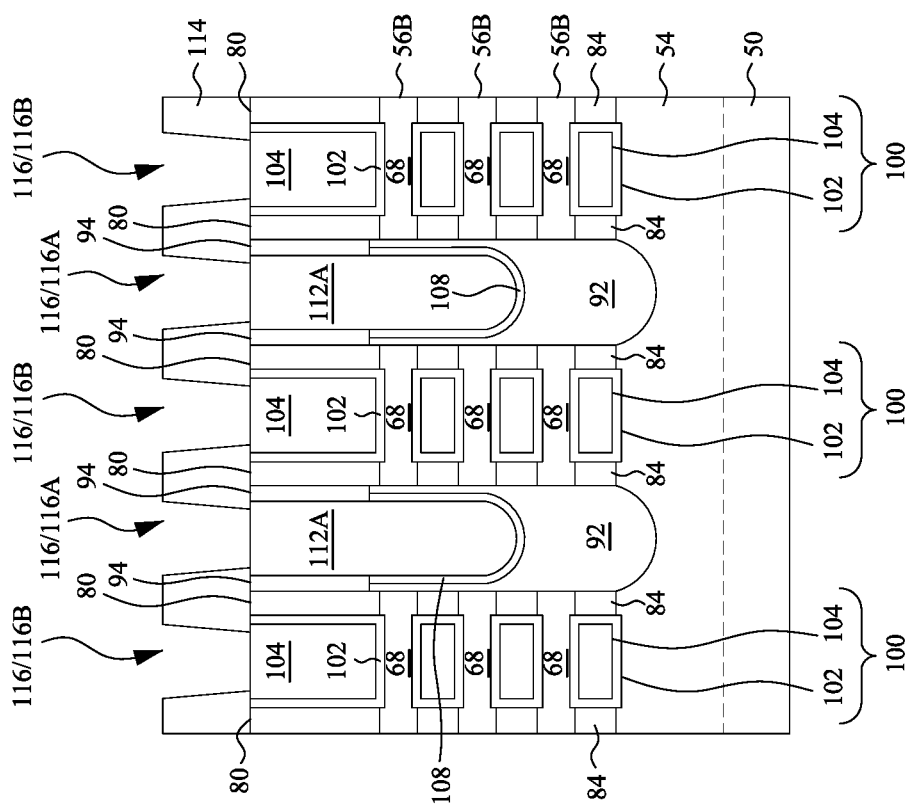

In FIGS. 13A and 13B, a second ILD 114 is deposited over the first ILD 96, the gate electrodes 104, and the first source/drain contacts 112A. The second ILD 114 may be formed of a material that is selected from the same group of candidate materials of the first ILD 96, and may be deposited using a method that is selected from the same group of candidate methods for depositing the first ILD 96. The first ILD 96 and the second ILD 114 may be formed from the same material, or may include different materials. After formation, the second ILD 114 can be planarized, such as by a CMP. In some embodiments, an etch stop layer is formed between the first ILD 96 and the second ILD 114. The etch stop layer may include a dielectric material, such as silicon nitride, silicon oxide, silicon oxynitride, or the like, having a different etch rate than the material of the second ILD 114.

Contact openings 116 are then formed in the second ILD 114. A first subset of the contact openings 116A expose the first source/drain contacts 112A, and a second subset of the contact openings 116B expose the gate electrodes 104. The contact openings 116 may be formed using acceptable photolithography and etching techniques.

Figure 14A:
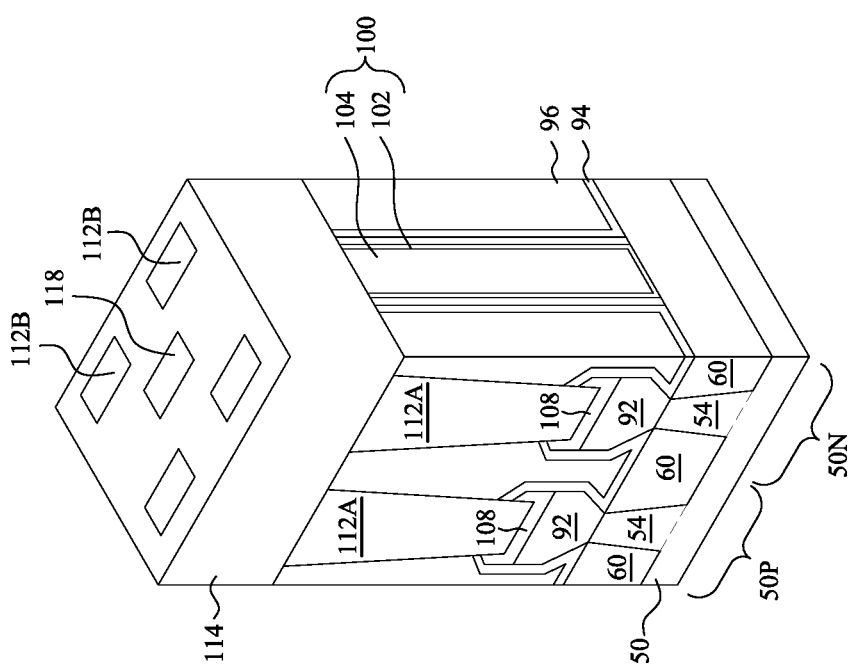
Figure 14B:
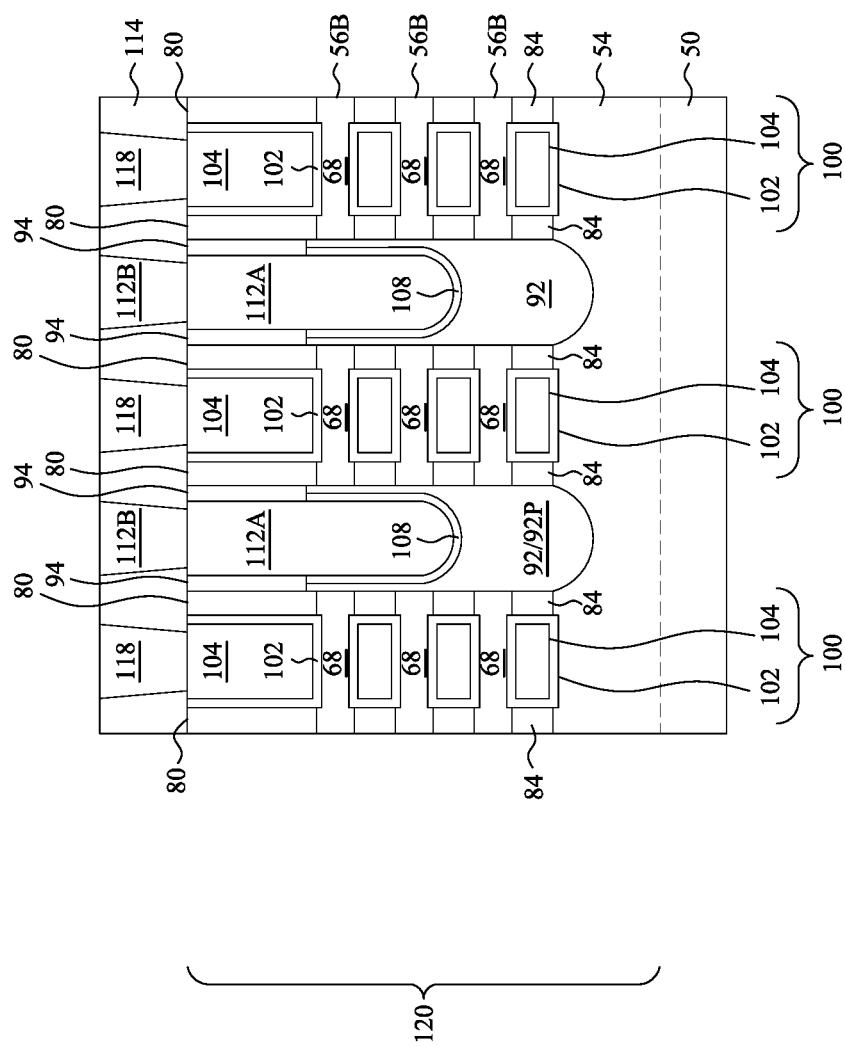

In FIGS. 14A and 14B, second source/drain contacts 112B and gate contacts 118 are formed extending through the second ILD 114. A liner, such as a diffusion barrier layer, an adhesion layer, or the like, and a conductive material are formed in the contact openings 116. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from a top surface of the second ILD 114. The remaining liner and conductive material in the contact openings 116A forms the second source/drain contacts 112B. The remaining liner and conductive material in the contact openings 116B forms the gate contacts 118. The second source/drain contacts 112B are physically and electrically coupled to the first source/drain contacts 112A, and the gate contacts 118 are physically and electrically coupled to the gate electrodes 104.

The second source/drain contacts 112B and the gate contacts 118 may be formed in different processes, or may be formed in the same process. Further, the second source/drain contacts 112B and the gate contacts 118 may be formed in the same cross-sections, as shown by FIGS. 13B and 14B, or may be formed in different cross-sections, as shown by FIGS. 13A and 14A, which may avoid shorting of the contacts As will be discussed in greater detail below, a first interconnect structure (e.g., a front-side interconnect structure) will be formed over the substrate 50. The substrate 50 will then be removed and replaced with a second interconnect structure (e.g., a back-side interconnect structure). Thus, a device layer 120 of active devices is formed between a front-side interconnect structure and a back-side interconnect structure. The front-side and back-side interconnect structures each comprise conductive features that are electrically connected to the nano-FETs of the device layer 120.

The conductive features (e.g., metallization patterns, also referred to as interconnects) of the front-side interconnect structure will be electrically connected to front-sides of one or more of the epitaxial source/drain regions 92 and the gate electrodes 104 to form functional circuits, such as logic circuits, memory circuits, image sensor circuits, or the like. The conductive features (e.g., power rails) of the back-side interconnect structure will be electrically connected to back-sides of one or more of the epitaxial source/drain regions 92 to provide a reference voltage, supply voltage, or the like to the functional circuits. Further, conductive vias will be formed through the device layer 120, connecting some of the conductive features of the front-side interconnect structure to some of the conductive features of the back-side interconnect structure. Specifically, a conductive feature (e.g., a power rail) of the back-side interconnect structure is connected to a conductive feature (e.g., metallization patterns) of the front-side interconnect structure, and is also connected to one or more of the epitaxial source/drain regions 92 of the device layer 120. Although the device layer 120 is described as having nano-FETs, other embodiments may include a device layer 120 having a different type of transistor (e.g., planar FETs, FinFETs, TFTs, or the like).

Although FIG. 14B illustrates a second source/drain contact 112B extending to each of the epitaxial source/drain regions 92, the second source/drain contacts 112B may be omitted from certain ones of the epitaxial source/drain regions 92. For example, as explained in greater detail below, a subset of the epitaxial source/drain regions 92P are connected to conductive features (e.g., a power rails) of the back-side interconnect structure. In the illustrated embodiment, for these particular epitaxial source/drain regions 92P, the second source/drain contacts 112B are also formed so that the power rails can be connected to overlying conductive features of the front-side interconnect structure. In other embodiments, for these particular epitaxial source/drain regions 92P, the second source/drain contacts 112B may be omitted or may be dummy contacts that are not electrically connected to overlying conductive features of the front-side interconnect structure.

FIGS. 15 through 22 are various views of intermediate stages in the manufacturing of semiconductor devices, in accordance with some embodiments. Specifically, the manufacturing of front-side and back-side interconnect structures for nano-FETs is illustrated. FIGS. 15, 16, 17, 18B, 19B, 20, 21, and 22 are cross-sectional views illustrated along reference cross-section A-A in FIG. 1. FIGS. 18A and 19A are three-dimensional views showing a similar three-dimensional view as FIG. 1, except one gate structure and two fins are shown. FIGS. 18A and 19A are simplified three-dimensional views, and do not show all of the features of corresponding FIGS. 18B and 19B. FIGS. 15, 16, 17, 18B, 19B, 20, 21, and 22 may be applicable to both the n-type region 50N and the p-type region 50P. Differences (if any) in the structures of the n-type region 50N and the p-type region 50P are described in the text accompanying each figure.

Figure 15:
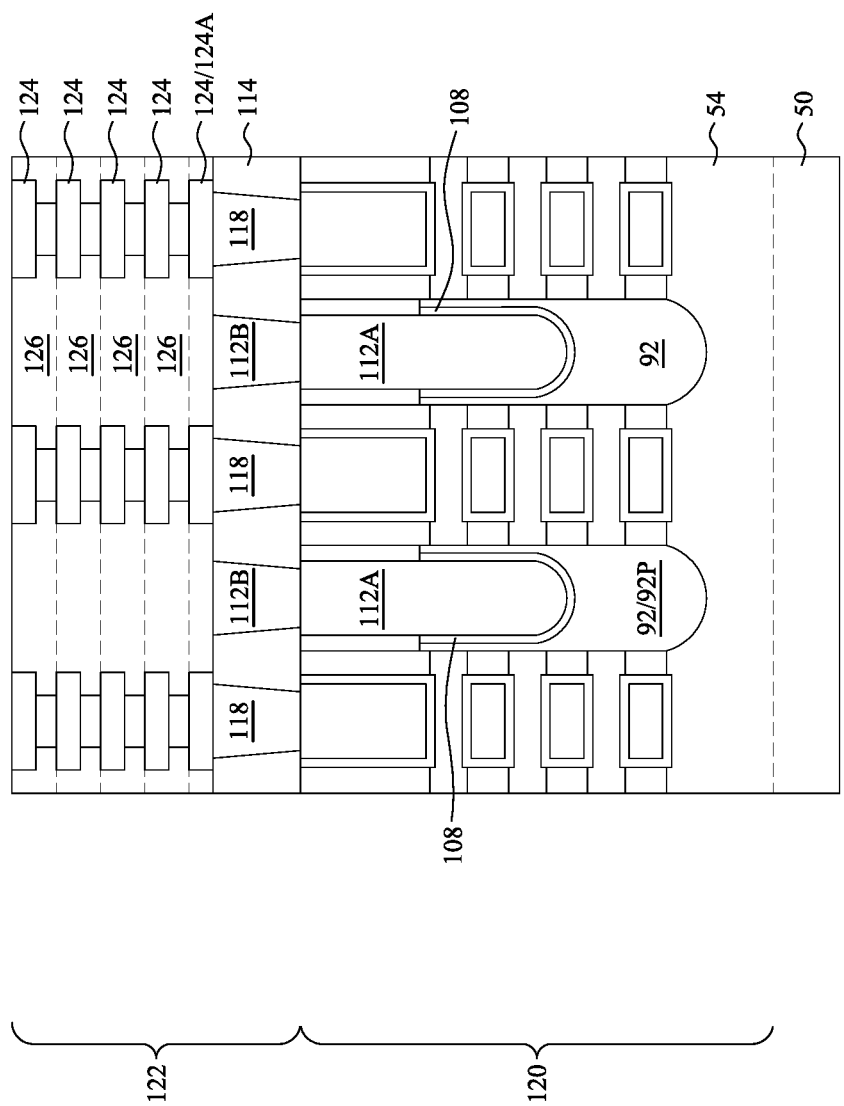
FIGS. 15 through 22 are various views of intermediate stages in the manufacturing of semiconductor devices, in accordance with some embodiments.

In FIG. 15, an interconnect structure 122 is formed on the device layer 120, e.g., on the second ILD 114. The interconnect structure 122 may also be referred to as a front-side interconnect structure because it is formed at a front-side of the substrate 50/the device layer 120 (e.g., a side of the substrate 50 on which the device layer 120 is formed).

The interconnect structure 122 may comprise one or more layers of conductive features 124 formed in one or more stacked dielectric layers 126. Each of the dielectric layers 126 may comprise a dielectric material, such as a low-k dielectric material, an extra low-k (ELK) dielectric material, or the like. The dielectric layers 126 may be deposited using an appropriate process, such as, CVD, ALD, PVD, PECVD, or the like.

The conductive features 124 may comprise conductive lines and conductive vias interconnecting the layers of conductive lines. The conductive vias may extend through respective ones of the dielectric layers 126 to provide vertical connections between layers of conductive lines. The conductive features 124 may be formed through any acceptable process. For example, the conductive features 124 may be formed through a damascene process, such as a single damascene process, a dual damascene process, or the like. In a damascene process, a respective dielectric layer 126 is patterned utilizing a combination of photolithography and etching techniques to form trenches corresponding to the desired pattern of the conductive features 124. An optional diffusion barrier and/or optional adhesion layer may be deposited and the trenches may then be filled with a conductive material. Suitable materials for the barrier layer includes titanium, titanium nitride, titanium oxide, tantalum, tantalum nitride, or other alternatives, and suitable materials for the conductive material include copper, silver, gold, tungsten, aluminum, combinations thereof, or the like. In an embodiment, the conductive features 124 may be formed by depositing a seed layer of copper or a copper alloy, and filling the trenches by electroplating. A chemical mechanical planarization (CMP) process or the like may be used to remove excess conductive material from a surface of the respective dielectric layer 126 and to planarize the surface for subsequent processing.

In the illustrated example, five layers of conductive features 124 and dielectric layers 126 are illustrated. However, it should be appreciated that the interconnect structure 122 may comprise any number of conductive features disposed in any number of dielectric layers. The conductive features 124 of the interconnect structure 122 are electrically connected to the gate contacts 118 and the second source/drain contacts 112B to form functional circuits. In some embodiments, the functional circuits formed by the interconnect structure 122 may comprise logic circuits, memory circuits, image sensor circuits, or the like. The second ILD 114, the second source/drain contacts 112B, and the gate contacts 118 may also be considered part of the interconnect structure 122, such as part of a first level of conductive features of the interconnect structure 122.

Figure 16:
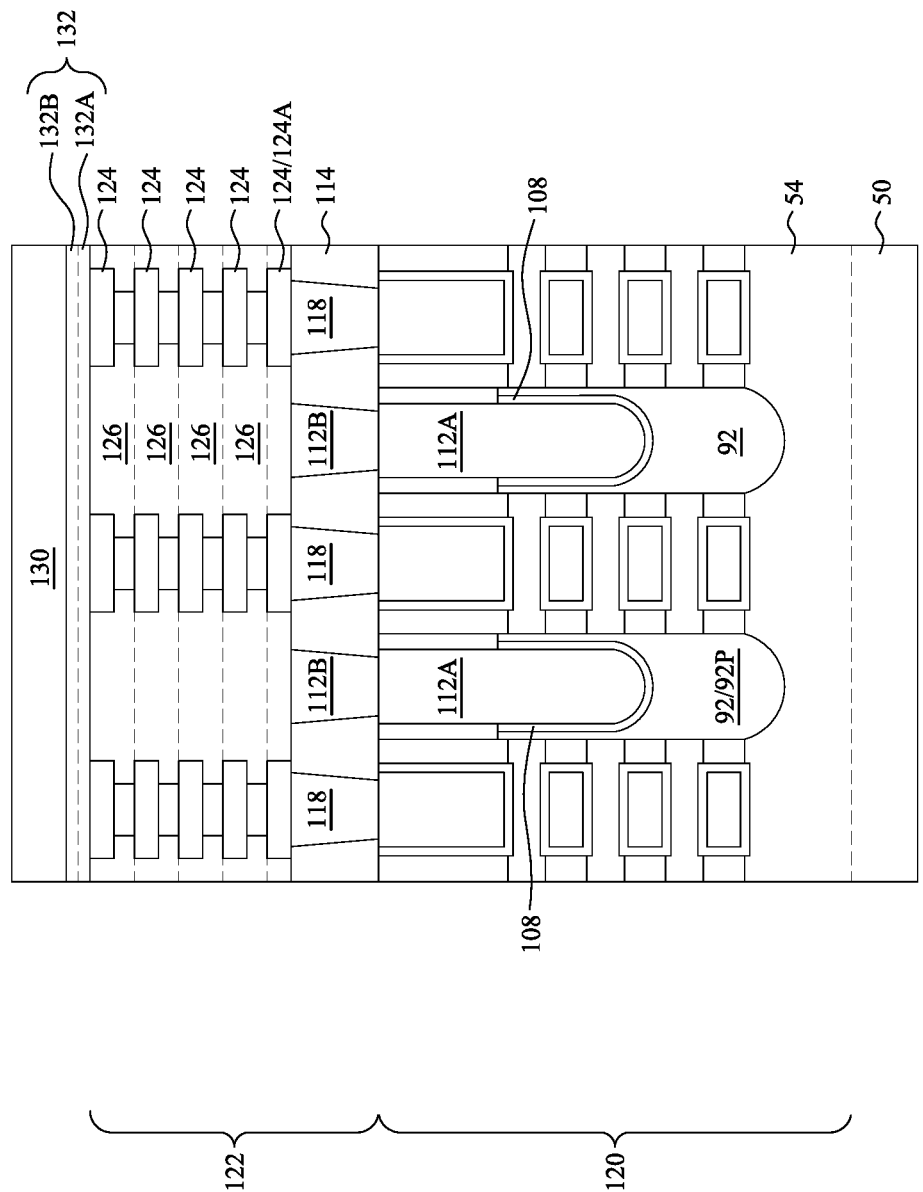

In FIG. 16, a carrier substrate 130 is bonded to a top surface of the interconnect structure 122 by bonding layers 132A, 132B (collectively referred to as bonding layers 132). The carrier substrate 130 may be a glass carrier substrate, a ceramic carrier substrate, a semiconductor substrate (e.g., a silicon substrate), a wafer (e.g., a silicon wafer), or the like. The carrier substrate 130 may provide structural support during subsequent processing steps and in the completed device. The carrier substrate 130 be substantially free of any active or passive devices.

In various embodiments, the carrier substrate 130 may be bonded to the interconnect structure 122 using a suitable technique such as dielectric-to-dielectric bonding, or the like. Dielectric-to-dielectric bonding may comprise depositing the bonding layers 132A, 132B on the interconnect structure 122 and the carrier substrate 130, respectively. In some embodiments, the bonding layer 132A comprises silicon oxide (e.g., a high density plasma (HDP) oxide, or the like) that is deposited by CVD, ALD, PVD, or the like. The bonding layer 132B may likewise be an oxide layer that is formed prior to bonding using, for example, CVD, ALD, PVD, thermal oxidation, or the like. Other suitable materials may be used as well for the bonding layers 132A, 132B.

The dielectric-to-dielectric bonding process may further include applying a surface treatment to one or more of the bonding layers 132. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the bonding layers 132. The carrier substrate 130 is then aligned with the interconnect structure 122 and the two are pressed against each other to initiate a pre-bonding of the carrier substrate 130 to the interconnect structure 122. The pre-bonding may be performed at room temperature (e.g., in a range of about 20° C. to about 25° C.). After the pre-bonding, an annealing process may be applied by for example, heating the interconnect structure 122 and the carrier substrate 130 to a temperature of about 170° C.

Figure 17:
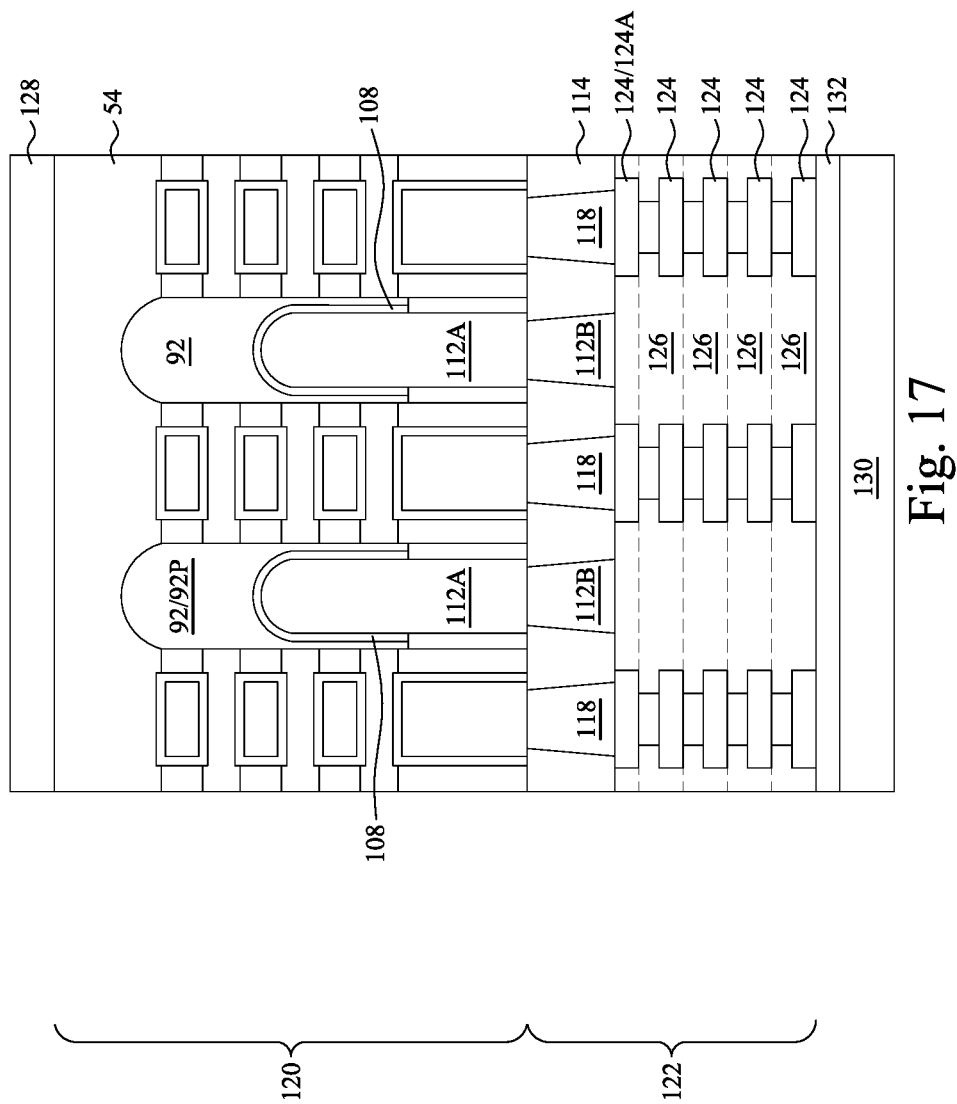

In FIG. 17, the intermediate structure is flipped so that the back-side of the substrate 50 faces upwards. The back-side of the substrate 50 refers to the side opposite to the front-side of the substrate 50 on which the device layer 120 is formed. The substrate 50 is then thinned to remove back-side portions of the substrate 50. The thinning process may comprise a planarization process (e.g., mechanical grinding, chemical mechanical polish (CMP), or the like), an etch back process, combinations thereof, or the like. The thinning process exposes the STI regions 60 and surfaces of the fins 54 at the back-side of the device layer 120.

A dielectric layer 128 is deposited over the back-side of the device layer 120, such as over the fins 54 and the STI regions 60. The dielectric layer 128 is part of an interconnect structure formed on the device layer 120. The dielectric layer 128 may physically contact surfaces of the remaining portions of the fins 54 and the STI regions 60. The dielectric layer 128 may be formed of a material that is selected from the same group of candidate materials of the first ILD 96, and may be deposited using a method that is selected from the same group of candidate methods for depositing the first ILD 96. The first ILD 96 and the dielectric layer 128 may be formed from the same material, or may include different materials.

Figure 18A:
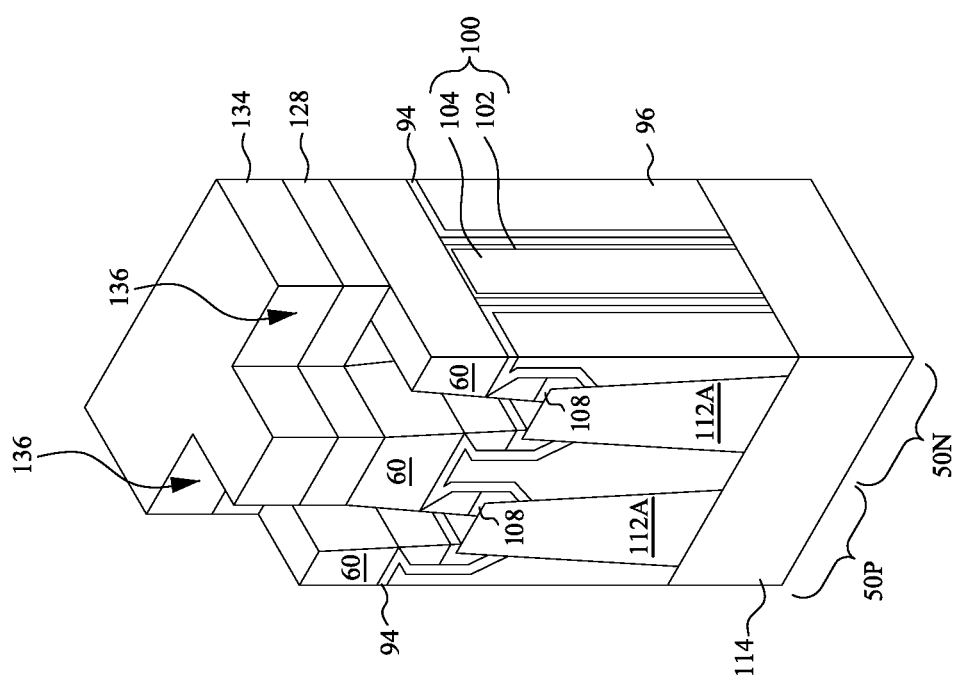
Figure 18B:
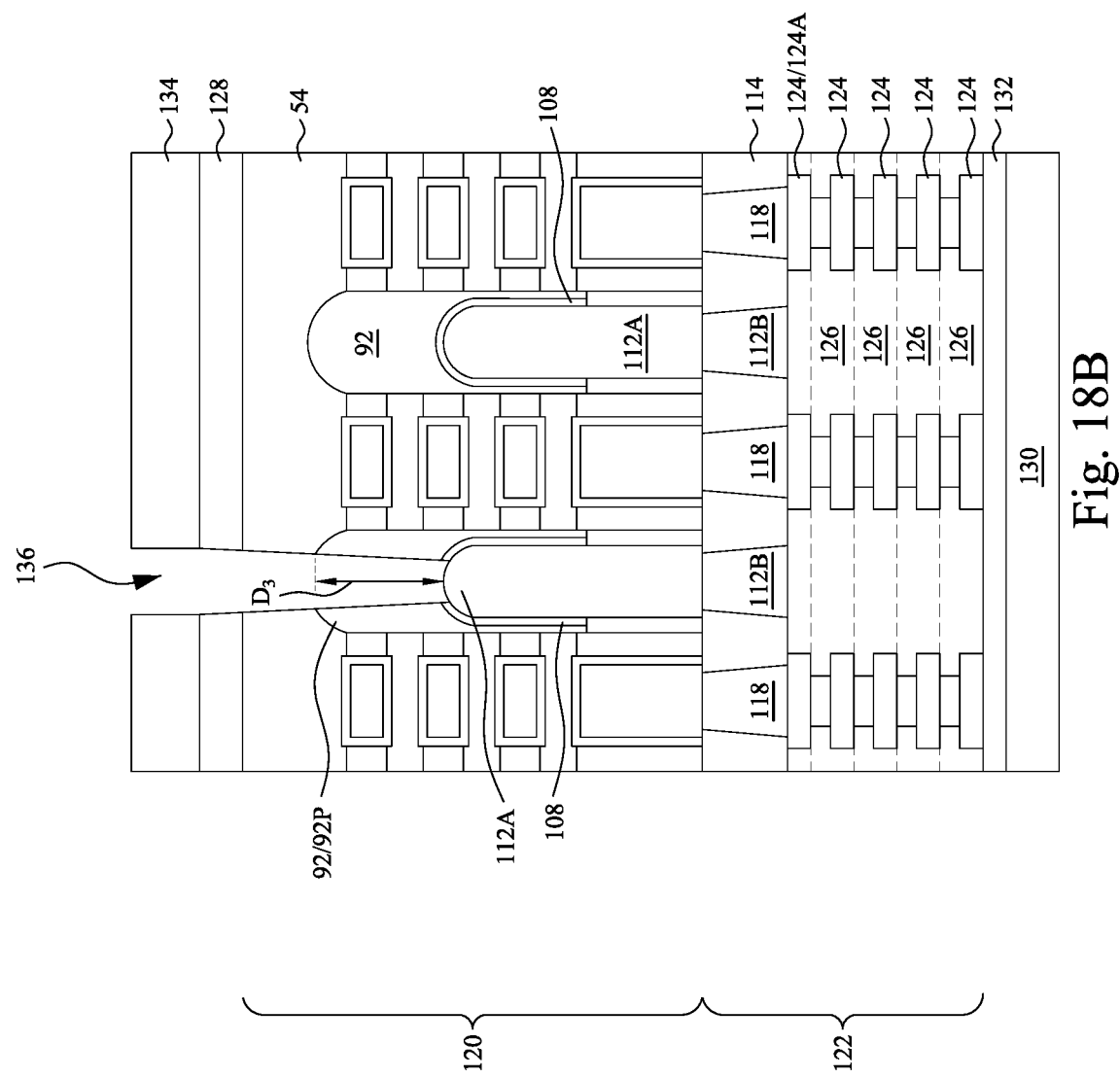

In FIGS. 18A and 18B, a mask 134 is formed over the dielectric layer 128. The mask 134 can be formed of a photoresist, such as a single layer photoresist, a bi-layer photoresist, a tri-layer photoresist, or the like. In some embodiments, the mask 134 is a tri-layer mask comprising a bottom layer (e.g., a bottom anti-reflective coating (BARC) layer), a middle layer (e.g., a nitride, an oxide, an oxynitride, or the like), and a top layer (e.g., a photoresist). The type of mask used (e.g., single layer mask, bilayer mask, tri-layer mask, etc.) may depend on the photolithography process used to subsequently pattern the mask 134. For example, in extreme ultraviolet (EUV) lithography processes, the mask 134 may be a single layer mask or a bilayer mask. The mask 134 may be formed by spin coating, a deposition process such as CVD, combinations thereof, or the like. The mask 134 can be patterned using acceptable photolithography techniques to form the openings having a pattern of subsequently formed source/drain contacts.

Source/drain contact openings 136 are formed through the dielectric layer 128, the fins 54, the epitaxial source/drain regions 92P, and the metal-semiconductor alloy regions 108. The source/drain contact openings 136 may be initially formed in the dielectric layer 128 using acceptable photolithography and etching techniques, such as with an etching process that is selective to the dielectric layer 128 (e.g., etches the material of the dielectric layer 128 at a faster rate than the material of the fins 54), using the mask 134 as an etching mask. For example, the source/drain contact openings 136 may be initially formed through the dielectric layer 128 by a dry etch using ammonia and hydrogen fluoride (HF) gas. The source/drain contact openings 136 are then extended through the fins 54 using acceptable photolithography and etching techniques, such as with an etching process that is selective to the fins 54 (e.g., etches the material of the fins 54 at a faster rate than the material of the epitaxial source/drain regions 92). For example, the source/drain contact openings 136 may be extended through the fins 54 by a dry etch using a fluorine-based gas such as hydrogen fluoride (HF) gas. The source/drain contact openings 136 are then extended through the epitaxial source/drain regions 92P and the metal-semiconductor alloy regions 108, so that the source/drain contact openings 136 extend into the lower portions of the epitaxial source/drain regions 92P and expose the first source/drain contacts 112A. For example, the source/drain contact openings 136 may be extended through the epitaxial source/drain regions 92P and the metal-semiconductor alloy regions 108 by a dry etch using chlorine ($Cl_2$) gas, hydrogen bromide (HBr) gas, and oxygen ($O_2$) gas. In the illustrated embodiment, substantially no etching of the first source/drain contacts 112A occurs when patterning the source/drain contact openings 136. In another embodiment, the source/drain contact openings 136 can also extend into the first source/drain contacts 112A.

The mask 134 may be removed during or after the patterning of the source/drain contact openings 136. For example, the mask 134 may be removed by the etching processes used to pattern the dielectric layer 128, the fins 54, the epitaxial source/drain regions 92P, or the metal-semiconductor alloy regions 108. In another embodiment, the mask 134 are removed after the patterning of the source/drain contact openings 136, such as by an acceptable ashing process.

After formation, the source/drain contact openings 136 extend into the lower portions of the epitaxial source/drain regions 92P by a distance $D_3$. In some embodiments, the distance $D_3$ is about half of the height $H_1$ (see FIG. 7B) of the epitaxial source/drain regions 92P. The sum of the distances $D_2$ (see FIG. 11B) and $D_3$ equals the height $H_1$. In other words, the distances $D_2$ and $D_3$ can be equal. In another embodiment, the distances $D_2$ and $D_3$ are dissimilar; for example, the distance $D_2$ can be greater or less than the distance $D_3$. Timed etch processes may be used to stop the etching of the source/drain contact openings 136 after the source/drain contact openings 136 extend into the lower portions of the epitaxial source/drain regions 92P by a desired distance $D_3$. For example, when the etchants described above are used to etch the epitaxial source/drain regions 92P, the etching may be performed for a duration in the range of about 50 seconds to about 200 seconds, which can cause the source/drain contact openings 136 to extend into the lower portions of the epitaxial source/drain regions 92P by a distance $D_3$ in the range of about 15 nm to about 60 nm.

Figure 19A:
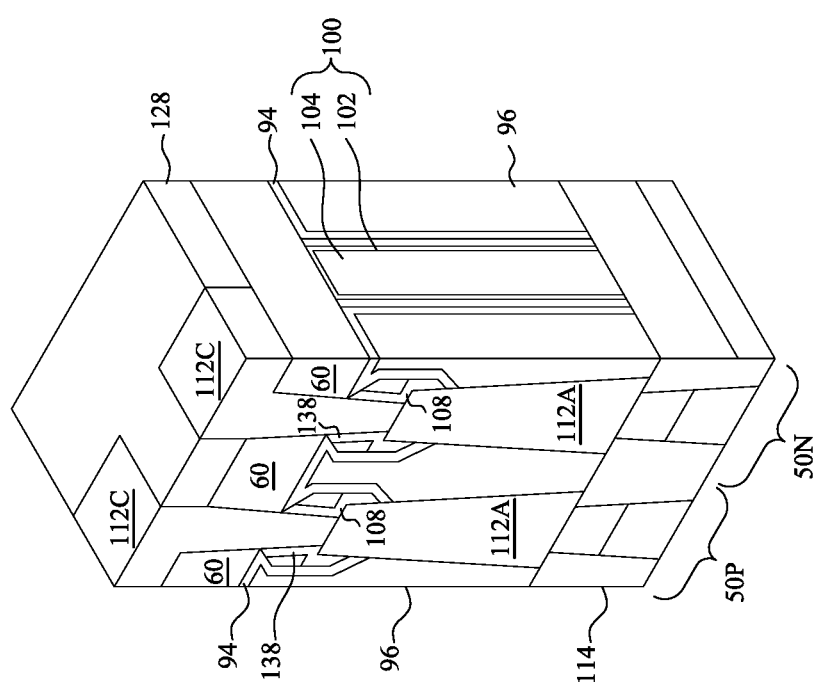
Figure 19B:
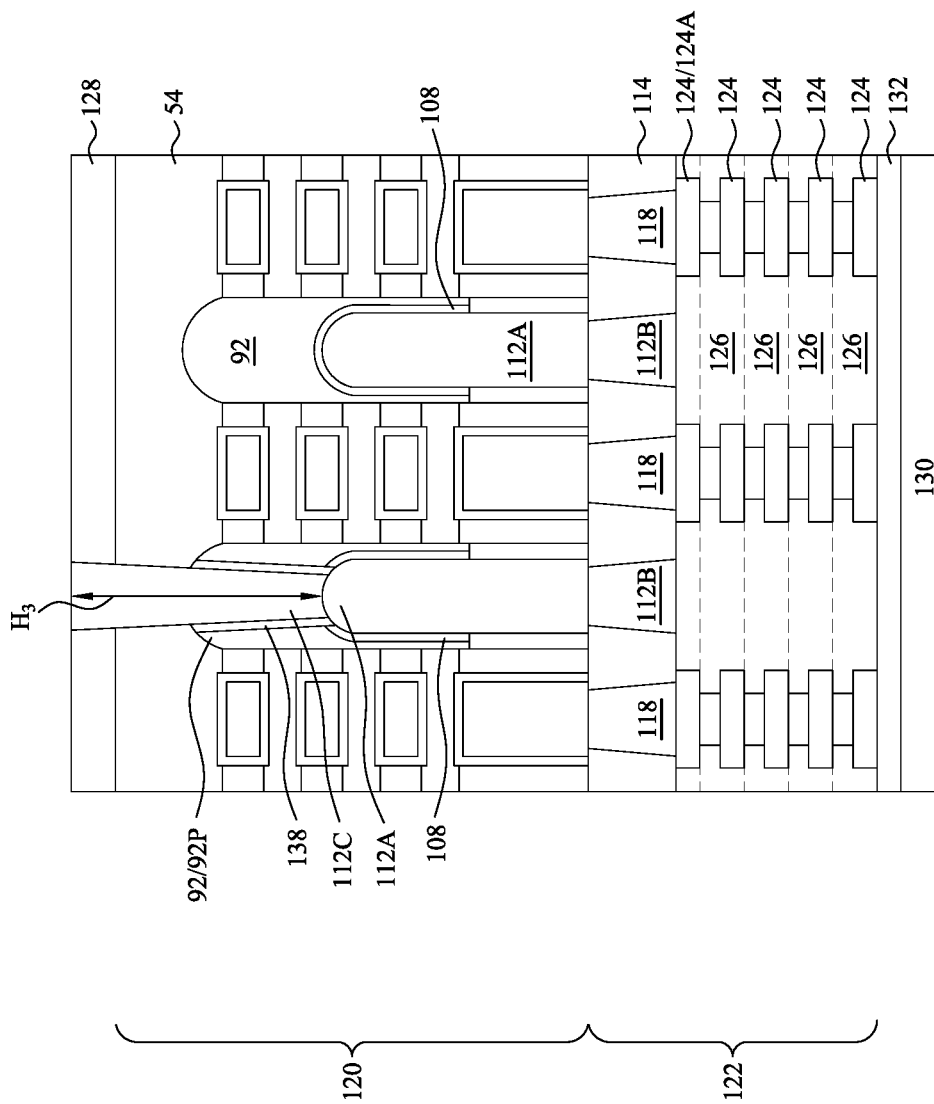

In FIGS. 19A and 19B, metal-semiconductor alloy regions 138 are formed in the source/drain contact openings 136, such as on portions of the epitaxial source/drain regions 92P exposed by the source/drain contact openings 136. The metal-semiconductor alloy regions 138 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 138 can be formed by depositing a metal in the source/drain contact openings 136 and then performing a thermal anneal process. The metal can be any metal capable of reacting with the semiconductor materials (e.g., silicon, silicon germanium, germanium, etc.) of the epitaxial source/drain regions 92P to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like. In an embodiment, the metal-semiconductor alloy regions 138 are silicide regions formed of titanium-silicon. After the thermal anneal process, a cleaning process, such as a wet clean, may be performed to remove any residual metal from the source/drain contact openings 136, such as from surfaces of the first source/drain contacts 112A and the STI regions 60. Although the metal-semiconductor alloy regions 108, 138 are shown as separate regions, it should be appreciated that in some embodiments, the metal-semiconductor alloy regions 108, 138 may merge during formation so that no distinguishable interface exists between them.

Third source/drain contacts 112C are formed in the source/drain contact openings 136. A liner, such as a diffusion barrier layer, an adhesion layer, or the like, and a conductive material are formed in the source/drain contact openings 136. The liner may include titanium, titanium nitride, tantalum, tantalum nitride, or the like. The liner may be deposited by a conformal deposition process, such as atomic layer deposition (ALD), chemical vapor deposition (CVD), physical vapor deposition (PVD), or the like. In some embodiments, the liner may include an adhesion layer and at least a portion of the adhesion layer may be treated to form a diffusion barrier layer. The conductive material may be tungsten, cobalt, ruthenium, aluminum, nickel, copper, a copper alloy, silver, gold, or the like. The conductive material may be deposited by ALD, CVD, PVD, or the like. A planarization process, such as a CMP, may be performed to remove excess material from the top surface of the dielectric layer 128. The remaining liner and conductive material in the source/drain contact openings 136 forms the third source/drain contacts 112C. The third source/drain contacts 112C are physically and electrically coupled to the first source/drain contacts 112A. The top surfaces of the third source/drain contacts 112C and the dielectric layer 128 are coplanar (within process variations).

After formation, the third source/drain contacts 112C have similar dimensions as the source/drain contact openings 136. The third source/drain contacts 112C extend into the lower portions of the epitaxial source/drain regions 92 by the distance $D_3$ (see FIG. 18B), and have a height $H_3$. The height $H_3$ can be in the range of about 25 nm to about 70 nm. In embodiments where the distance $D_3$ is about half of the height $H_1$ (see FIG. 7B), the height $H_3$ is greater than about half of the height $H_1$.

Figure 20:
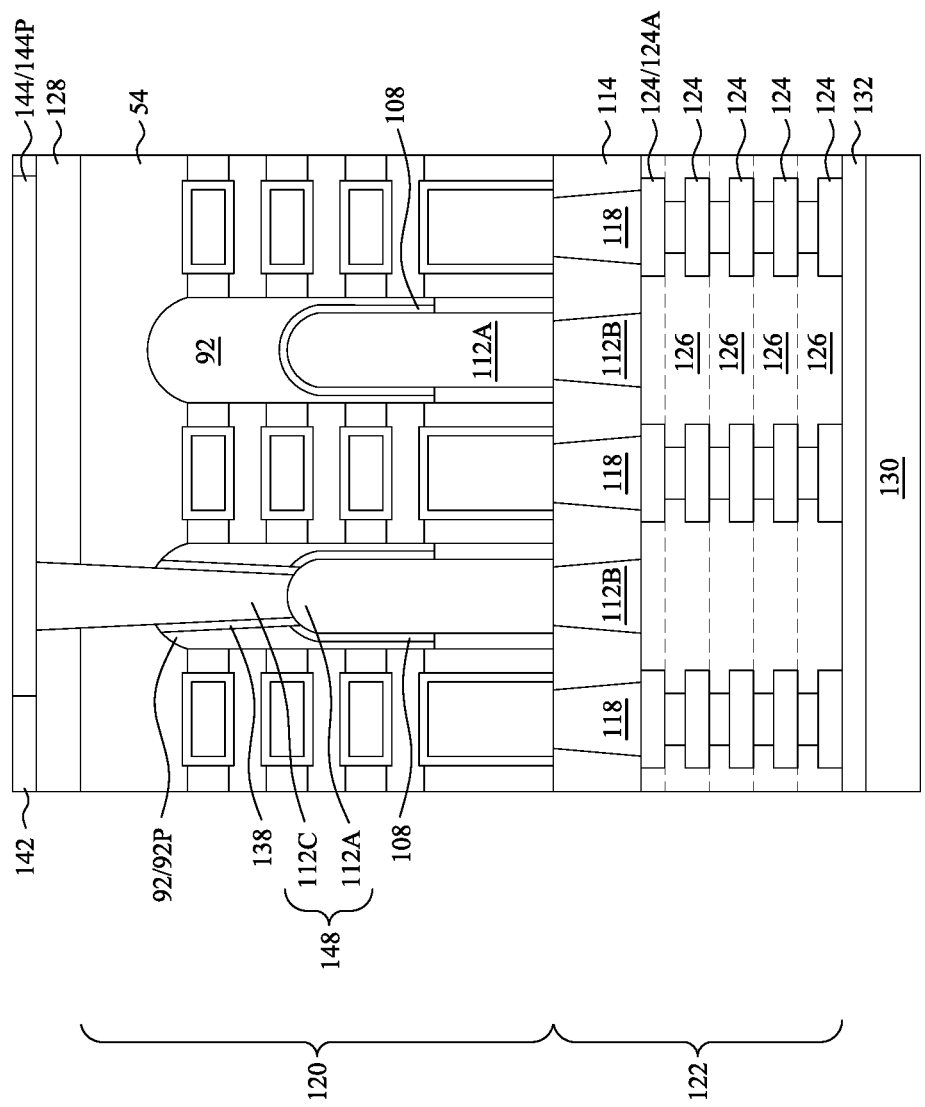

In FIG. 20, a dielectric layer 142 and conductive features 144 are formed over the dielectric layer 128 and the third source/drain contacts 112C. The dielectric layer 142 and conductive features 144 are also part of an interconnect structure formed on the device layer 120. The dielectric layer 142 may be formed of a material that is selected from the same group of candidate materials of the first ILD 96, and may be deposited using a method that is selected from the same group of candidate methods for depositing the first ILD 96. The first ILD 96 and the dielectric layer 142 may be formed from the same material, or may include different materials.

The conductive features 144 are formed in the dielectric layer 142, and may be conductive lines. Forming the conductive features 144 may include patterning recesses in the dielectric layer 142 using a combination of photolithography and etching processes, for example. A pattern of the recesses in the dielectric layer 142 may correspond to a pattern of the conductive features 144. The conductive features 144 are then formed by depositing a conductive material in the recesses. In some embodiments, the conductive features 144 comprises a metal layer, which may be a single layer or a composite layer comprising a plurality of sub-layers formed of different materials. In some embodiments, the conductive features 144 comprises copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer includes titanium, titanium nitride, titanium oxide, tantalum, tantalum nitride, or the like. The conductive features 144 may be formed using, for example, CVD, ALD, PVD, plating or the like. The conductive features 144 are electrically connected to the epitaxial source/drain regions 92P through the third source/drain contacts 112C and the metal-semiconductor alloy regions 138. A planarization process (e.g., CMP, grinding, etch back, or the like) may be performed to remove excess portions of the conductive features 144 formed over the dielectric layer 142.

Some or all of the conductive features 144 are power rails 144P, which are conductive lines that electrically connect the epitaxial source/drain regions 92P to a reference voltage, supply voltage, or the like. By placing the power rails 144P at a back-side of the device layer 120 rather than at a front-side of the device layer 120, advantages may be achieved. For example, a gate density of the nano-FETs and/or interconnect density of the interconnect structure 122 may be increased. Further, the back-side of the device layer 120 may accommodate wider power rails, reducing resistance and increasing efficiency of power delivery to the nano-FETs. For example, a width of the conductive features 144 may be at least twice a width of a first level conductive line (e.g., conductive line 124A in FIG. 15) of the interconnect structure 122.

The first source/drain contacts 112A and the third source/drain contacts 112C form conductive vias 148, which may be referred to as power rail vias. Each power rail via comprises a first source/drain contact 112A and a third source/drain contact 112C. The overall height of the conductive vias 148 equal the sum of the height $H_2$ (see FIG. 12B) and $H_3$ (see FIG. 19B). The conductive vias 148 extend through the device layer 120, and connect the conductive features of the interconnect structure 122 (e.g., metallization patterns) to the conductive features of the interconnect structure 150 (e.g., power rails 144P). The reference voltage, supply voltage, etc. may thus be electrically connected to both the epitaxial source/drain regions 92P and the interconnect structure 122 by the conductive vias 148. Connecting the power rails 144P to the interconnect structure 122 by conductive features (e.g., the conductive vias 148) rather than by semiconductive features (e.g., the epitaxial source/drain regions 92P) may achieve advantages. For example, conductive features have a lower resistance than semiconductive features, allowing the performance of local interconnection between the interconnect structures 122, 150 to be improved. Further, the conductive vias 148 are also physically and electrically coupled to the epitaxial source/drain regions 92P where power rail connection is desired. In this embodiment, the metal-semiconductor alloy regions 108, 138 surround and are coupled to the portions of the conductive vias 148 extending through the epitaxial source/drain region 92P. Because the conductive vias 148 extend through the epitaxial source/drain regions 92P, voltage drops across the epitaxial material of the epitaxial source/drain regions 92P may thus be avoided during operation, thereby decreasing the parasitic capacitance of the nano-FETs. Finally, the same conductive features may be used to both connect the epitaxial source/drain regions 92P to the power rails 144P, and to provide local interconnection between the interconnect structures 122, 150, thus reducing the quantity of conductive features in the interconnect structure 150.

Figure 21:
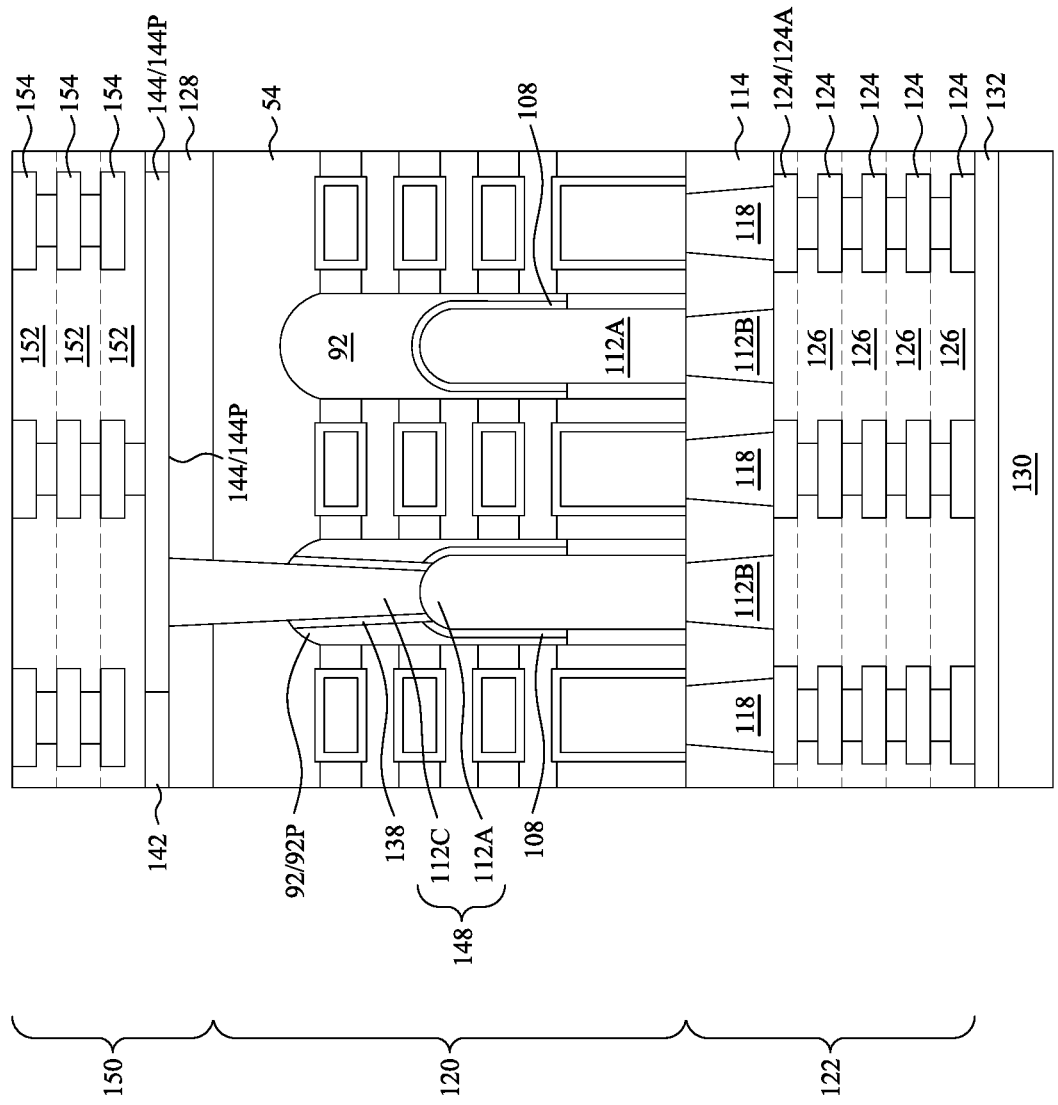

In FIG. 21, remaining portions of an interconnect structure 150 are formed at the back-side of the device layer 120, such as over the dielectric layer 142 and the conductive features 144. The interconnect structure 150 may also be referred to as a back-side interconnect structure because it is formed on a back-side of the device layer 120. The remaining portions of the interconnect structure 150 may be similar to the interconnect structure 122. For example, the interconnect structure 150 may comprise similar materials and be formed using similar processes as the interconnect structure 122. In particular, the interconnect structure 150 may comprise stacked layers of conductive features 154 formed in stacked dielectric layers 152. The conductive features 154 may include routing lines (e.g., for routing to and from subsequently formed contact pads and external connectors). The conductive features 154 may further include conductive vias that extend in the dielectric layers 152 to provide vertical interconnection between stacked layers of the conductive lines. The interconnect structure 150 thus comprises the dielectric layers 128, 142, 152 and the conductive features 144, 154.

In some embodiments, the conductive features of the interconnect structure 150 may further be patterned to include one or more embedded passive devices such as, resistors, capacitors, inductors, or the like, in the interconnect structure 150. The embedded passive devices may be integrated with the conductive features 144, 154 (e.g., the power rails 144P) to provide circuits (e.g., power circuits) at the backside of the device layer 120

Figure 22:
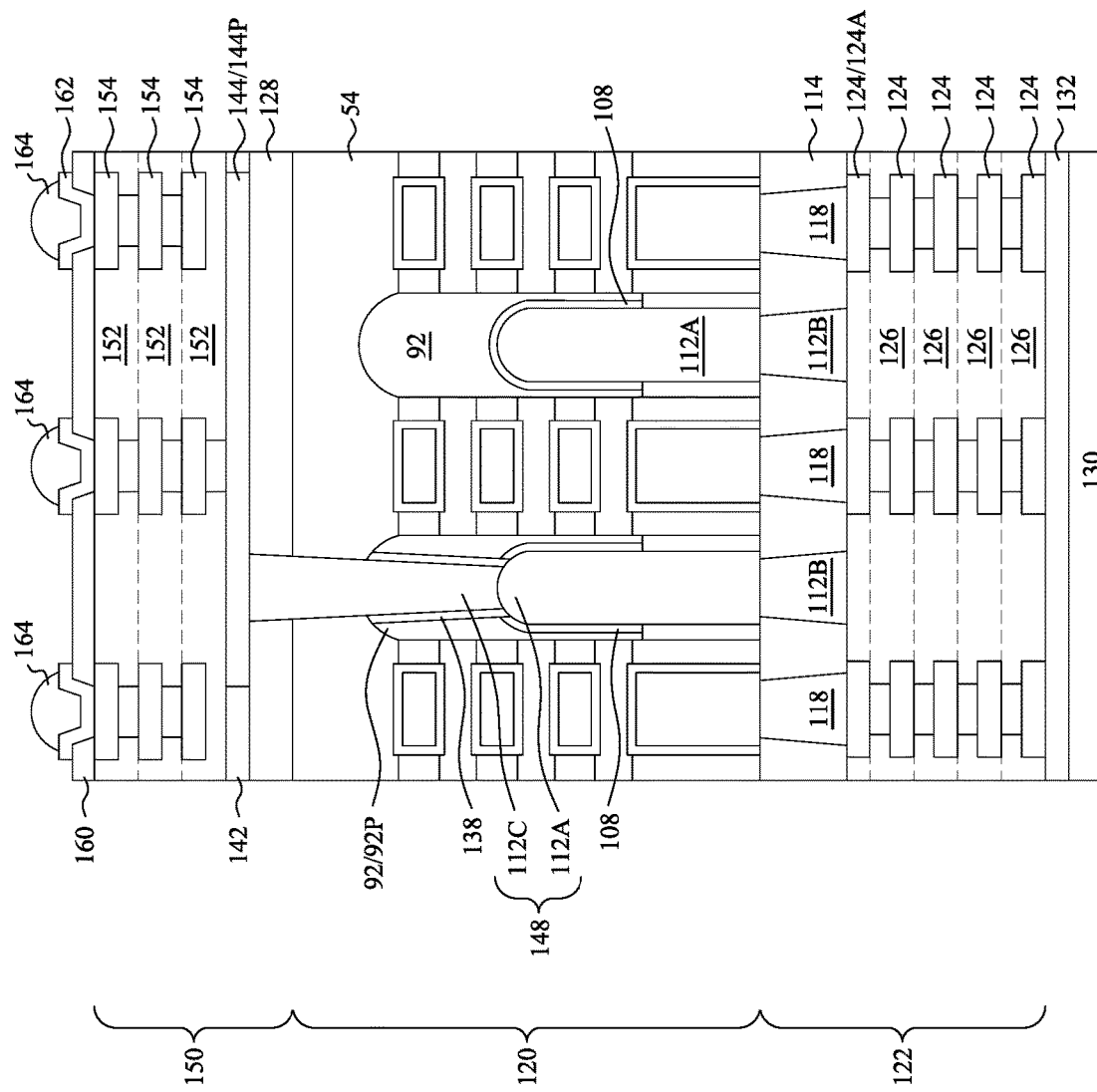

In FIG. 22, a passivation layer 160, UBMs 162, and external connectors 164 are formed over the interconnect structure 150. The passivation layer 160 may comprise polymers such as PBO, polyimide, BCB, or the like. Alternatively, passivation layer 160 may include non-organic dielectric materials such as silicon oxide, silicon nitride, silicon carbide, silicon oxynitride, or the like. The passivation layer 160 may be deposited by, for example, CVD, PVD, ALD, or the like.

The UBMs 162 are formed through the passivation layer 160 to the conductive features 154 of the interconnect structure 150, and the external connectors 164 are formed on the UBMs 162. The UBMs 162 may comprise one or more layers of copper, nickel, gold, or the like, which are formed by a plating process, or the like. The external connectors 164 (e.g., solder balls) are formed on the UBMs 162. The formation of external connectors 164 may include placing solder balls on the exposed portions of UBMs 162 and then reflowing the solder balls. In alternative embodiments, the formation of external connectors 164 includes performing a plating step to form solder regions over the topmost conductive feature 154 and then reflowing the solder regions. In another embodiment, the external connectors 164 are metal connectors with substantially vertical sidewalls, such as microbumps. The UBMs 162 and the external connectors 164 may be used to provide input/output connections to other electrical components, such as, other device dies, redistribution structures, printed circuit boards (PCBs), motherboards, or the like. The UBMs 162 and the external connectors 164 may also be referred to as backside input/output pads that may provide signal, reference voltage, supply voltage, and/or ground connections to the nano-FETs of the device layer 120.

FIGS. 23A through 31 are various views of intermediate stages in the manufacturing of semiconductor devices, in accordance with some other embodiments. Specifically, the manufacturing of front-side and back-side interconnect structures for nano-FETs is illustrated. FIGS. 23A, 24A, 25A, 26A, 27A, 28A, 29A, and 30A are three-dimensional views showing a similar three-dimensional view as FIG. 1, except two gate structures and two fins are shown. FIGS. 23B, 24B, 25B, 26B, 27B, 28B, 29B, 30B, and 31 are cross-sectional views illustrated along reference cross-section A-A in FIG. 1. FIGS. 23A, 24A, 25A, 26A, 27A, 28A, 29A, and 30A are simplified three-dimensional views, and do not show all of the features of corresponding FIGS. 23B, 24B, 25B, 26B, 27B, 28B, 29B, and 30B. FIGS. 23B, 24B, 25B, 26B, 27B, 28B, 29B, 30B, and 31 may be applicable to both the n-type region 50N and the p-type region 50P. Differences (if any) in the structures of the n-type region 50N and the p-type region 50P are described in the text accompanying each figure.

Figure 23A:
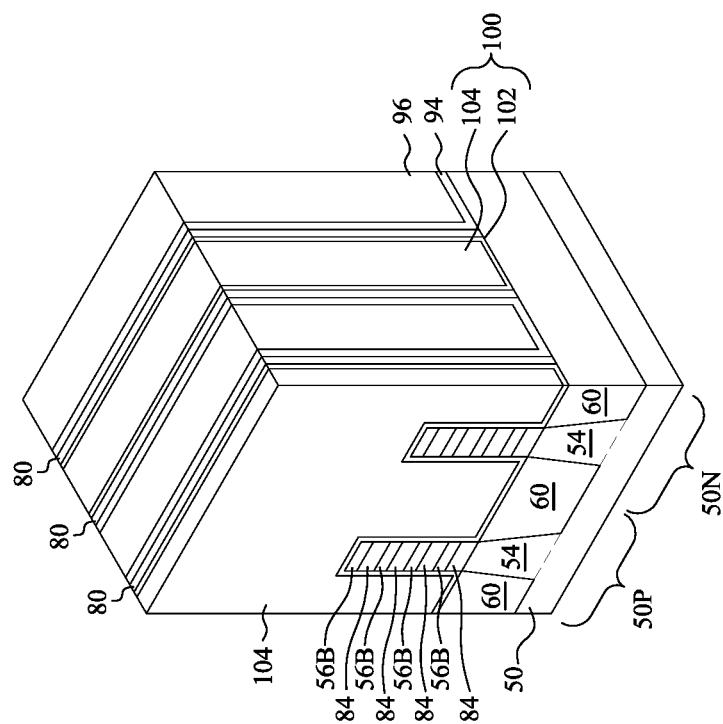
FIGS. 23A through 31 are various views of intermediate stages in the manufacturing of semiconductor devices, in accordance with some other embodiments.
Figure 23B:
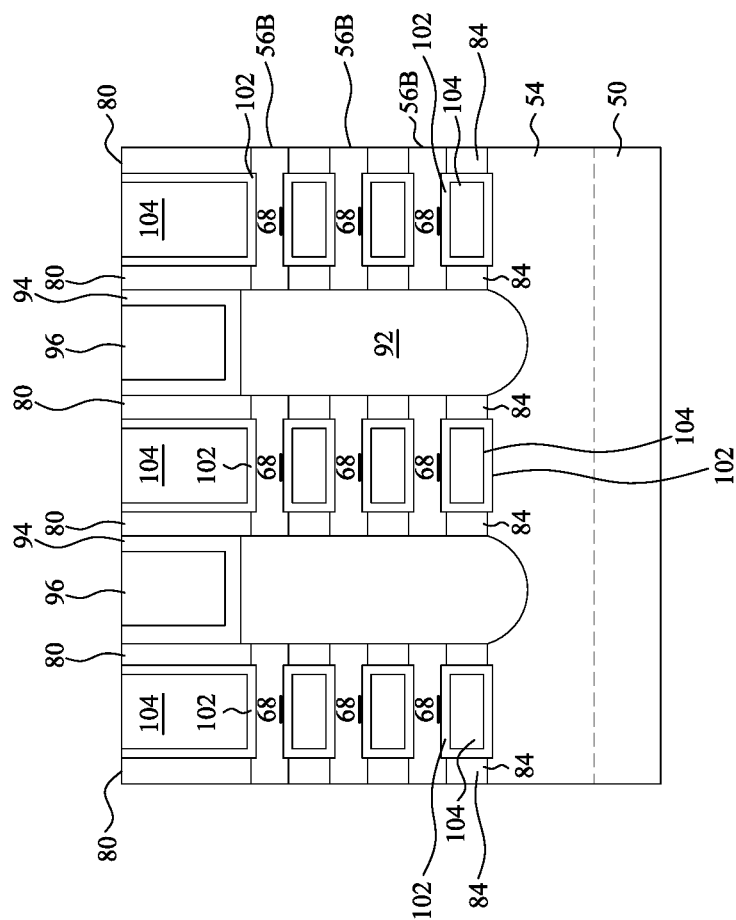

In FIGS. 23A and 23B, a structure similar to that described with respect to FIGS. 10A and 10B is obtained.

Figure 24A:
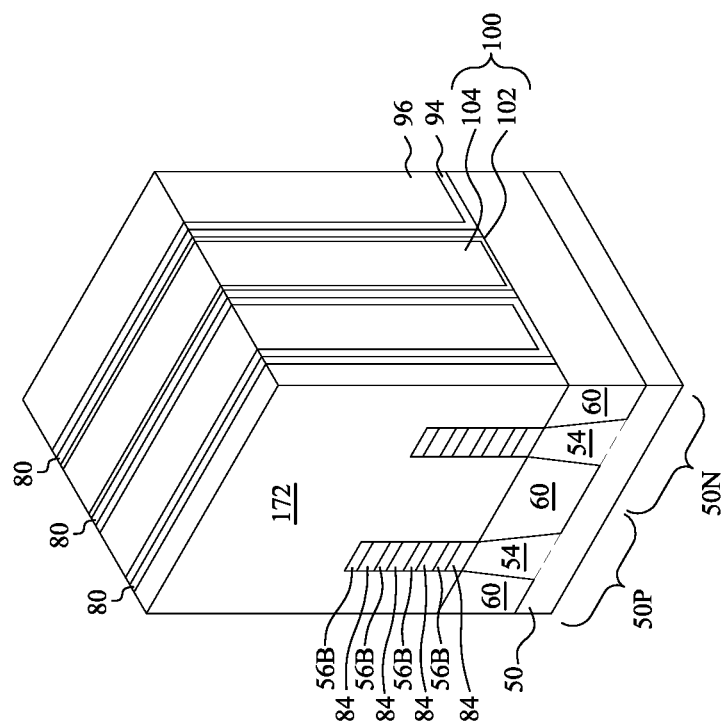
Figure 24B:
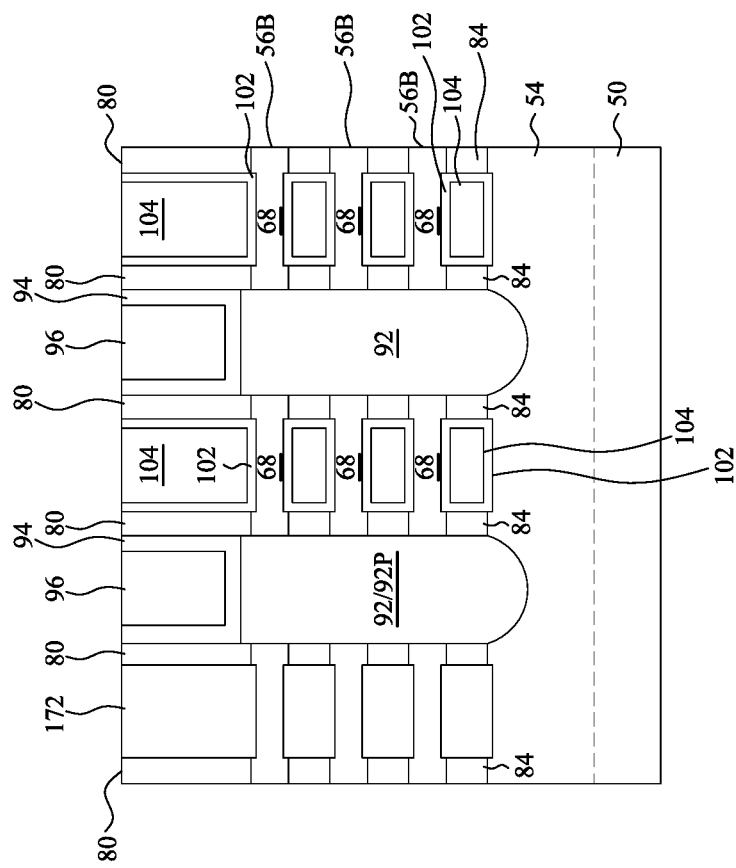

In FIGS. 24A and 24B, one or more gate structures 100 are removed and replaced with dielectric features 172. In some embodiments, the replaced gate structures 100 are those gate structures 100 at the end of a memory cell, such as the gate structures 100 at the ends of the fins 54. The replaced gate structures 100 are adjacent epitaxial source/drain regions 92P that will be connected to power rails. The desired gate structures 100 may be removed with acceptable photolithography and etching techniques to form openings. The dielectric features 172 are then formed in the openings. The dielectric features 172 can be formed of a dielectric material, such as silicon oxide, silicon nitride, or the like. The dielectric features 172 may be formed by depositing the dielectric material over the remaining gate structures 100, and subsequently planarizing the dielectric material so that top surfaces of the dielectric features 172 and the remaining gate structures 100 are coplanar (within process variations). The dielectric features 172 thus surround the second nanostructures 56B that were surrounded by the replaced gate structures 100.

Figure 25A:
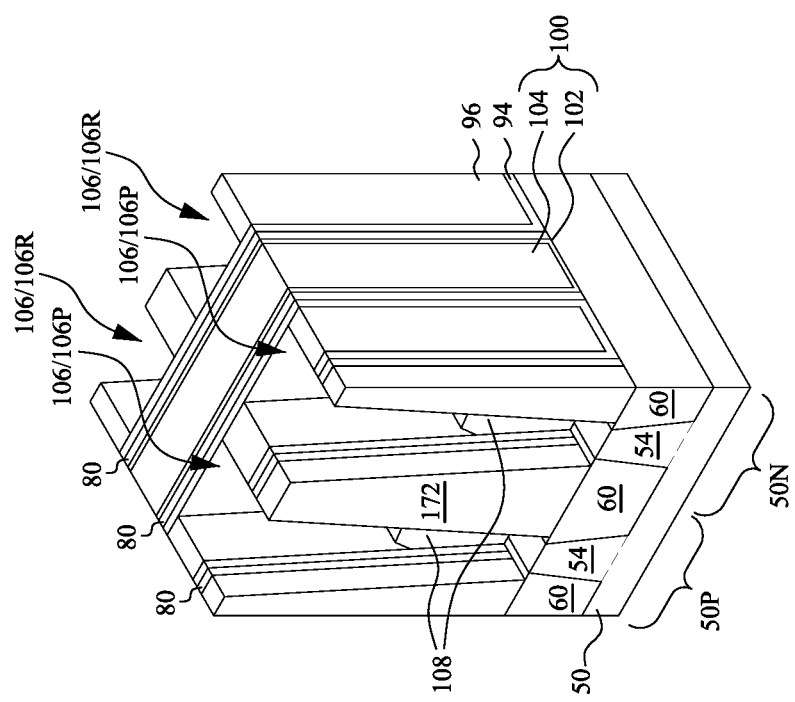
Figure 25B:
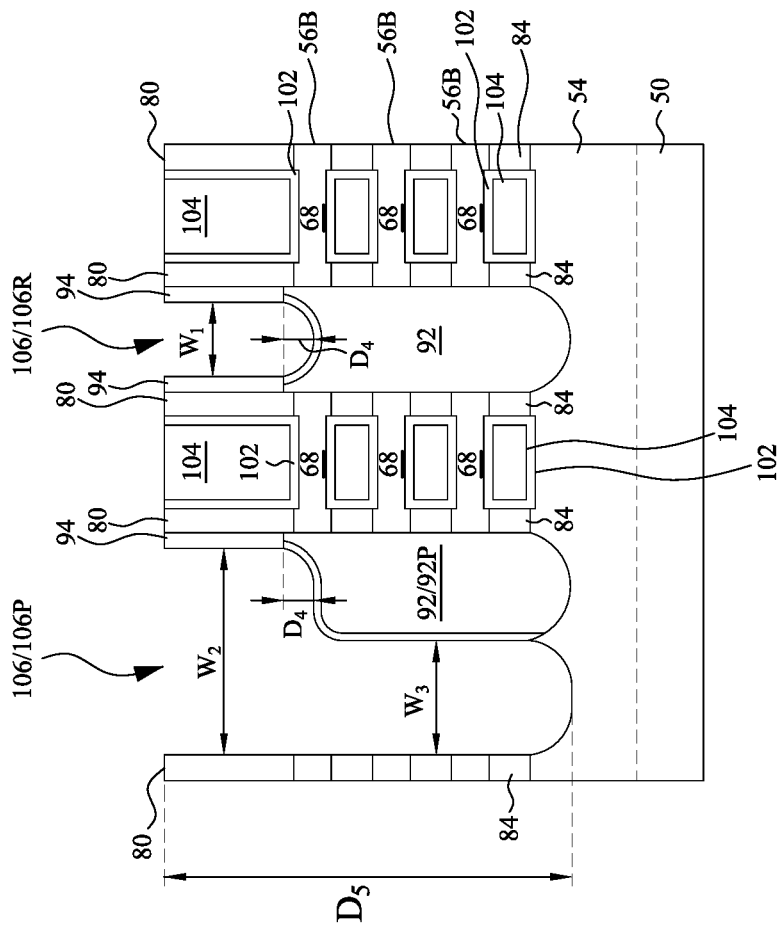

In FIGS. 25A and 25B, source/drain contact openings 106 are formed through the first ILD 96 and the CESL 94. In this embodiment, a first subset of the source/drain contact openings 106P (e.g., those that will be used to form power rail vias) are also formed through the dielectric features 172, the inner spacers 84, the gate spacers 80, and the second nanostructures 56B to expose sidewalls of the epitaxial source/drain regions 92P. A second subset of the source/drain contact openings 106R (e.g., those not used to form power rail vias) do not extend through the dielectric features 172, the inner spacers 84, the gate spacers 80, or the second nanostructures 56B.

The source/drain contact openings 106R, 106P may be formed by multiple photolithography and etching techniques. The source/drain contact openings 106R, 106P may be initially formed in the first ILD 96 using acceptable photolithography and etching techniques, such as with an etching process that is selective to the first ILD 96 (e.g., etches the material of the first ILD 96 at a faster rate than the material of the CESL 94). For example, the source/drain contact openings 106R, 106P may be initially formed through the first ILD 96 by a dry etch using ammonia ($NH_3$) and hydrogen fluoride (HF) gas. The source/drain contact openings 106R, 106P are then extended through the CESL 94 using acceptable photolithography and etching techniques, such as with an etching process that is selective to the CESL 94 (e.g., etches the material of the CESL 94 at a faster rate than the material of the epitaxial source/drain regions 92). For example, the source/drain contact openings 106R, 106P may be extended through the CESL 94 by a dry etch using a fluorine-based gas (e.g., $C_4F_6$) and hydrogen ($H_2$) or oxygen ($O_2$) gas. The source/drain contact openings 106R are then masked, such as by forming a photoresist over the source/drain contact openings 106R. The source/drain contact openings 106P are then extended through the dielectric features 172, the inner spacers 84, the gate spacers 80, and the second nanostructures 56B using acceptable photolithography and etching techniques, such as with an etching process that is selective to the dielectric features 172, the inner spacers 84, the gate spacers 80, and the second nanostructures 56B (e.g., etches the materials of the dielectric features 172, the inner spacers 84, the gate spacers 80, and the second nanostructures 56B at a faster rate than the material of the epitaxial source/drain regions 92). For example, the source/drain contact openings 106P may be extended through the dielectric features 172, the inner spacers 84, the gate spacers 80, and the second nanostructures 56B by a dry etch using a fluorine-based gas (e.g., $C_4F_6$) and hydrogen ($H_2$) or oxygen ($O_2$) gas. The source/drain contact openings 106P may not extend into the fins 54, as shown by FIG. 25A, or can also be formed to extend into the fins 54, as shown by FIG. 25B.

After formation, the source/drain contact openings 106R, 106P extend partially into the epitaxial source/drain regions 92, such as into the upper portions of the epitaxial source/drain regions 92, by a distance $D_4$. In some embodiments, the distance $D_4$ is less than about half of the height $H_1$ (see FIG. 7B) of the epitaxial source/drain regions 92. Timed etch processes may be used to stop the etching of the source/drain contact openings 106R, 106P after the source/drain contact openings 106R, 106P extend into the upper portions of the epitaxial source/drain regions 92 by a desired distance $D_4$. For example, when the etchants described above are used to etch the epitaxial source/drain regions 92, the etching may be performed for a duration in the range of about 10 seconds to about 40 seconds, which can cause the source/drain contact openings 136 to extend into the upper portions of the epitaxial source/drain regions 92P by a distance $D_4$ in the range of about 2 nm to about 10 nm. The source/drain contact openings 106R can be formed to a width $W_1$, which can be in the range of about 10 nm to about 30 nm.

After they are extended, the source/drain contact openings 106P extend into the intermediate structure by a distance $D_5$. In some embodiments, the distance $D_5$ is greater than the height $H_1$ of the epitaxial source/drain regions 92. Timed etch processes may be used to stop the etching of the source/drain contact openings 106P after the source/drain contact openings 106P extend into the intermediate structure by a desired distance $D_5$. For example, when the etchants described above are used to etch the dielectric features 172, the inner spacers 84, the gate spacers 80, and the second nanostructures 56B, the etching may be performed for a duration in the range of about 140 seconds to about 400 seconds, which can cause the source/drain contact openings 136P to extend into the intermediate structure by a distance $D_5$ in the range of about 40 nm to about 120 nm. The upper portion of the source/drain contact openings 106R (e.g., those portions over the epitaxial source/drain regions 92P) can also be expanded to a width $W_2$, which can be in the range of about 10 nm to about 50 nm, and is greater than the width $W_1$. The lower portion of the source/drain contact openings 106R (e.g., those portions adjacent to the epitaxial source/drain regions 92P) can be formed to a width $W_3$, which can be in the range of about 10 nm to about 30 nm, and is less than the width $W_2$.

Metal-semiconductor alloy regions 108 are then formed in the source/drain contact openings 106, such as on portions of the epitaxial source/drain regions 92 exposed by the source/drain contact openings 106. In this embodiment, the metal-semiconductor alloy regions 108 extend along the exposed sidewalls of the epitaxial source/drain regions 92P. The metal-semiconductor alloy regions 108 can be formed in a similar manner as that described with respect to FIGS. 11A and 11B.

Figure 26A:
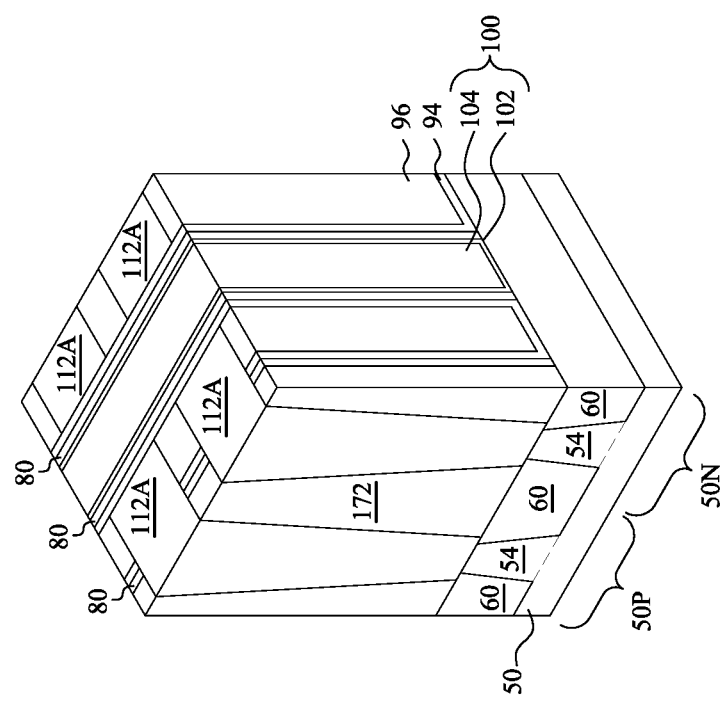
Figure 26B:
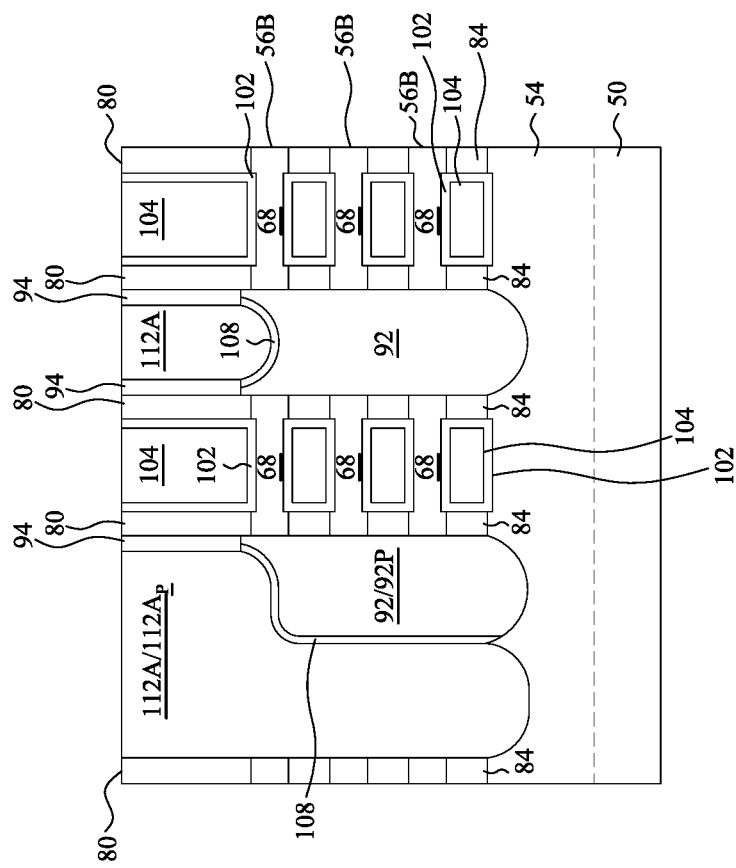

In FIGS. 26A and 26B, first source/drain contacts 112A are formed in the source/drain contact openings 106. The first source/drain contacts 112A can be formed in a similar manner as that described with respect to FIGS. 12A and 12B. In this embodiment, a subset of the first source/drain contacts 112A$_P$, such as those formed in the source/drain contact openings 106P, extend along and contact the sidewalls and the top surfaces of the epitaxial source/drain regions 92P.

After formation, the first source/drain contacts 112A have similar dimensions as the source/drain contact openings 106. The first source/drain contacts 112A extend into the upper portions of the epitaxial source/drain regions 92 by the distance $D_4$ (see FIG. 25B), and portions of the first source/drain contacts 112A over the epitaxial source/drain regions 92 have a height in the range of about 2 nm to about 10 nm.

Figure 27A:
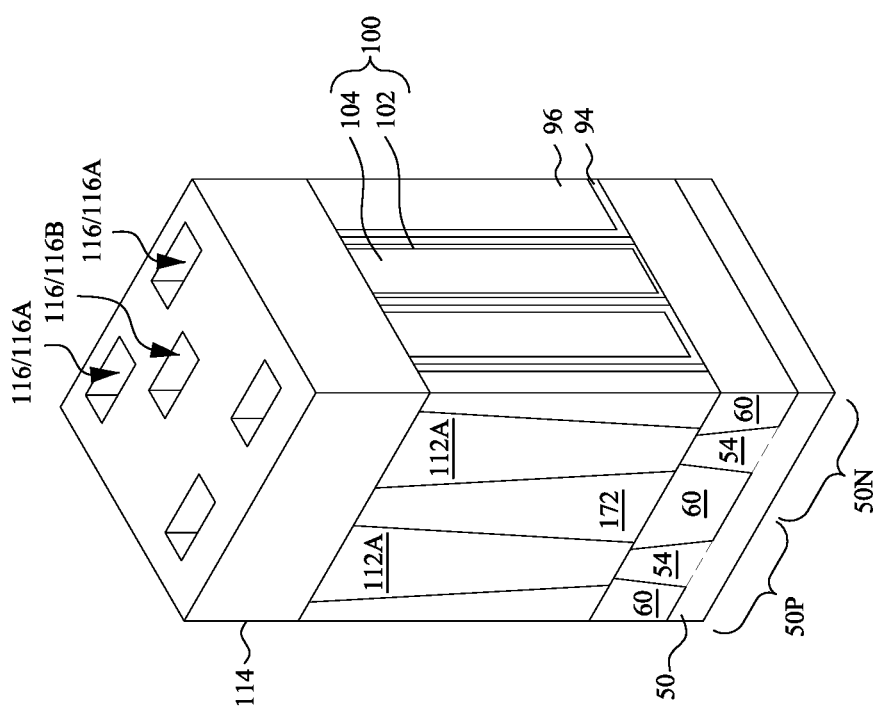
Figure 27B:
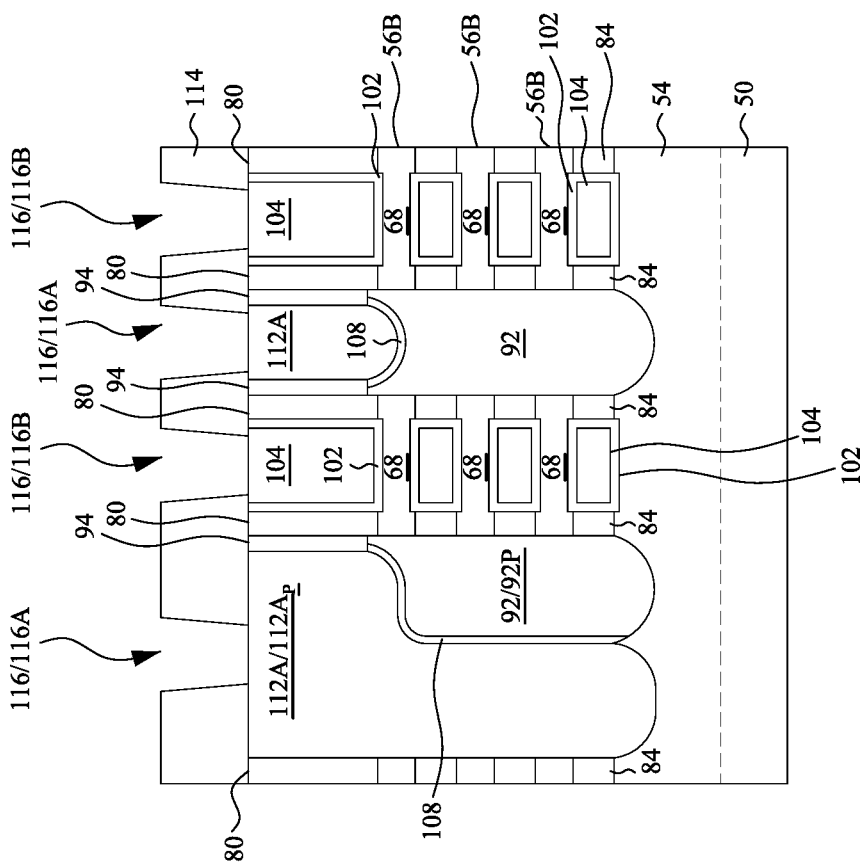

In FIGS. 27A and 27B, a second ILD 114 is deposited over the first ILD 96, the gate electrodes 104, and the first source/drain contacts 112A. Contact openings 116 are then formed in the second ILD 114. The second ILD 114 and the contact openings 116 can be formed in a similar manner as that described with respect to FIGS. 13A and 13B.

Figure 28A:
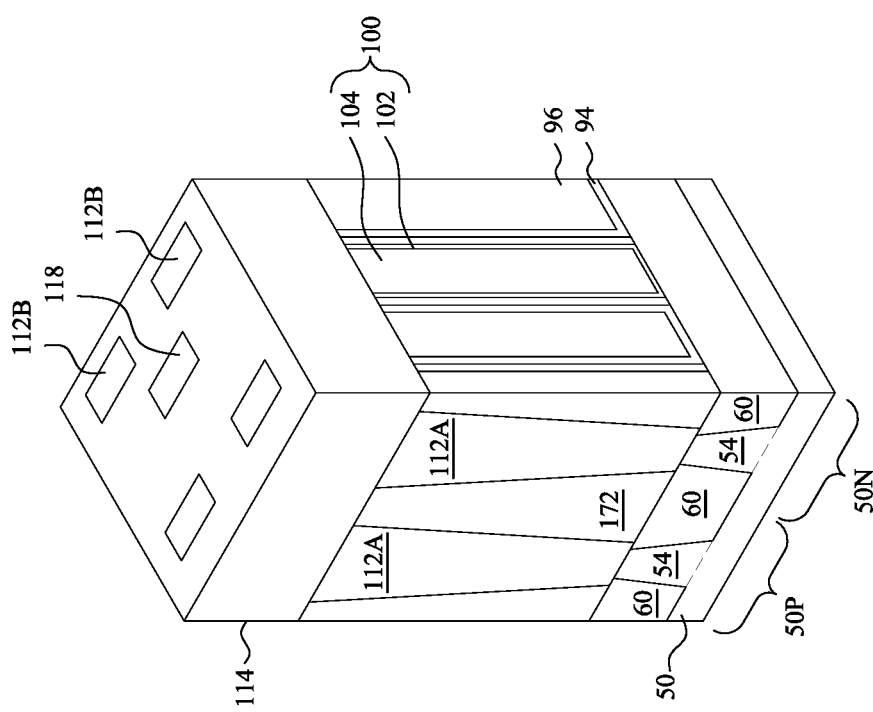
Figure 28B:
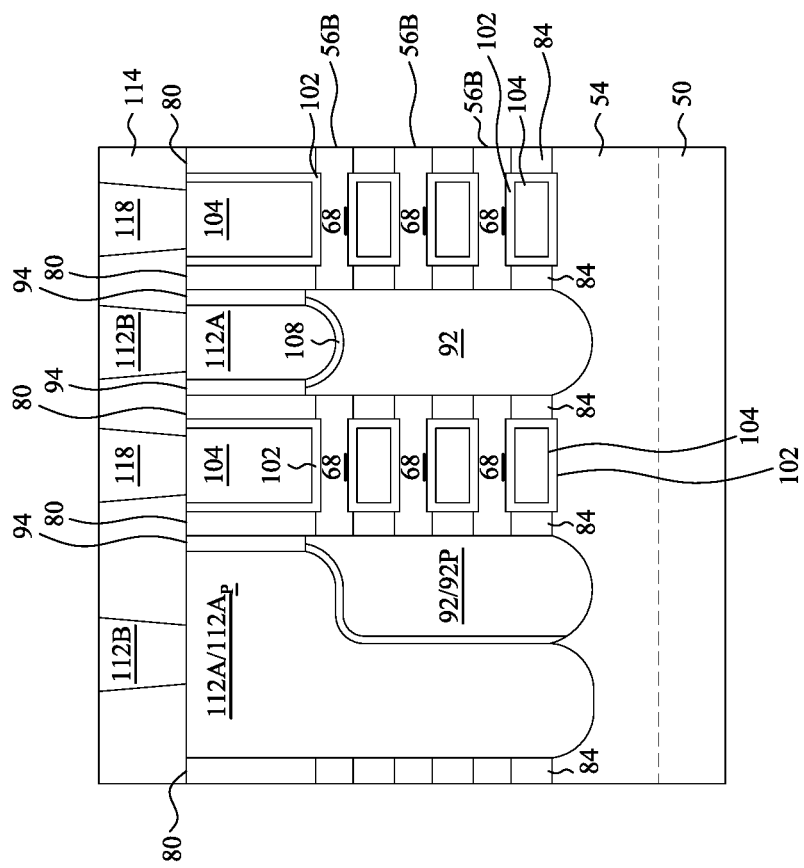

In FIGS. 28A and 28B, second source/drain contacts 112B and gate contacts 118 are formed extending through the second ILD 114. The second source/drain contacts 112B and the gate contacts 118 can be formed in a similar manner as that described with respect to FIGS. 14A and 14B. As noted above, the second source/drain contacts 112B and the gate contacts 118 may be formed in the same cross-sections, as shown by FIGS. 27B and 28B, or may be formed in different cross-sections, as shown by FIGS. 27A and 28A.

Figure 29A:
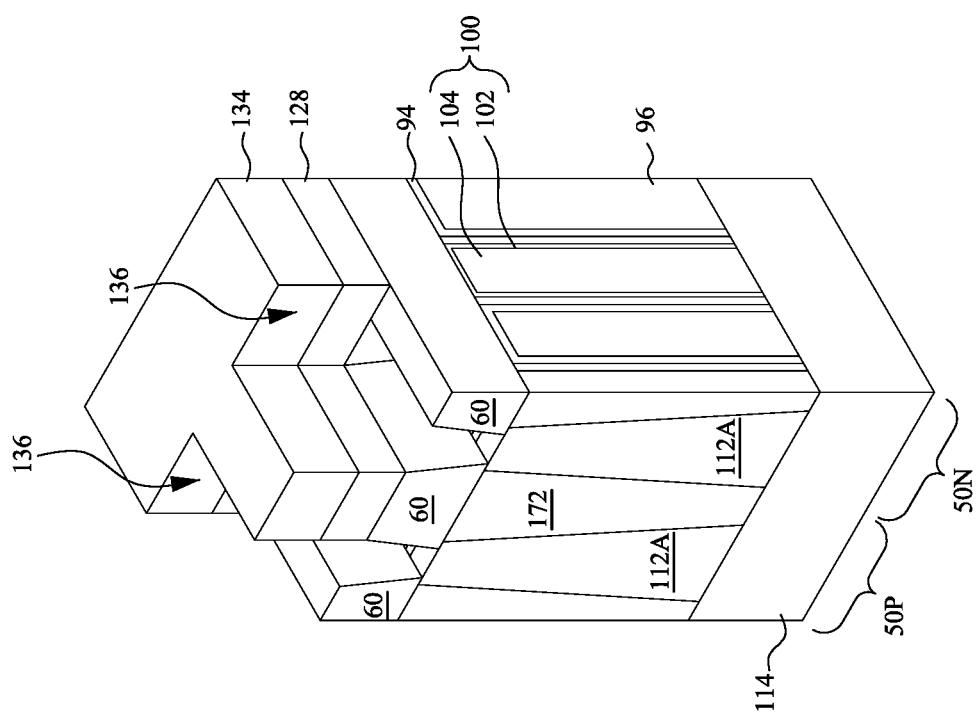
Figure 29B:
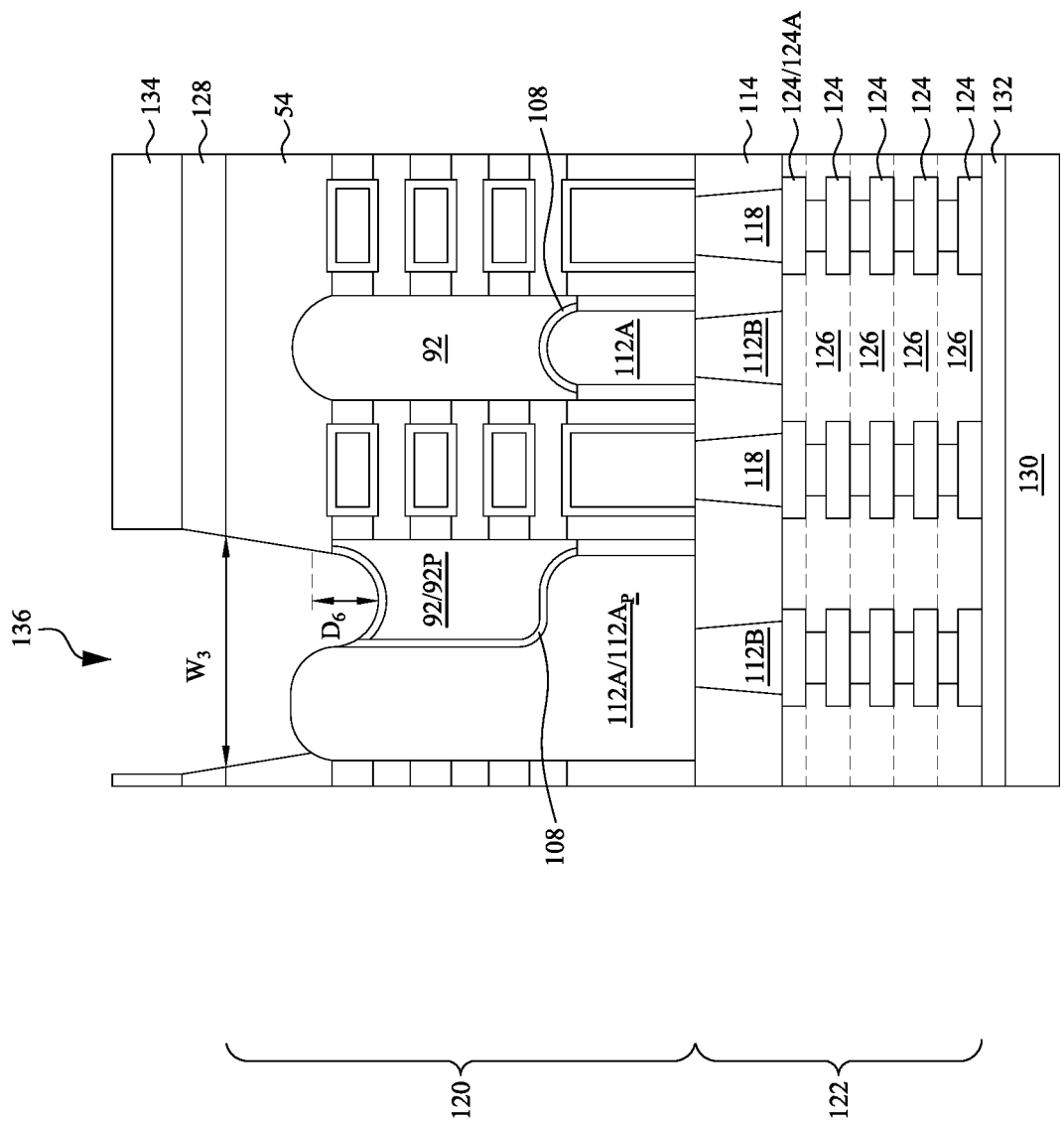

In FIGS. 29A and 29B, the intermediate structure may be processed in a similar manner as that described with respect to FIGS. 15 through 17. For example, an interconnect structure 122 can be formed, the structure can be flipped, and the substrate 50 can be replaced with a dielectric layer 128. Source/drain contact openings 136 are then formed through the dielectric layer 128 and the fins 54. The source/drain contact openings 136 can also extend into the lower portions of the epitaxial source/drain regions 92P. The source/drain contact openings 136 can be formed in a similar manner as that described with respect to FIGS. 18A and 18B, e.g., by using a mask 134 as an etching mask. In this embodiment, the source/drain contact openings 136 are not formed through the epitaxial source/drain regions 92P, but only extend partially into the lower portions of the epitaxial source/drain regions 92P. Timed etch processes may be used to stop the etching of the source/drain contact openings 136 after the source/drain contact openings 136 extend into the lower portions of the epitaxial source/drain regions 92P by the desired distance $D_6$. For example, when the etchants described with respect to FIGS. 18A and 18B are used to etch the source/drain contact openings 136, the etching may be performed for a duration in the range of about 90 seconds to about 240 seconds, which can cause the source/drain contact openings 136 to extend into the lower portions of the epitaxial source/drain regions 92P by a distance $D_6$ in the range of about 2 nm to about 10 nm. The source/drain contact openings 136 can be formed to a width $W_3$, which can be in the range of about 10 nm to about 50 nm.

Figure 30A:
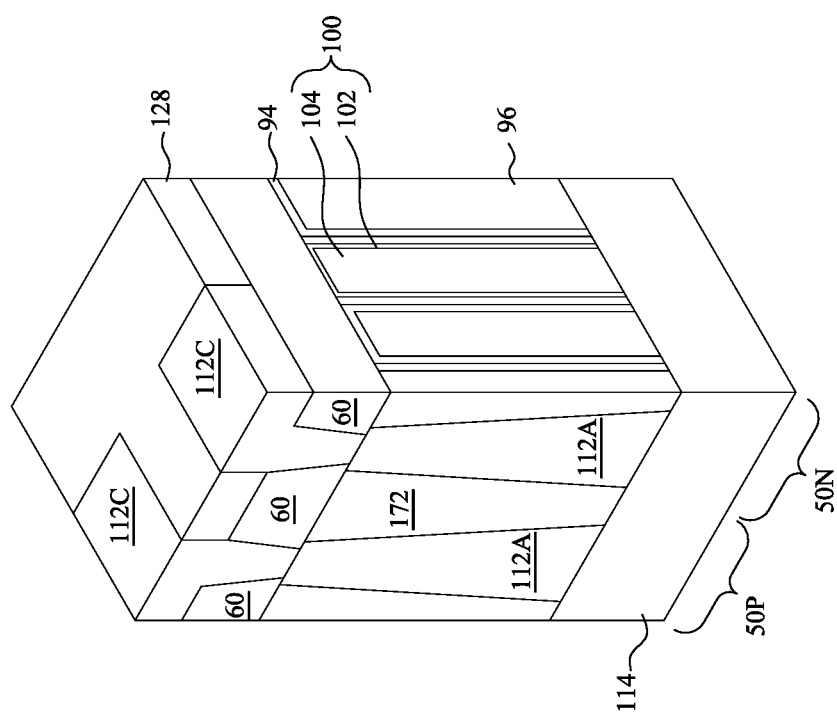
Figure 30B:
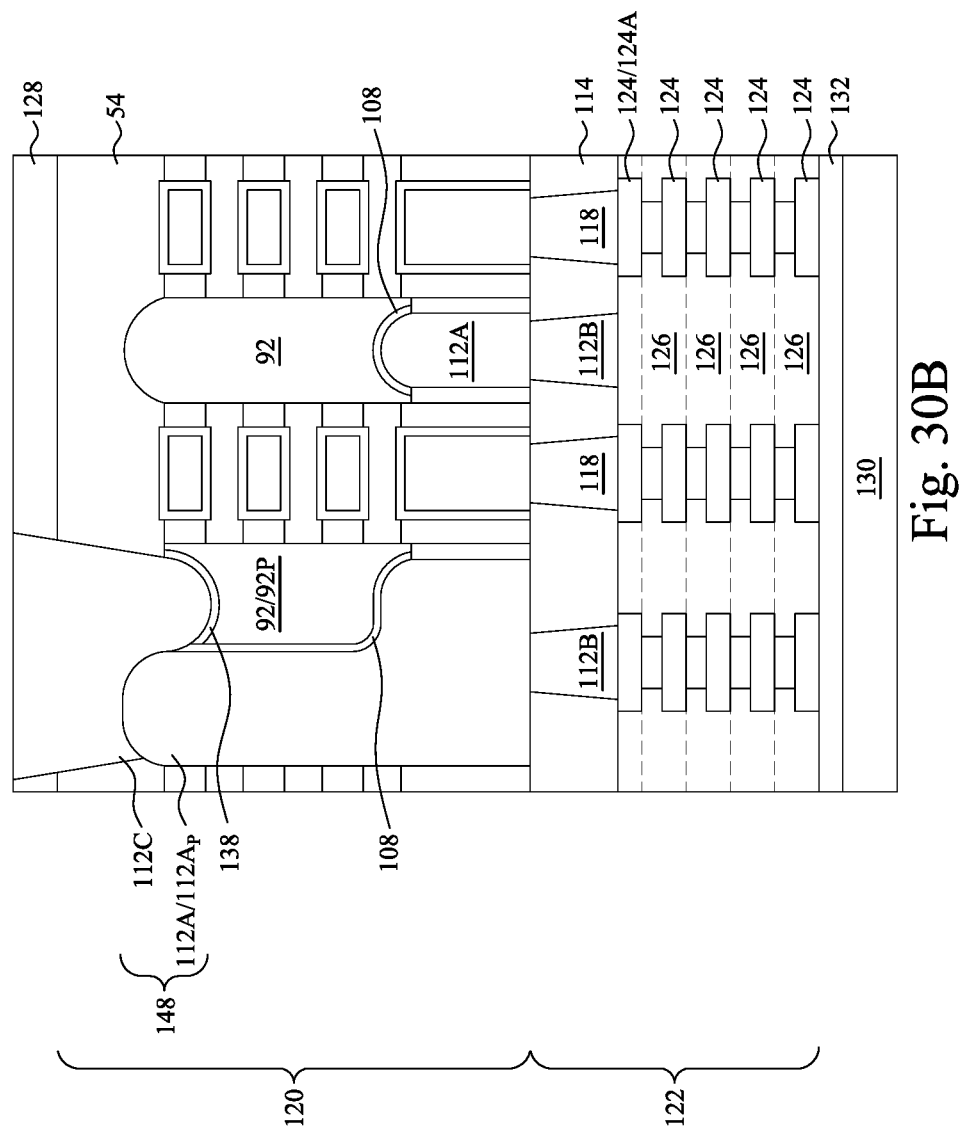

In FIGS. 30A and 30B, metal-semiconductor alloy regions 138 are formed in the source/drain contact openings 136, such as on portions of the epitaxial source/drain regions 92P exposed by the source/drain contact openings 136. The metal-semiconductor alloy regions 138 can be formed in a similar manner as that described with respect to FIGS. 19A and 19B. In some embodiment, the metal-semiconductor alloy regions 138 are curved layers that are physically coupled to the portions of the metal-semiconductor alloy regions 108 that extend along the sidewalls of the epitaxial source/drain regions 92P. Although the metal-semiconductor alloy regions 108, 138 are shown as separate regions, it should be appreciated that in some embodiments, the metal-semiconductor alloy regions 108, 138 may merge during formation so that no distinguishable interface exists between them.

Third source/drain contacts 112C are then formed in the source/drain contact openings 136. The third source/drain contacts 112C can be formed in a similar manner as that described with respect to FIGS. 19A and 19B. In this embodiment, the third source/drain contacts 112C have portions on the first source/drain contacts 112$A_P$, and portions that extend into the lower portions of the epitaxial source/drain regions 92P. The third source/drain contacts 112C thus extend along and contact the bottom surfaces of the epitaxial source/drain regions 92P. After formation, the third source/drain contacts 112C have similar dimensions as the source/drain contact openings 136. The first source/drain contacts 112$A_P$ and the third source/drain contacts 112C form conductive vias 148, which may be referred to as power rail vias. In this embodiment, the metal-semiconductor alloy regions 108, 138 are disposed between each conductive via 148 and each of the top surface, the sidewall, and the bottom surface of the respective epitaxial source/drain region 92P.

Figure 31:
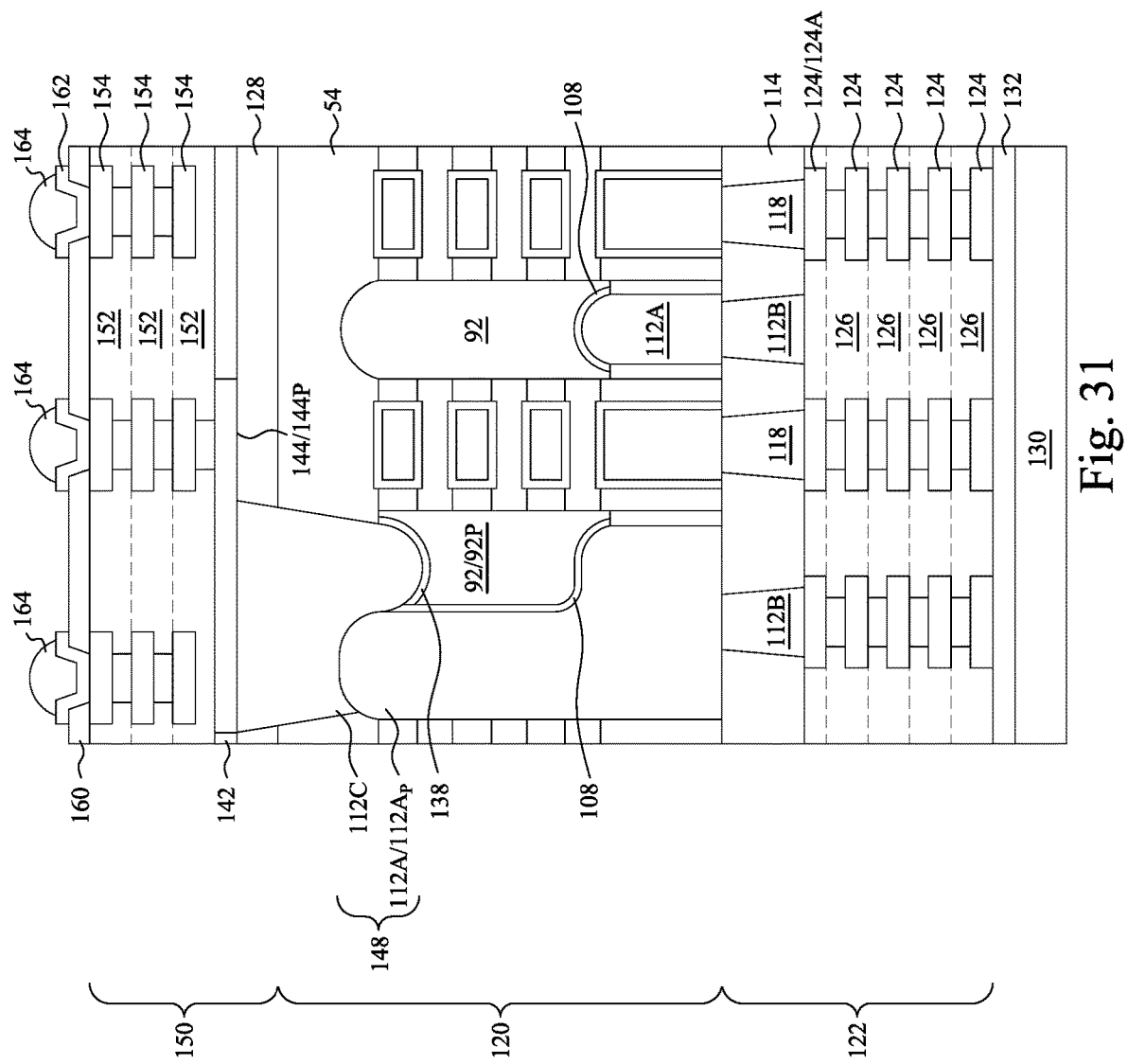

In FIG. 31, remaining portions of an interconnect structure 150 are formed at the back-side of the device layer 120. The remaining portions of the interconnect structure 150 may be formed in a similar manner as that described with respect to FIGS. 20 and 21. The interconnect structure 150 includes power rails 144P, which are connected to the conductive vias 148.

A passivation layer 160, UBMs 162, and external connectors 164 are then formed over the interconnect structure 150. The passivation layer 160, the UBMs 162, and the external connectors 164 can be formed in a similar manner as that described with respect to FIG. 22.

FIGS. 32A through 40 are various views of intermediate stages in the manufacturing of semiconductor devices, in accordance with some other embodiments. Specifically, the manufacturing of front-side and back-side interconnect structures for nano-FETs is illustrated. FIGS. 32A, 33A, 34A, 35A, 36A, 37A, 38A, and 39A are three-dimensional views showing a similar three-dimensional view as FIG. 1, except two gate structures and two fins are shown. FIGS. 32B, 33B, 34B, 35B, 36B, 37B, 38B, 39B, and 40 are cross-sectional views illustrated along reference cross-section A-A in FIG. 1. FIGS. 32A, 33A, 34A, 35A, 36A, 37A, 38A, and 39A are simplified three-dimensional views, and do not show all of the features of corresponding FIGS. 32B, 33B, 34B, 35B, 36B, 37B, 38B, and 39B. FIGS. 32B, 33B, 34B, 35B, 36B, 37B, 38B, 39B, and 40 may be applicable to both the n-type region 50N and the p-type region 50P. Differences (if any) in the structures of the n-type region 50N and the p-type region 50P are described in the text accompanying each figure.

Figure 32A:
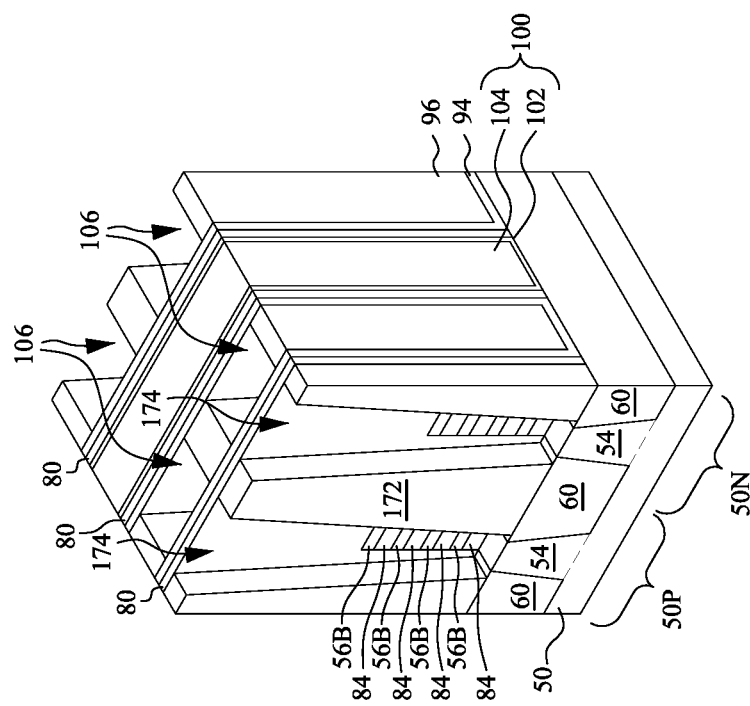
FIGS. 32A through 40 are various views of intermediate stages in the manufacturing of semiconductor devices, in accordance with some other embodiments.
Figure 32B:
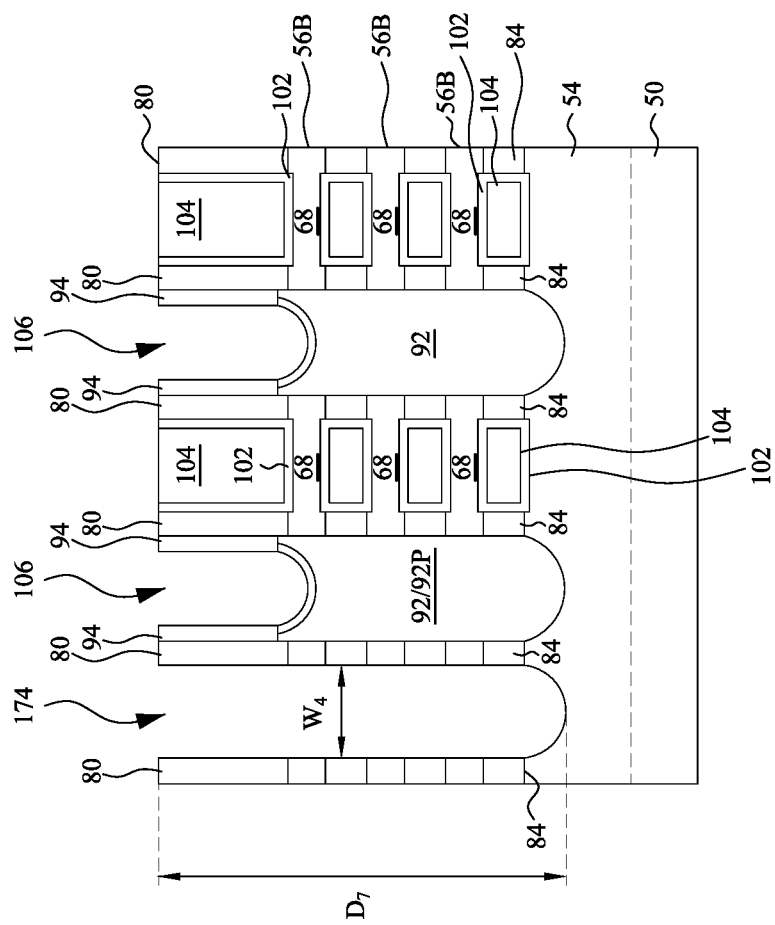

In FIGS. 32A and 32B, a structure similar to that described with respect to FIGS. 24A and 24B is obtained. Source/drain contact openings 106 are then formed through the first ILD 96 and the CESL 94. The source/drain contact openings 106 may be initially formed in the first ILD 96 using acceptable photolithography and etching techniques, such as with an etching process that is selective to the first ILD 96 (e.g., etches the material of the first ILD 96 at a faster rate than the material of the CESL 94). For example, the source/drain contact openings 106 may be initially formed through the first ILD 96 by a dry etch using ammonia ($NH_3$) and hydrogen fluoride (HF) gas. The source/drain contact openings 106 are then extended through the CESL 94 using acceptable photolithography and etching techniques, such as with an etching process that is selective to the CESL 94 (e.g., etches the material of the CESL 94 at a faster rate than the material of the epitaxial source/drain regions 92). For example, the source/drain contact openings 106 may be extended through the CESL 94 by a dry etch using a fluorine-based gas (e.g., $C_4F_6$) and hydrogen ($H_2$) or oxygen ($O_2$) gas.

Power rail via openings 174 are then formed through the dielectric features 172 and the second nanostructures 56B. The power rail via openings 174 may be formed using acceptable photolithography and etching techniques, such as with an etching process that is selective to the dielectric features 172 and the second nanostructures 56B (e.g., etches the materials of the dielectric features 172 and the second nanostructures 56B at a faster rate than the material of the epitaxial source/drain regions 92). For example, the power rail via openings 174 may be extended through the dielectric features 172 and the second nanostructures 56B by a dry etch using a fluorine-based gas (e.g., $C_4F_6$) and hydrogen ($H_2$) or oxygen ($O_2$) gas. The power rail via openings 174 may not extend into the fins 54, as shown by FIG. 32A, or can also be formed to extend into the fins 54, as shown by FIG. 32B.

After they are formed, the power rail via openings 174 extend into the intermediate structure by a distance $D_7$. In some embodiments, the distance $D_7$ is greater than the height $H_1$ (see FIG. 7B) of the epitaxial source/drain regions 92. Timed etch processes may be used to stop the etching of the power rail via openings 174 after the power rail via openings 174 extend into the intermediate structure by a desired distance $D_7$. For example, when the etchants described above are used to etch the dielectric features 172 and the second nanostructures 56B, the etching may be performed for a duration in the range of about 140 seconds to about 400 seconds, which can cause the source/drain contact openings 136 to extend into the intermediate structure by a distance $D_7$ in the range of about 40 nm to about 120 nm. The power rail via openings 174 can be formed to a width $W_4$, which can be in the range of about 10 nm to about 30 nm.

Figure 33A:
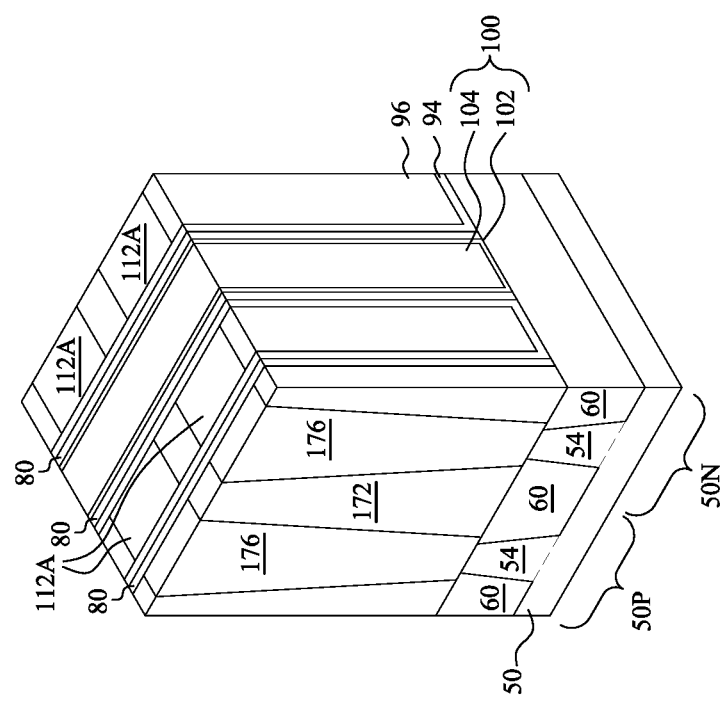
Figure 33B:
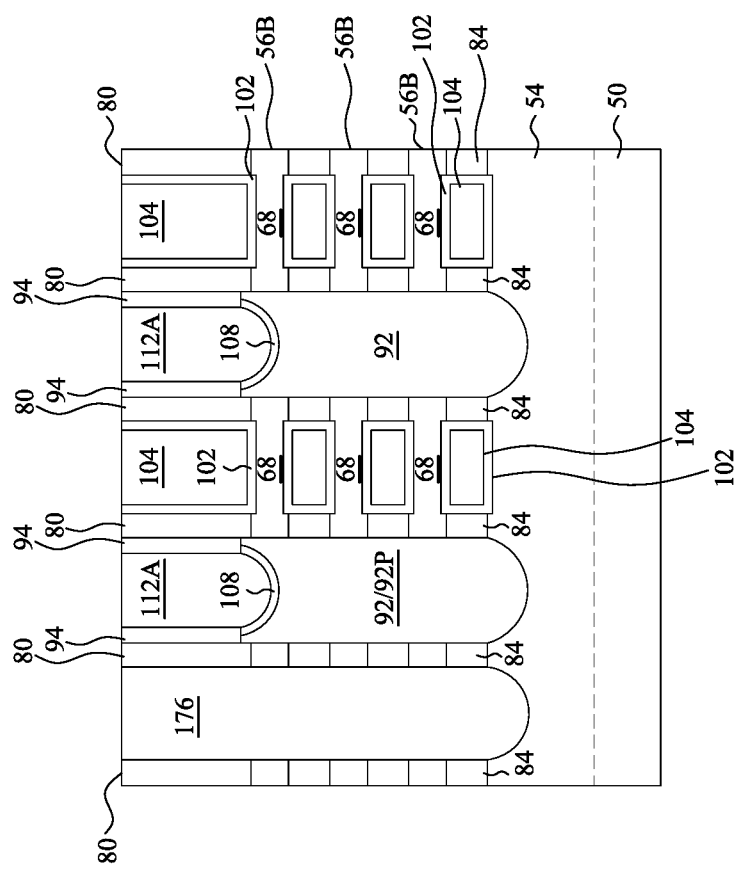

In FIGS. 33A and 33B, first source/drain contacts 112A are formed in the source/drain contact openings 106. The first source/drain contacts 112A can be formed in a similar manner as that described with respect to FIGS. 12A and 12B. Further, power rail contacts 176 are formed in the power rail via openings 174. The power rail contacts 176 can be formed in a similar manner as the first source/drain contacts 112A. The first source/drain contacts 112A and the power rail contacts 176 can be formed in the same process or in different processes. The power rail contacts 176 extend along but are physically separated from the sidewalls of the epitaxial source/drain regions 92P. The power rail contacts 176 extend through the dielectric features 172 and the second nanostructures 56B.

Figure 34A:
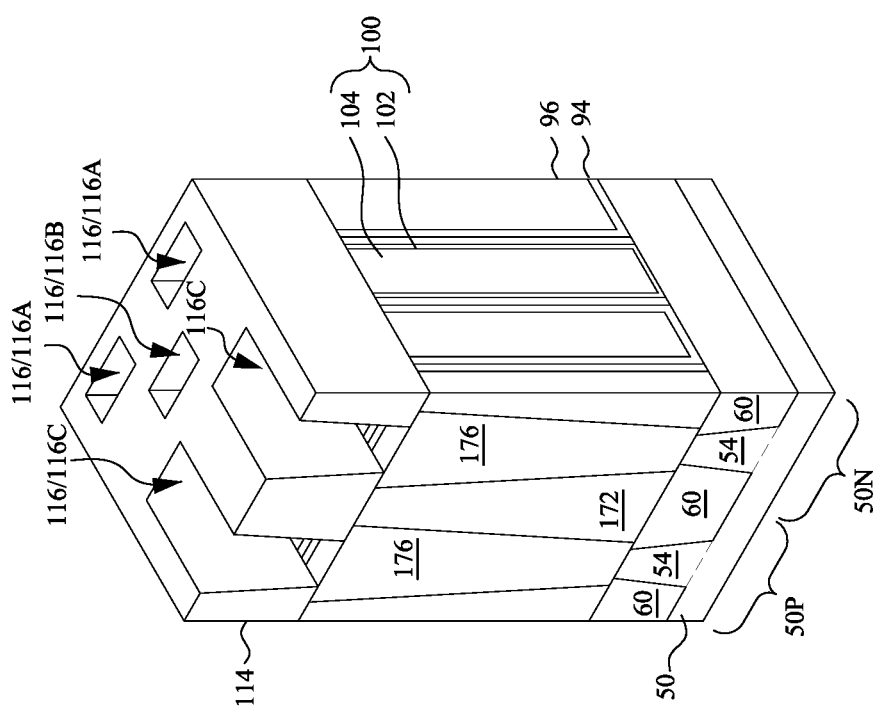
Figure 34B:
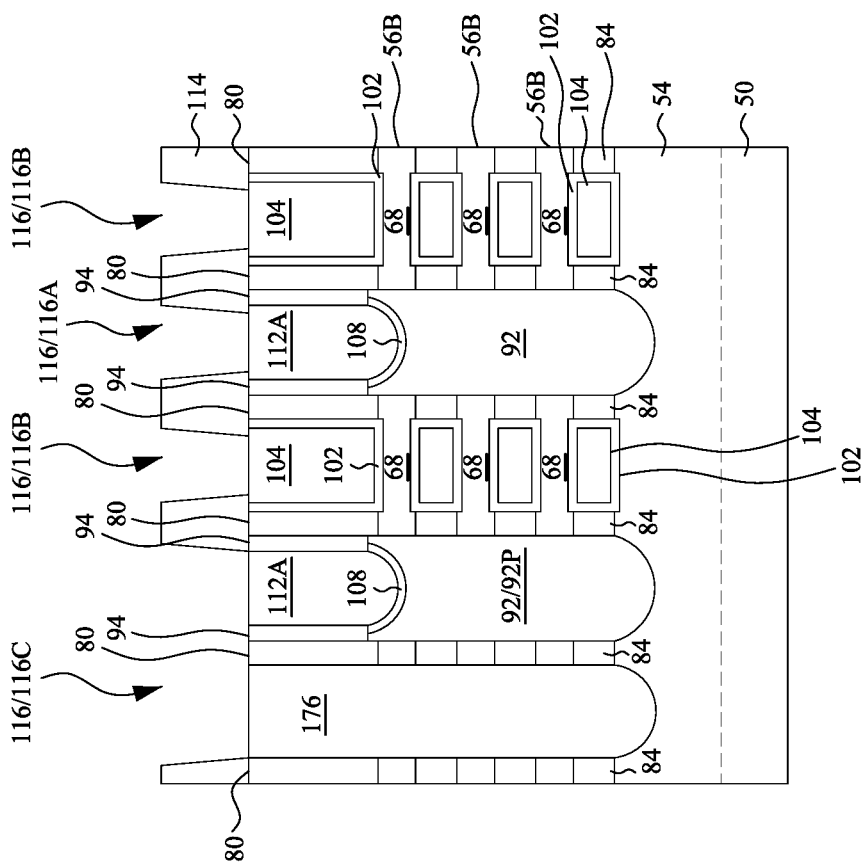

In FIGS. 34A and 34B, a second ILD 114 is deposited over the first ILD 96, the gate electrodes 104, the first source/drain contacts 112A, and the power rail contacts 176. Contact openings 116 are then formed in the second ILD 114. The second ILD 114 and the contact openings 116 can be formed in a similar manner as that described with respect to FIGS. 13A and 13B. In this embodiment, a third subset of the contact openings 116C expose both the power rail contacts 176 and the respective adjacent first source/drain contacts 112A.

Figure 35A:
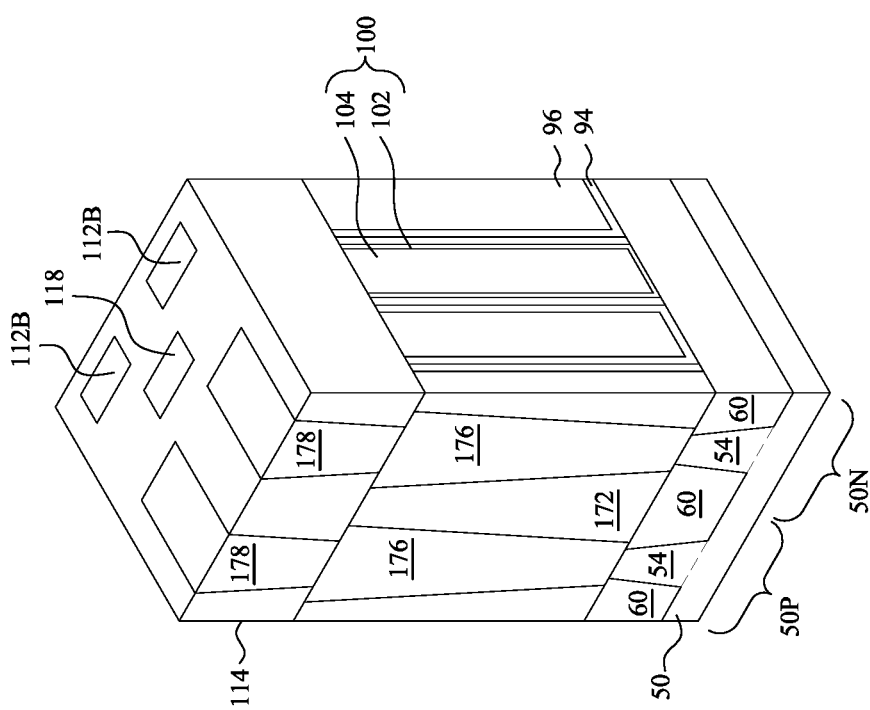
Figure 35B:
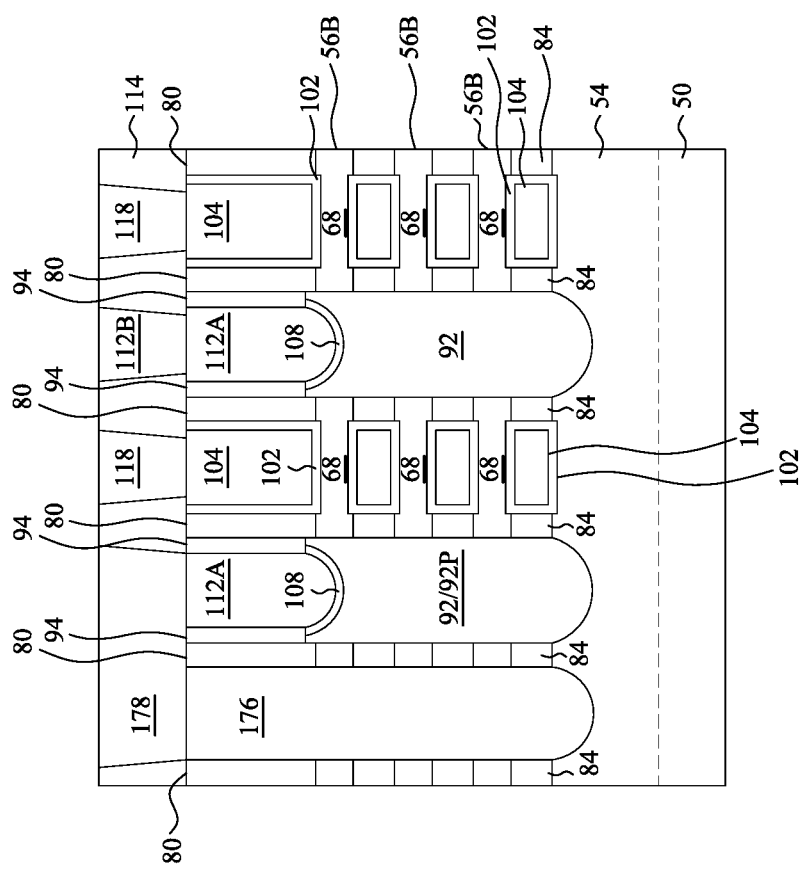

In FIGS. 35A and 35B, second source/drain contacts 112B, gate contacts 118, and shared contacts 178 are formed extending through the second ILD 114. The second source/drain contacts 112B and the gate contacts 118 can be formed in a similar manner as that described with respect to FIGS. 14A and 14B. The shared contacts 178 can be formed in a similar manner as the second source/drain contacts 112B and the gate contacts 118. The shared contacts 178 are each connected to a power rail contact 176 and a respective adjacent first source/drain contact 112A.

Figure 36A:
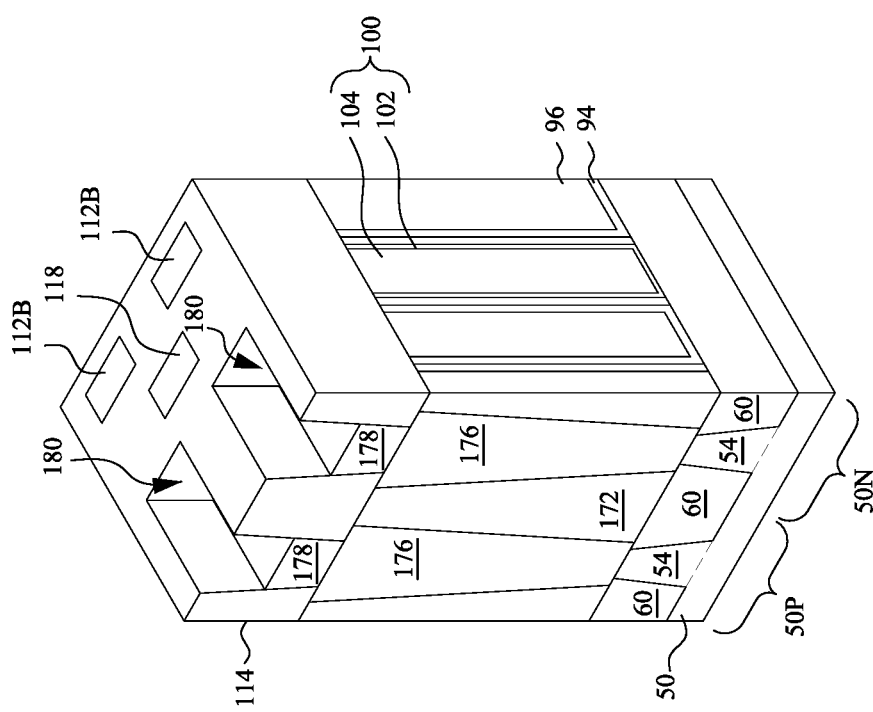
Figure 36B:
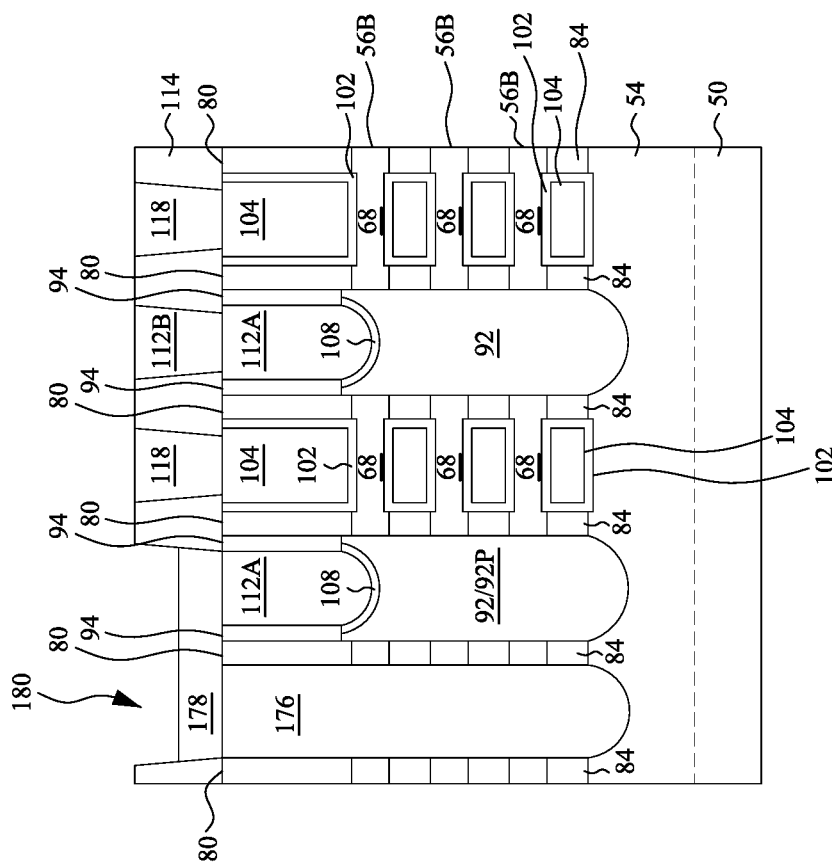

In FIGS. 36A and 36B, the shared contacts 178 are recessed to form openings 180 over the shared contacts 178. The remaining portions of the shared contacts 178 may thus be considered conductive lines. The shared contacts 178 may be recessed using acceptable photolithography and etching techniques, such as with an etch-back process that is selective to the shared contacts 178 (e.g., etches the material of the shared contacts 178 at a faster rate than the material of the second ILD 114).

Figure 37A:
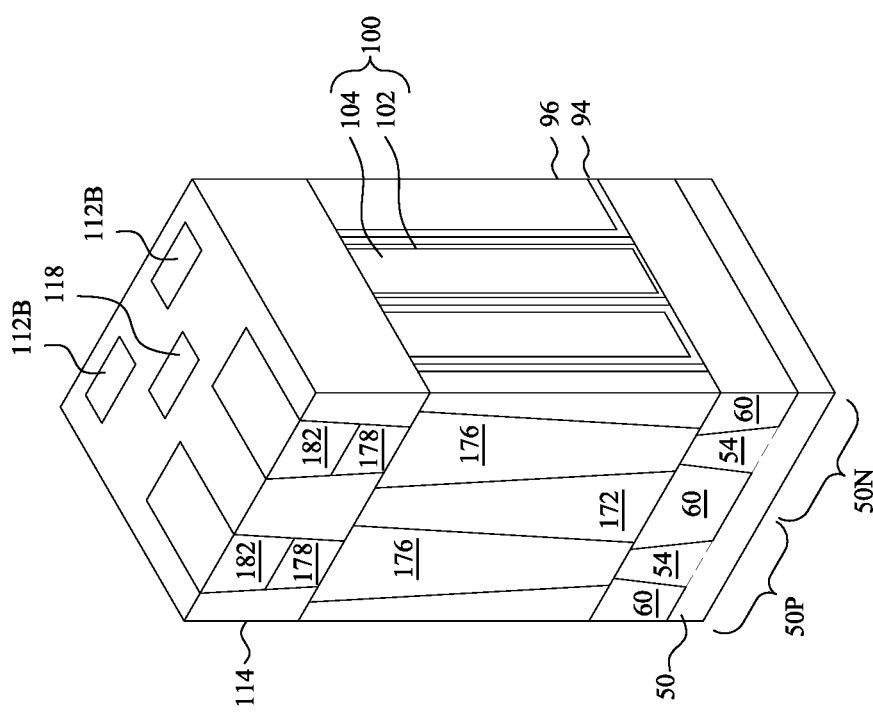
Figure 37B:
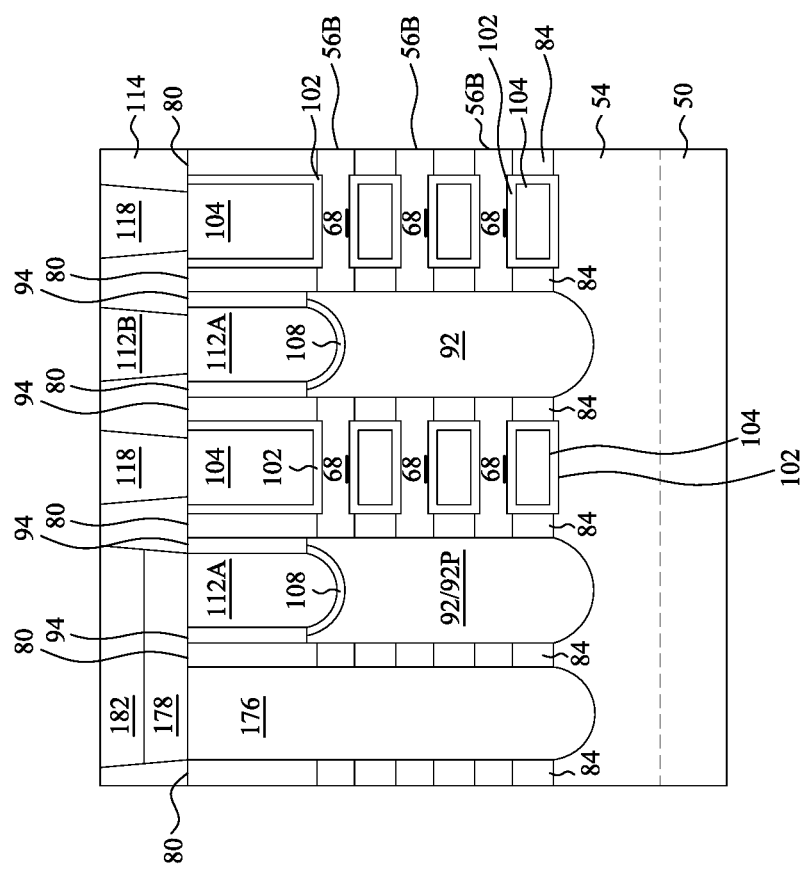

In FIGS. 37A and 37B, dielectric plugs 182 are formed in the openings 180. The dielectric plugs 182 may be formed of a material that is selected from the same group of candidate materials of the dielectric features 172, and may be deposited using a method that is selected from the same group of candidate methods for depositing the dielectric features 172. The dielectric features 172 and the dielectric plugs 182 may be formed from the same material, or may include different materials. Forming the dielectric plugs 182 allows the shared contacts 178 to be electrically isolated and protected during subsequent processing.

Figure 38A:
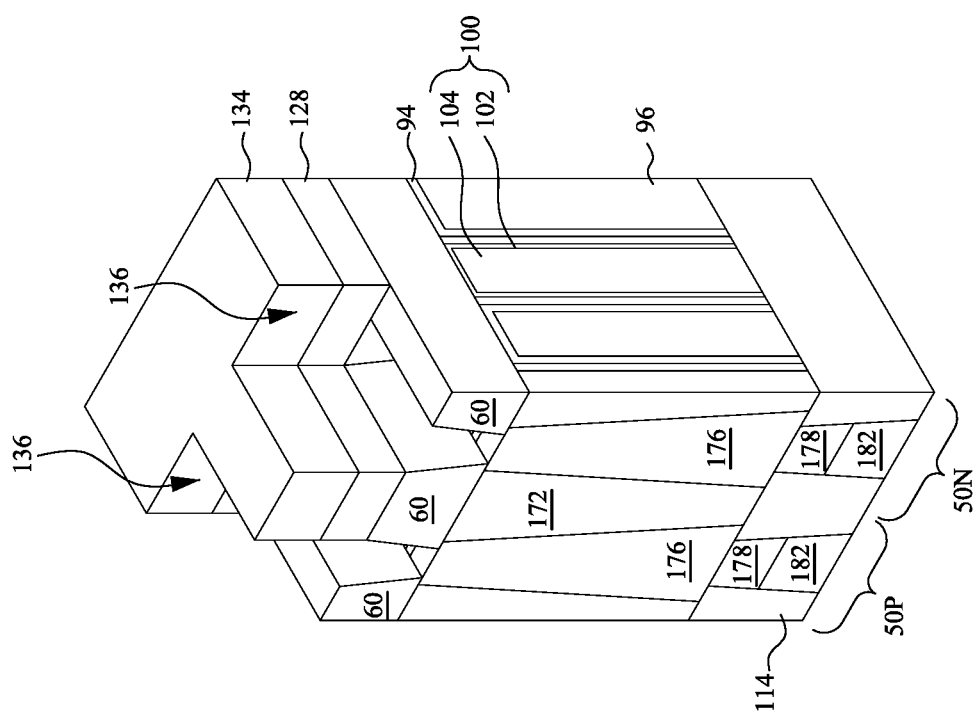
Figure 38B:
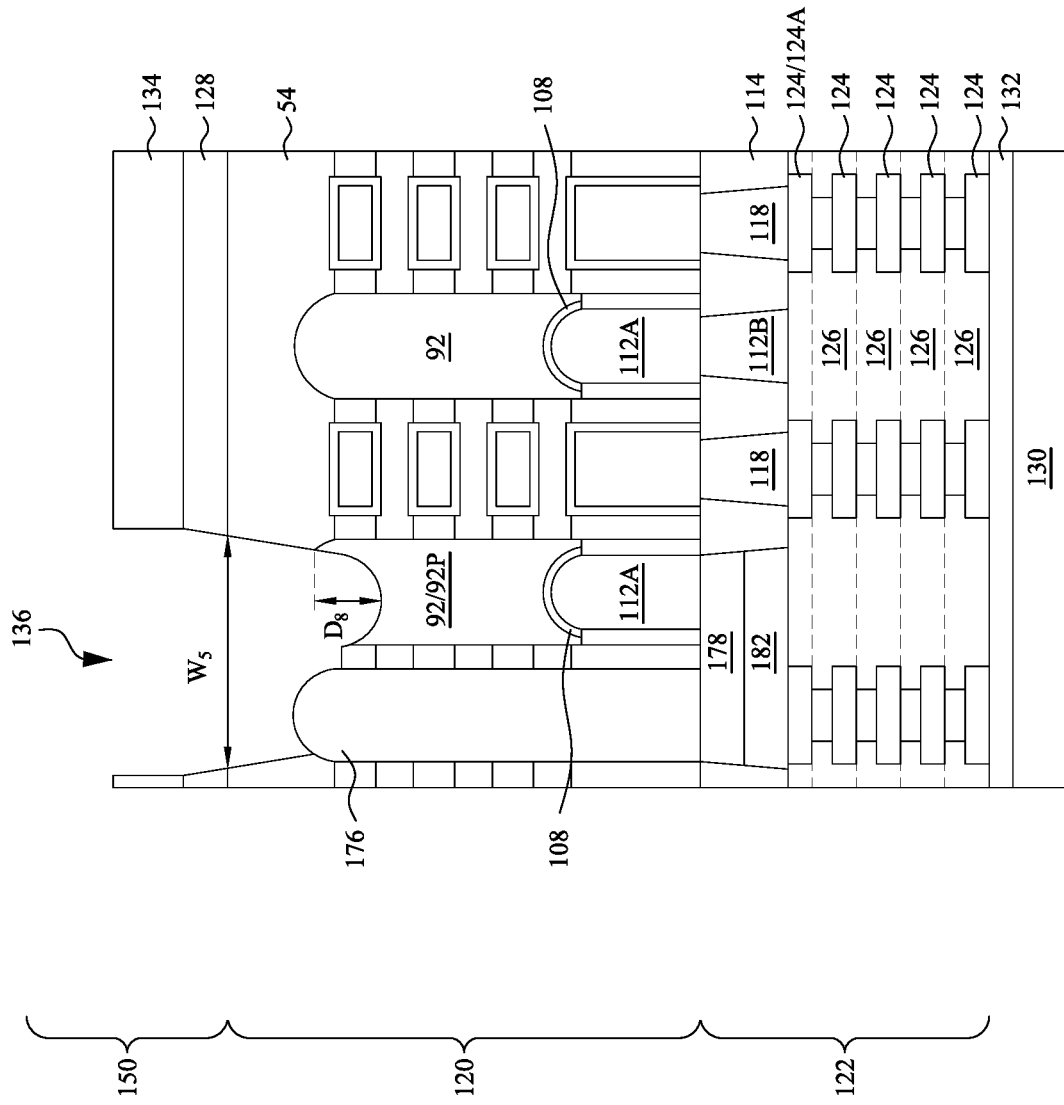

In FIGS. 38A and 38B, the intermediate structure may be processed in a similar manner as that described with respect to FIGS. 15 through 17. For example, an interconnect structure 122 can be formed, the structure can be flipped, and the substrate 50 can be replaced with a dielectric layer 128. Source/drain contact openings 136 are then formed through the dielectric layer 128 and the fins 54. The source/drain contact openings 136 can also extend into the lower portions of the epitaxial source/drain regions 92P. The source/drain contact openings 136 can be formed in a similar manner as that described with respect to FIGS. 18A and 18B, e.g., by using a mask 134 as an etching mask. In this embodiment, the source/drain contact openings 136 are not formed through the epitaxial source/drain regions 92P, but only extend partially into the lower portions of the epitaxial source/drain regions 92P. Timed etch processes may be used to stop the etching of the source/drain contact openings 136 after the source/drain contact openings 136 extend into the lower portions of the epitaxial source/drain regions 92P by the desired distance $D_8$. For example, when the etchants described with respect to FIGS. 18A and 18B are used to etch the source/drain contact openings 136, the etching may be performed for a duration in the range of about 90 seconds to about 240 seconds, which can cause the source/drain contact openings 136 to extend into the lower portions of the epitaxial source/drain regions 92P by a distance $D_8$ in the range of about 2 nm to about 10 nm. The source/drain contact openings 136 can be formed to a width $W_5$, which can be in the range of about 10 nm to about 50 nm.

Figure 39A:
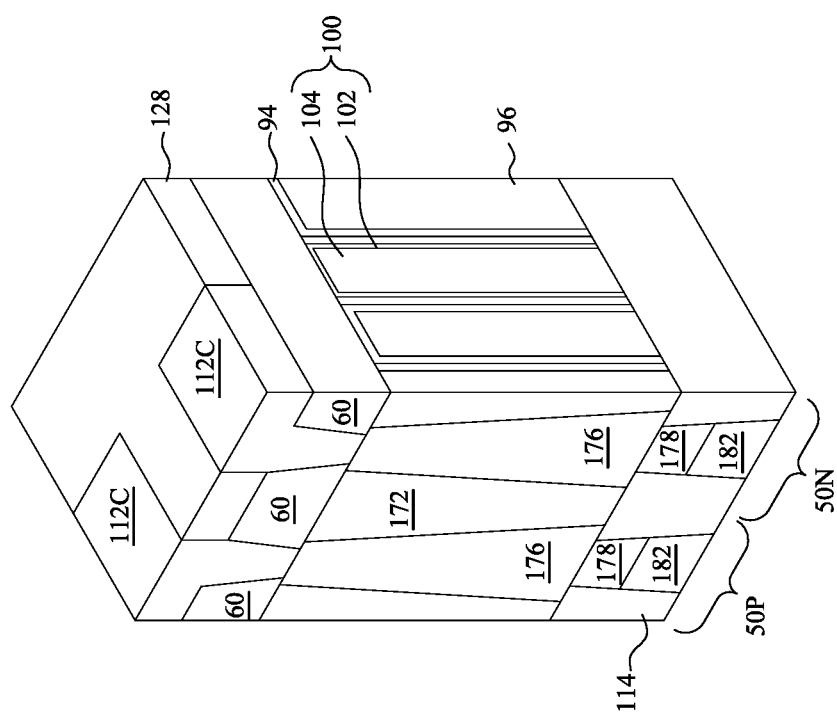
Figure 39B:
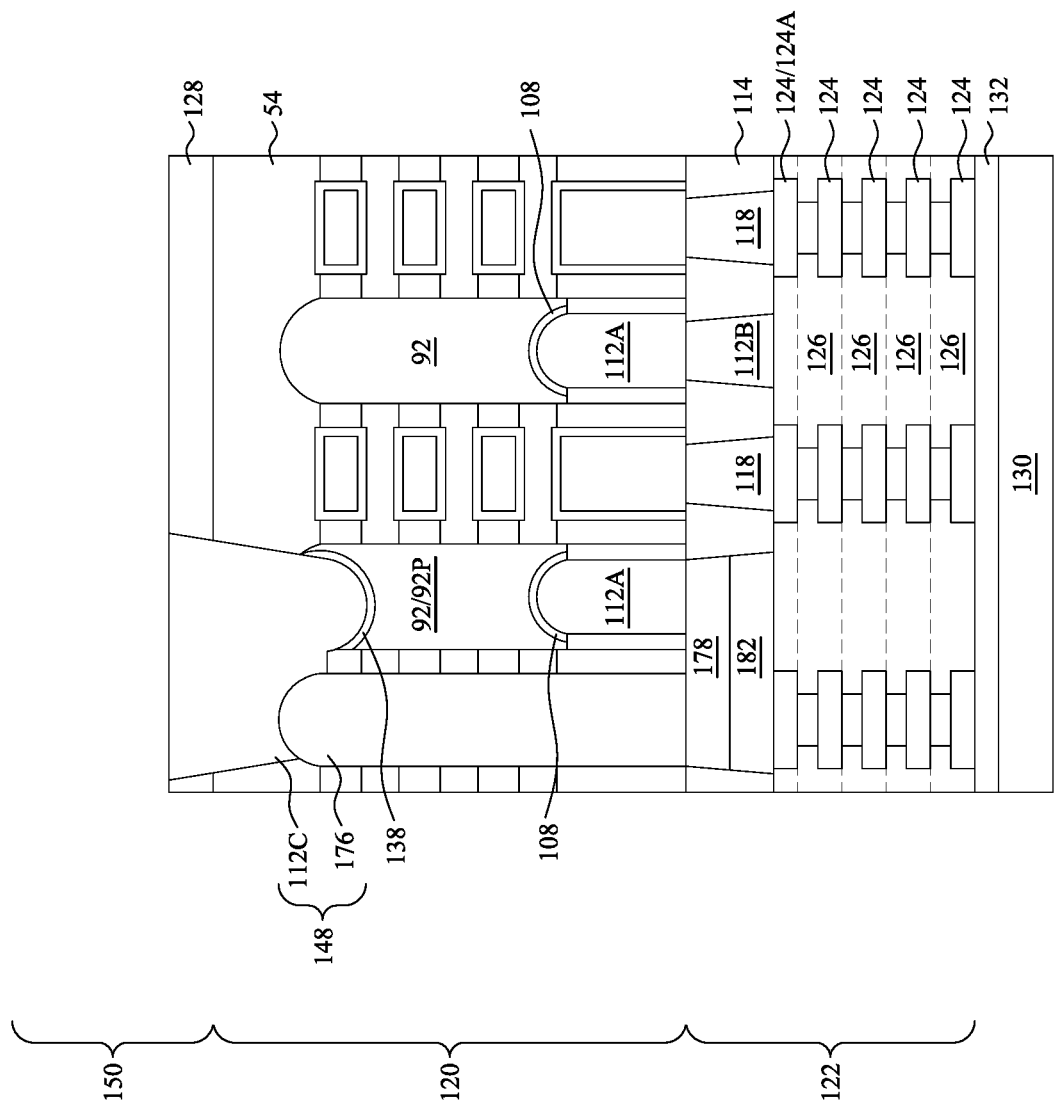

In FIGS. 39A and 39B, metal-semiconductor alloy regions 138 are formed in the source/drain contact openings 136, such as on portions of the epitaxial source/drain regions 92P exposed by the source/drain contact openings 136. The metal-semiconductor alloy regions 138 can be formed in a similar manner as that described with respect to FIGS. 19A and 19B. In some embodiment, the metal-semiconductor alloy regions 138 are curved layers. Although the metal-semiconductor alloy regions 108, 138 are shown as separate regions, it should be appreciated that in some embodiments, the metal-semiconductor alloy regions 108, 138 may merge during formation so that no distinguishable interface exists between them.

Third source/drain contacts 112C are then formed in the source/drain contact openings 136. The third source/drain contacts 112C can be formed in a similar manner as that described with respect to FIGS. 19A and 19B. In this embodiment, the third source/drain contacts 112C have portions on the power rail contacts 176, and portions that extend into the lower portions of the epitaxial source/drain regions 92P. The third source/drain contacts 112C thus extend along and contact the bottom surfaces of the epitaxial source/drain regions 92P. After formation, the third source/drain contacts 112C have similar dimensions as the source/drain contact openings 136. The first source/drain contacts 112A and the power rail contacts 176 form conductive vias 148, which may be referred to as power rail vias.

Figure 40:
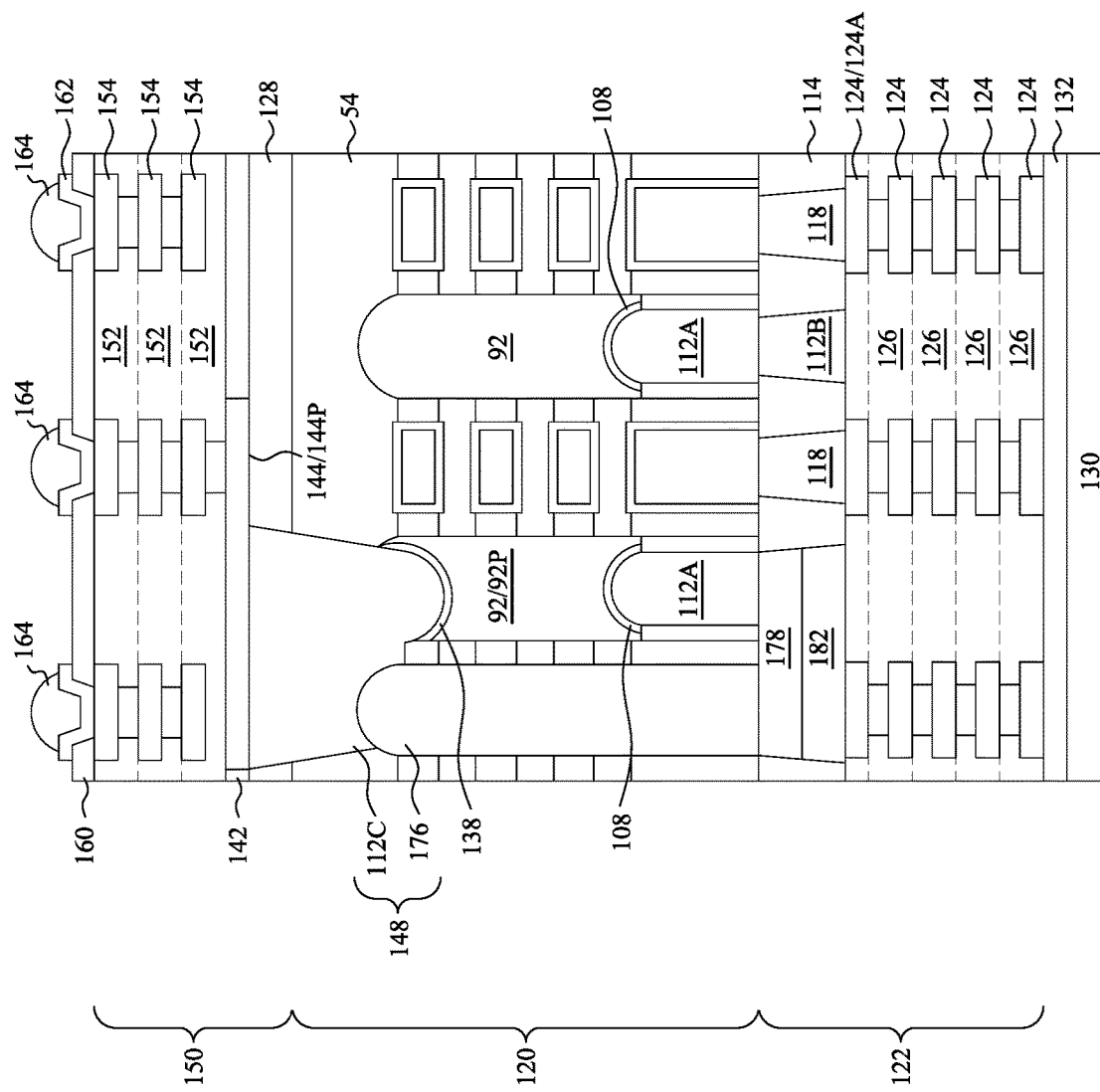

In FIG. 40, remaining portions of an interconnect structure 150 are formed at the back-side of the device layer 120. The remaining portions of the interconnect structure 150 may be formed in a similar manner as that described with respect to FIGS. 20 and 21. The interconnect structure 150 includes power rails 144P, which are connected to the conductive vias 148.

A passivation layer 160, UBMs 162, and external connectors 164 are then formed over the interconnect structure 150. The passivation layer 160, the UBMs 162, and the external connectors 164 can be formed in a similar manner as that described with respect to FIG. 22.

Embodiments may achieve advantages. Placing the power rails 144P at a back-side of the device layer 120 rather than at a front-side of the device layer 120 may allow for an increase in the gate density and/or interconnect density of the resulting semiconductor devices. Further, the back-side of the device layer 120 may accommodate wider power rails, reducing resistance and increasing efficiency of power delivery for the semiconductor devices. Connecting the power rails 144P to the interconnect structure 122 by conductive features (e.g., the conductive vias 148) rather than by semiconductive features (e.g., the epitaxial source/drain regions 92P) may also achieve advantages. Specifically, the performance of local interconnection between the interconnect structures 122, 150 may be improved. Finally, the same conductive features (e.g., the conductive vias 148) may be used to both connect the epitaxial source/drain regions 92P to the power rails 144P, and to provide local interconnection between the interconnect structures 122, 150, thus reducing the quantity of conductive features in the interconnect structure 150.

In an embodiment, a device includes: a nanostructure; a gate structure surrounding the nanostructure; an epitaxial source/drain region adjacent the gate structure; a first dielectric layer over an upper portion of the epitaxial source/drain region; a second dielectric layer under a lower portion of the epitaxial source/drain region; and a power rail via extending through the first dielectric layer and the second dielectric layer, the power rail via physically and electrically coupled to the upper portion and the lower portion of the epitaxial source/drain region.

In some embodiments of the device, the power rail via extends through the epitaxial source/drain region. In some embodiments of the device, the power rail via includes: a first source/drain contact extending through the first dielectric layer and into an upper portion of the epitaxial source/drain region; and a second source/drain contact extending through the second dielectric layer and into a lower portion of the epitaxial source/drain region, the second source/drain contact physically and electrically coupled to the first source/drain contact. In some embodiments, the device further includes: a metal-semiconductor alloy region surrounding portions of the power rail via extending through the epitaxial source/drain region. In some embodiments of the device, the power rail via extends along a sidewall of the epitaxial source/drain region. In some embodiments of the device, the power rail via includes: a first source/drain contact extending through the first dielectric layer, the first source/drain contact extending along the sidewall and a top surface of the epitaxial source/drain region; and a second source/drain contact extending through the second dielectric layer, the second source/drain contact extending along a bottom surface of the epitaxial source/drain region. In some embodiments, the device further includes: a metal-semiconductor alloy region disposed between the power rail via and each of the top surface, the sidewall, and the bottom surface of the epitaxial source/drain region.

In an embodiment, a device includes: a first interconnect structure including metallization patterns; a second interconnect structure including a power rail; a device layer between the first interconnect structure and the second interconnect structure, the device layer including a first transistor, the first transistor including an epitaxial source/drain region; and a conductive via extending through the device layer, the conductive via connecting the power rail to the metallization patterns, the conductive via contacting the epitaxial source/drain region.

In some embodiments of the device, the conductive via extends through the epitaxial source/drain region. In some embodiments of the device, the conductive via extends along and contacts a sidewall, a top surface, and a bottom surface of the epitaxial source/drain region. In some embodiments of the device, the conductive via extends along and contacts a bottom surface of the epitaxial source/drain region, and extends along and is physically separated from a sidewall of the epitaxial source/drain region.

In an embodiment, a method includes: forming a nanostructure over a fin; forming a gate structure around the nanostructure; growing an epitaxial source/drain region adjacent to the gate structure; depositing a first dielectric layer on the epitaxial source/drain region; forming a first contact through the first dielectric layer to contact the epitaxial source/drain region; and forming a second contact through the fin to contact the epitaxial source/drain region and the first contact.

In some embodiments of the method, forming the first contact includes: forming a first opening extending through the first dielectric layer and into an upper portion of the epitaxial source/drain region; and forming the first contact in the first opening. In some embodiments of the method, forming the second contact includes: forming a second opening extending through the fin and into a lower portion of the epitaxial source/drain region, the second opening exposing the first contact; and forming the second contact in the second opening. In some embodiments of the method, forming the first opening includes: etching the first dielectric layer with a dry etch using ammonia and hydrogen fluoride gas; and etching the epitaxial source/drain region with a dry etch using chlorine gas, hydrogen bromide gas, and oxygen gas. In some embodiments of the method, the first opening extends a first distance into the upper portion of the epitaxial source/drain region, and the second opening extends a second distance into the lower portion of the epitaxial source/drain region, the first distance and the second distance each being in a range of 15 nm to 60 nm. In some embodiments, the method further includes: replacing the gate structure with a second dielectric layer; forming a first opening extending through the first dielectric layer and the second dielectric layer, the first opening exposing a sidewall of the epitaxial source/drain region; and forming the first contact in the first opening. In some embodiments of the method, forming the second contact includes: forming a second opening extending through the fin, the second opening exposing the first contact and the epitaxial source/drain region; and forming the second contact in the second opening. In some embodiments of the method, forming the first opening includes: etching the first dielectric layer with a dry etch using ammonia and hydrogen fluoride gas; and etching the second dielectric layer with a dry etch using a fluorine-based gas and hydrogen or oxygen gas. In some embodiments of the method, a depth of the first opening is in a range of 40 nm to 120 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a nanostructure;
a gate structure surrounding the nanostructure;
an epitaxial source/drain region adjacent the gate structure;
a dielectric feature adjacent the epitaxial source/drain region, a top surface of the dielectric feature being coplanar with a top surface of the gate structure;
a dielectric layer under the dielectric feature, the epitaxial source/drain region, and the gate structure; and a power rail via extending through the dielectric layer and the dielectric feature, the power rail via physically and electrically coupled to a lower portion of the epitaxial source/drain region.

2. The device of claim 1, wherein the power rail via comprises:
a first contact extending through the dielectric feature, the first contact physically separated from a sidewall of the epitaxial source/drain region; and
a second contact extending through the dielectric layer, the second contact physically and electrically coupled to the lower portion of the epitaxial source/drain region.

3. The device of claim 1 further comprising:
a conductive line on the dielectric layer and the power rail via.

4. The device of claim 1, wherein the power rail via extends into the lower portion of the epitaxial source/drain region.

5. The device of claim 1 further comprising:
a spacer between the epitaxial source/drain region and the power rail via.

6. The device of claim 1 further comprising:
a first interlayer dielectric on the epitaxial source/drain region;
a source/drain contact extending through the first interlayer dielectric, the source/drain contact physically and electrically coupled to an upper portion of the epitaxial source/drain region;
a second interlayer dielectric on the source/drain contact and the first interlayer dielectric; and
a shared contact in the second interlayer dielectric, the shared contact physically and electrically coupled to the source/drain contact and the power rail via.

7. The device of claim 6 further comprising:
a dielectric plug in the second interlayer dielectric, the dielectric plug covering the shared contact.

8. A device comprising:
a first interconnect structure comprising a first conductive line;
a second interconnect structure comprising a second conductive line;
a device layer between the first interconnect structure and the second interconnect structure, the device layer comprising a spacer and a first transistor, the first transistor comprising an epitaxial source/drain region; and
a conductive via extending through the device layer, the conductive via connecting the first conductive line to the second conductive line, the conductive via contacting a bottom surface of the epitaxial source/drain region, the spacer separating the conductive via from a sidewall of the epitaxial source/drain region.

9. The device of claim 8, wherein a width of the second conductive line is greater than a width of the first conductive line.

10. The device of claim 8, wherein the first conductive line is an interconnect and the second conductive line is a power rail.

11. The device of claim 8, wherein the device layer further comprises:
a first dielectric layer above the epitaxial source/drain region; and
a second dielectric layer under the epitaxial source/drain region, the conductive via extending through the first dielectric layer and the second dielectric layer.

12. The device of claim 11, wherein the conductive via comprises:
a first contact extending through the first dielectric layer; and
a second contact extending through the second dielectric layer.

13. A method comprising:
forming a nanostructure above a fin;
forming a first gate structure around the nanostructure;
growing an epitaxial source/drain region adjacent to the first gate structure;
depositing a first dielectric layer on the epitaxial source/drain region;
replacing the first gate structure with dielectric feature;
forming a first contact and a second contact, the first contact extending through the first dielectric layer to contact the epitaxial source/drain region, the second contact extending through the dielectric feature, the second contact physically separated from a sidewall of the epitaxial source/drain region; and
forming a third contact through the fin to contact the epitaxial source/drain region and the second contact.

14. The method of claim 13 further comprising:
forming a second gate structure around the nanostructure, the epitaxial source/drain region disposed between the dielectric feature and the second gate structure.

15. The method of claim 13 further comprising:
forming a spacer separating the epitaxial source/drain region from the second contact.

16. The method of claim 13 further comprising:
forming a power rail contacting the third contact.

17. The method of claim 13 further comprising:
depositing a second dielectric layer on the first dielectric layer; and
forming a shared contact in the second dielectric layer, the shared contact contacting the first contact and the second contact.

18. The method of claim 17 further comprising:
forming a dielectric plug in the second dielectric layer, the dielectric plug disposed on the shared contact.

19. The method of claim 18 further comprising:
forming an interconnect structure on the second dielectric layer and the dielectric plug.

20. The method of claim 13, wherein forming the second contact comprises:
etching an opening through the dielectric feature by etching the dielectric feature with a dry etch using a fluorine-based gas; and
forming a conductive material in the opening.

* * * * *